(12) United States Patent
Hashimoto

(10) Patent No.: US 9,785,494 B2
(45) Date of Patent: Oct. 10, 2017

(54) INFORMATION PROCESSING DEVICE, EXTERNAL STORAGE DEVICE, HOST DEVICE, RELAY DEVICE, CONTROL PROGRAM, AND CONTROL METHOD OF INFORMATION PROCESSING DEVICE

(71) Applicant: Toshiba Memory Corporation, Minato-ku (JP)

(72) Inventor: Daisuke Hashimoto, Kanagawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/920,660

(22) Filed: Oct. 22, 2015

(65) Prior Publication Data
US 2016/0041858 A1   Feb. 11, 2016

Related U.S. Application Data

(63) Continuation of application No. 14/251,285, filed on Apr. 11, 2014, now Pat. No. 9,201,602, which is a (Continued)

(30) Foreign Application Priority Data

Mar. 10, 2011   (JP) ................................ 2011-053228
Jul. 25, 2011   (JP) ................................ 2011-162330

(51) Int. Cl.
*G06F 3/06*    (2006.01)
*G06F 11/07*   (2006.01)
(Continued)

(52) U.S. Cl.
CPC .......... *G06F 11/076* (2013.01); *G06F 3/0605* (2013.01); *G06F 3/0611* (2013.01);
(Continued)

(58) Field of Classification Search
CPC .... G06F 3/0611; G06F 3/0605; G06F 11/076; G06F 3/0616; G06F 3/0619;
(Continued)

(56) References Cited

U.S. PATENT DOCUMENTS 6,529,992 B1   3/2003   Thomas et al.
7,840,836 B2   11/2010  Chang
(Continued)

FOREIGN PATENT DOCUMENTS

CN   101202081 A   6/2008
JP   7-78102       3/1995
(Continued)

OTHER PUBLICATIONS

Self-Monitoring, Analysis and Reporting Technology :: Attributes, http://smarlinux.sourceforge.net/smart/attributes.php, 2 pages.
(Continued)

*Primary Examiner* — Jasmine Song
(74) *Attorney, Agent, or Firm* — Oblon, McClelland, Maier & Neustadt, L.L.P.

(57) ABSTRACT

According to the embodiments, an external storage device switches to an interface controller for supporting only a read operation of nonvolatile memory when a shift condition for shifting to a read only mode is met. A host device switches to an interface driver for supporting only the read operation of the nonvolatile memory when determining to recognize as read only memory based on information acquired from the external storage device.

20 Claims, 27 Drawing Sheets

Related U.S. Application Data continuation of application No. 13/848,550, filed on Mar. 21, 2013, now Pat. No. 8,756,367, which is a continuation of application No. 13/551,060, filed on Jul. 17, 2012, now Pat. No. 8,631,191, which is a continuation of application No. PCT/JP2011/072693, filed on Sep. 26, 2011.

(51) Int. Cl.
*G06F 12/02* (2006.01)
*G06F 12/0804* (2016.01)
*G06F 11/14* (2006.01)
*G06F 12/0868* (2016.01)
*G11C 11/56* (2006.01)
*G11C 16/04* (2006.01)

(52) U.S. Cl.
CPC .......... *G06F 3/0616* (2013.01); *G06F 3/0619* (2013.01); *G06F 3/0632* (2013.01); *G06F 3/0634* (2013.01); *G06F 3/0653* (2013.01); *G06F 3/0679* (2013.01); *G06F 11/073* (2013.01); *G06F 11/1458* (2013.01); *G06F 12/0246* (2013.01); *G06F 12/0804* (2013.01); *G06F 12/0868* (2013.01); *G06F 2201/805* (2013.01); *G06F 2212/214* (2013.01); *G06F 2212/7204* (2013.01); *G11C 11/5621* (2013.01); *G11C 16/0483* (2013.01)

(58) Field of Classification Search
CPC .... G06F 3/0632; G06F 3/0634; G06F 3/0653; G06F 3/0679; G06F 11/073; G06F 11/1458; G06F 12/0246; G06F 12/0804
USPC .......................................... 711/103
See application file for complete search history.

(56) References Cited

U.S. PATENT DOCUMENTS

| | | | |
|---|---|---|---|
| 7,861,122 B2 | 12/2010 | Cornwell et al. | |
| 7,894,366 B2 * | 2/2011 | Mangetsu | H04L 12/2697 370/252 |
| 8,041,991 B2 | 10/2011 | McKean | |
| 8,230,255 B2 | 7/2012 | Dickens et al. | |
| 8,495,348 B2 | 7/2013 | Zwister et al. | |
| 8,495,432 B2 | 7/2013 | Dickens et al. | |
| 2004/0083473 A1 | 4/2004 | Thomas et al. | |
| 2008/0082865 A1 | 4/2008 | Matsuoka | |
| 2008/0154839 A1 | 6/2008 | Araki et al. | |
| 2009/0222617 A1 | 9/2009 | Yano et al. | |
| 2009/0313444 A1 | 12/2009 | Nakamura | |
| 2010/0172189 A1 | 7/2010 | Itagaki et al. | |
| 2010/0254191 A1 | 10/2010 | Son et al. | |

FOREIGN PATENT DOCUMENTS

| | | |
|---|---|---|
| JP | 8-202502 | 8/1996 |
| JP | 2000-99338 | 4/2000 |
| JP | 2001-75813 | 3/2001 |
| JP | 2002-351621 | 12/2002 |
| JP | 2005-190075 | 7/2005 |
| JP | 3766429 | 2/2006 |
| JP | 3767818 | 2/2006 |
| JP | 2008-90539 | 4/2008 |
| JP | 2008-305061 | 12/2008 |
| JP | 2009-217603 | 9/2009 |
| JP | 2009-282993 | 12/2009 |
| JP | 2010-521014 | 6/2010 |
| JP | 2010-161199 | 7/2010 |
| JP | 2011-29586 | 2/2011 |
| TW | 200819980 A | 5/2008 |
| TW | 200941216 A | 10/2009 |
| TW | 201019333 A | 5/2010 |
| WO | WO 2008/063647 A3 | 5/2008 |
| WO | WO 2009/107286 A1 | 9/2009 |

OTHER PUBLICATIONS

SNIA, Solid State Storage Performance Test Specification Version 0.9, http//www.snia.org/, 4 pages.
Get Configuration Command, INCITS T10, Information Technology, Multi-Media Commands—6 (MMC-6), Oct. 24, 2007, http://www.t10.org/drafts.htm#MMC_Family, 6 pages.
Get Configuration Command Revision 0.01, htt://www.t10.org/ftp/t10/document.97/97-263r0.pdf, 21 pages.
Device Signatures, INCITS T13, Information Technology, Working Draft ATA/ATAPI Command Set—2 (ACS-2), Feb. 8, 2011, http://www.t13.org/, p. 374, Table 220-Device Signature for Normal Output: p. 19, "4.3.3 Signature for ATPI devices", p. 7, "3.1 82 signature", 3 pages.
Self-Monitoring, Analysis, and Reporting Technology (SMART), INCITS T-13, Information Technology, Working Draft ATA/ATAPI Command Set—2 (ACS-2), Feb. 8, 2011, http://www.t13.org/, p. 73-74, "Self-Monitoring, Analysis, and Reporting Technology (SMART) feature set", p. 290-306, "7.54 SMART", 19 pages.
External Hard Disk Case: ZM-VE 200_eng, http://www.zalman.com/ENG/product/Product_Read.asp?idx=431, Replaces existing CD/DVD into ISO files and then load on a virtual drive of HDD, 9 pages.
Serial ATA International Organization : Serial ATA Revision 3.1RC Clean Draft, Sep. 29, 2010, pp. 554-558.
Buffalo HD-PHB40U2/UC, Nov. 24, 2004, http://buffalo.jp/products/catalog/item/h/hd-phbu2_uc/indx.html. http://manual.buffalo.jp/buf-doc/d3018a1.pdf, 22 pages.
Combined Office Action and Search Report issued Jan. 26, 2015 in Taiwanese Patent Application No. 101105690 (with English language translation and English Translation of Category of Cited Documents).
Decision of Refusal of First Examination issued Sep. 23, 2015 in Taiwanese Patent Application No. 101105690, with English-language Translation.
Office Action issued May 26, 2015 in Chinese Patent Application No. 201180068496.0 (with English translation).
Combined Taiwanese Office Action and Search Report issued Mar. 25, 2014 in Patent Application No. 101105690 (with English translation of the Office Action and English translation of categories of cited documents).
Oracle VirtualBox, User Manual (Version 4.3.6), 2004-2013, Dec. 18, 2013, http://download.virtualbox.org/virtualbox/UserManual.pdf, pp. 2-4, 80-86.
Oracle Virtualbox, Changelog for Virtualbox 4.0, (Virtualbox 4.0.4), Feb. 17, 2011, https://www.virtualbox.org/wiki/Changelog-4.0, pp. 1-14.
Extended European Search Report issued Jul. 16, 2014 in Patent Application No. 11860316.6.

* cited by examiner

FIG.13

MANAGEMENT INFORMATION

FREE BLOCK TABLE (FB TABLE): 21

| PHYSICAL BLOCK ID | NUMBER OF ERASURES |
|---|---|
| ... | |
| ... | |
| ... | |
| ... | |

BAD BLOCK TABLE (BB TABLE): 22

| PHYSICAL BLOCK ID |
|---|
| ... |
| ... |
| ... |
| ... |

ACTIVE BLOCK TABLE (AB TABLE): 23

| LBA | PHYSICAL BLOCK ID | NUMBER OF ERASURES |
|---|---|---|
| ... | ... | |
| ... | ... | |
| ... | ... | |
| ... | ... | |

ACTIVE PAGE TABLE (AP TABLE): 24

| LBA | PHYSICAL BLOCK ID | PHYSICAL PAGE ID |
|---|---|---|
| ... | ... | ... |
| ... | ... | ... |
| ... | ... | ... |
| ... | ... | ... |

RO MODE FLAG: 25

| 0 OR 1 |
|---|

26

| STATISTICAL INFORMATION |
|---|

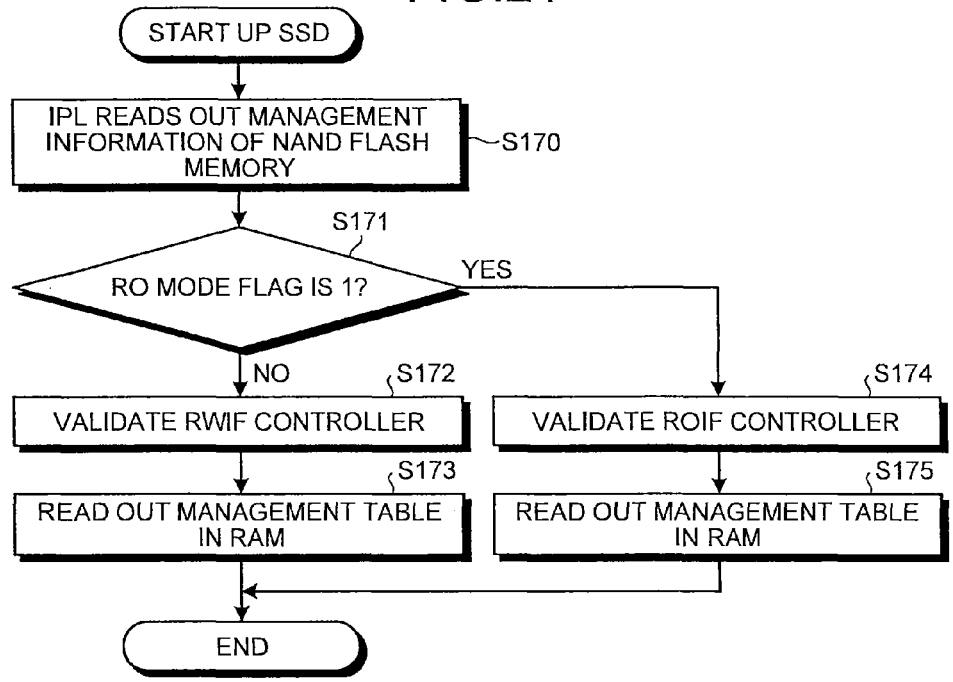
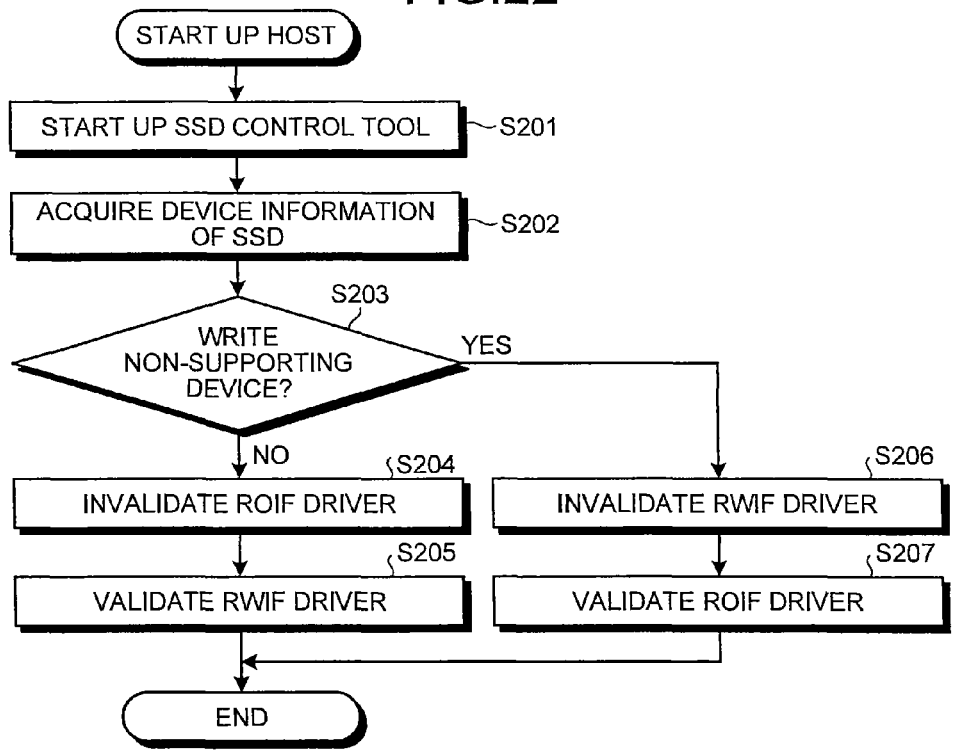

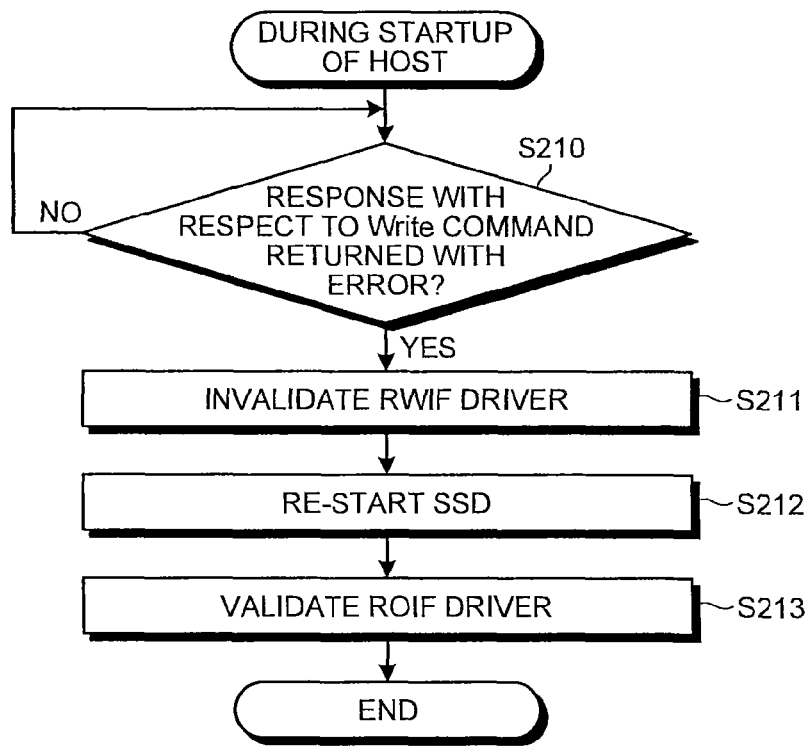

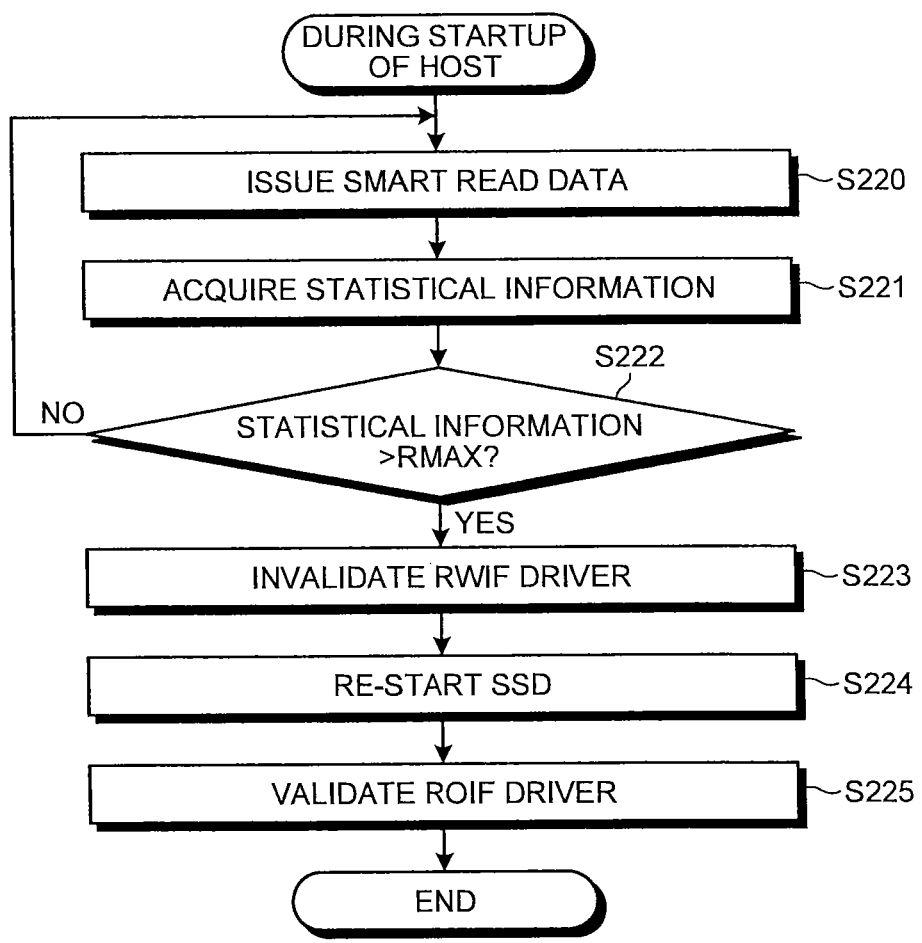

FIG.26

| attribute ID | attribute NAME | Value | Threshold | Worst | Raw Data |
|---|---|---|---|---|---|
| ... | TOTAL NUMBER OF BAD BLOCKS (STATISTICAL INFORMATION X01) | ... | ... | ... | ... |
| ... | TOTAL NUMBER OF TIMES OF ERASING (STATISTICAL INFORMATION X02) | ... | ... | ... | ... |
| ... | AVERAGE VALUE OF NUMBER OF TIMES OF ERASING (STATISTICAL INFORMATION X03) | ... | ... | ... | ... |
| ... | CUMULATIVE VALUE OF NUMBER OF TIMES OF WRITE ERROR OCCURRENCES OF THE NAND MEMORY (STATISTICAL INFORMATION X04) | ... | ... | ... | ... |
| ... | CUMULATIVE VALUE OF NUMBER OF TIMES OF ERASE ERROR OCCURRENCES OF THE NAND MEMORY (STATISTICAL INFORMATION X05) | ... | ... | ... | ... |
| ... | TOTAL NUMBER OF READOUT LOGICAL SECTORS (STATISTICAL INFORMATION X06) | ... | ... | ... | ... |
| ... | TOTAL NUMBER OF WRITE LOGICAL SECTORS (STATISTICAL INFORMATION X07) | ... | ... | ... | ... |
| ... | TOTAL NUMBER OF INCORRECTABLE ECC ERROR COUNT (STATISTICAL INFORMATION X08) | ... | ... | ... | ... |
| ... | TOTAL NUMBER OF n BITS TO m BITS ECC CORRECTION UNITS (STATISTICAL INFORMATION X09) | ... | ... | ... | ... |
| ... | NUMBER OF TIMES OF R ERROR OCCURRENCES OF SATA COMMUNICATION (STATISTICAL INFORMATION X10) | ... | ... | ... | ... |
| ... | NUMBER OF TIMES OF ERROR OCCURRENCES OF SATA COMMUNICATION (STATISTICAL INFORMATION X11) | ... | ... | ... | ... |
| ... | NUMBER OF TIMES OF ERROR OCCURRENCES OF RAM (STATISTICAL INFORMATION X12) | ... | ... | ... | ... |
| ... | TOTAL NUMBER OF USED TIME OF SSD (STATISTICAL INFORMATION X13) | ... | ... | ... | ... |
| ... | TIME TOTAL IN WHICH TEMPERATURE IS HIGHER THAN HIGHEST VALUE OF RECOMMENDED OPERATION TEMPERATURE (STATISTICAL INFORMATION X14) | ... | ... | ... | ... |
| ... | TIME TOTAL IN WHICH TEMPERATURE IS LOWER THAN LOWEST VALUE OF RECOMMENDED OPERATION TEMPERATURE (STATISTICAL INFORMATION X15) | ... | ... | ... | ... |
| ... | MAXIMUM VALUE OF RESPONSE TIME OF COMMAND (STATISTICAL INFORMATION X16) | ... | ... | ... | ... |
| ... | AVERAGE VALUE OF RESPONSE TIME OF COMMAND (STATISTICAL INFORMATION X17) | ... | ... | ... | ... |
| ... | MAXIMUM VALUE OF RESPONSE TIME OF NAND MEMORY (STATISTICAL INFORMATION X18) | ... | ... | ... | ... |
| ... | AVERAGE VALUE OF RESPONSE TIME OF NAND MEMORY (STATISTICAL INFORMATION X19) | ... | ... | ... | ... |
| ... | INCREASE RATE OF STATISTICAL INFORMATION (STATISTICAL INFORMATION X23) | ... | ... | ... | ... |
| ... | NAND GC FAILURE FLAG (STATISTICAL INFORMATION X24) | ... | ... | ... | ... |

US 9,785,494 B2

INFORMATION PROCESSING DEVICE, EXTERNAL STORAGE DEVICE, HOST DEVICE, RELAY DEVICE, CONTROL PROGRAM, AND CONTROL METHOD OF INFORMATION PROCESSING DEVICE

CROSS-REFERENCE TO RELATED APPLICATIONS

This application is a continuation of U.S. application Ser. No. 14/251,285 filed Apr. 11, 2014, which is a continuation of U.S. application Ser. No. 13/848,550 filed on Mar. 21, 2013, which is a continuation of U.S. application Ser. No. 13/551,060, filed on Jul. 17, 2012, which is a continuation of PCT international application Ser. No. PCT/JP2011/072693 filed on Sep. 26, 2011 which designates the United States and claims the benefit of priority from Japanese Patent Application No. 2011-053228 filed on Mar. 10, 2011 and Japanese Patent Application No. 2011-162330 filed on Jul. 25, 2011; the entire contents of which are incorporated herein by reference.

FIELD

Embodiments described herein relate generally to an information processing device, an external storage device, a host device, a relay device, a control program, and a control method of information processing device.

BACKGROUND

As an external storage device used in a computer system, an SSD (Solid State Drive) mounted with a nonvolatile semiconductor memory such as a NAND-type flash memory attracts attention. The flash memory has advantages such as high speed and light weight compared with a magnetic disk device. The SSD includes a plurality of flash memory chips, a controller that performs read/write control for the respective flash memory chips in response to a request from a host apparatus, a buffer memory for performing data transfer between the respective flash memory chips and the host apparatus, a power supply circuit, and a connection interface to the host apparatus.

BRIEF DESCRIPTION OF THE DRAWINGS

FIG. 13 is a view illustrating management information of the SSD.

FIG. 21 is a flowchart illustrating the operation example at the time of startup of the SSD.

FIG. 22 is a flowchart illustrating an operation example at the time of startup of the host.

FIG. 23 is a flowchart illustrating an operation example during the operation of the host.

FIGS. 24A and 24B are views illustrating a drive display screen example in the host.

FIG. 25 is a flowchart illustrating another operation example at the time of startup of the host.

FIG. 26 is a view illustrating one example of a management table of the statistical information X01 to X19, X23, X24.

DETAILED DESCRIPTION

Figure 1:
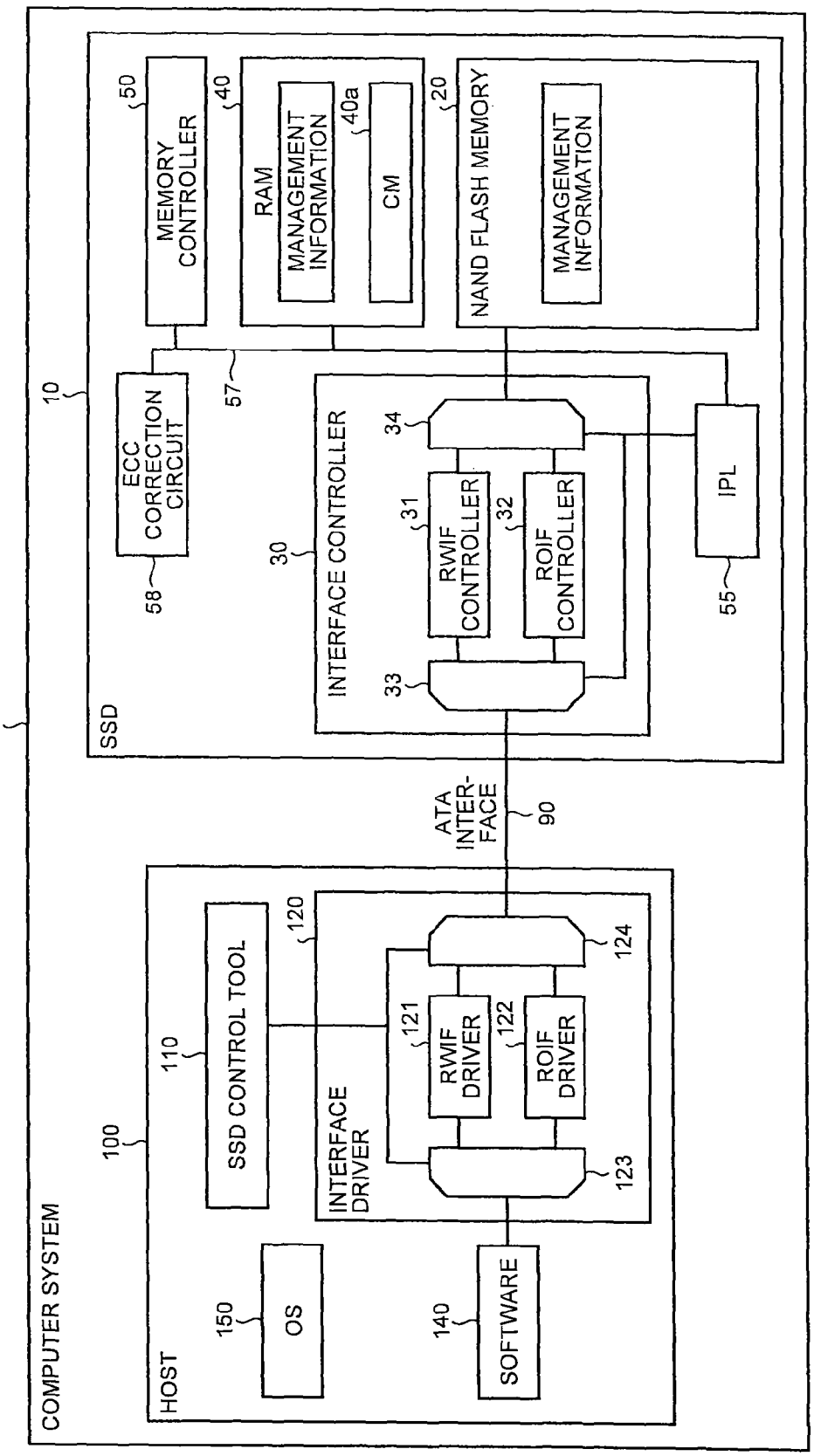
FIG. 1 is a block diagram illustrating a function configuration example of a computer system of a first embodiment.

In general, according to one embodiment, an information processing device includes a host device and an external storage device. The external storage device includes nonvolatile memory that enables read and write, an interface controller to be connected to the host device, and a first control unit. The interface controller determines whether or not a shift condition for shifting to the read only mode for causing the nonvolatile memory to perform only the read operation is met, and when the shift condition is met, the first control unit switches the interface controller from a first interface controller to a second interface controller. The host device includes an interface driver for operating the external storage device, and a second control unit. The second control unit determines whether or not to recognize the nonvolatile memory as read only memory in which only the read operation can be carried out based on the information acquired from the external storage device, and switches the interface driver from a first interface driver to a second interface driver when determined to recognize as the read only memory. When the external storage device determined to be recognized as read only memory is connected to the host device, the host device selects the second interface driver; and the external storage device selects the second interface controller, whereby the host device recognizes the external storage device as a read only memory without issuing a write request to the external storage device.

When data is stored in a nonvolatile semiconductor storage element such as a NAND-type flash memory, writing is performed after once erasing data in units of block, reading/writing is performed in units of page, or a unit of erasing/reading/writing is fixed. On the other hand, a unit for a host apparatus such as a personal computer to write data in and read out the data from a secondary storage device such as a hard disk is called sector. The sector is set independently from a unit of erasing, writing, and readout of a semiconductor storage device. For instance, the unit of erase/write/read of the nonvolatile semiconductor memory may be greater than the unit of write/read of the host device.

When configuring the secondary storage device of the personal computer using the flash memory, a block (defective block, bad block) that cannot be used as a storage region due to reasons of many errors, and a region (defective region) that cannot be read may generate. If the number of defective blocks or the number of defective regions exceed the upper limit value, a new defective block or a defective region cannot be registered and both the data stored in the buffer memory (cache memory) and the data to which the write request is made cannot be guaranteed to be written to the flash memory. Thus, when the number of defective blocks or the number of defective regions exceed a predetermined value, the write of data may suddenly become disabled although there is free space in the flash memory.

As a solution thereto, there is a method of managing the number of bad clusters and the number of bad blocks generated in the NAND type flash memory, and switching the operation mode of when writing the data from the host device to the NAND type flash memory according to the number of bad clusters and the number of bad blocks. The cluster is a management unit serving as a logical address in the SSD. The cluster size is a natural number multiples of two or greater of the sector size, and the cluster address is configured by a bit sequence of high order from a predetermined bit of an LBA.

In this method, the operation mode of the SSD is divided into the following three modes.

WB mode (Write Back Mode): normal operation of once writing data to the cache memory, and removing the same to the NAND type flash memory based on a predetermined condition.

WT mode (Write Through Mode): operation mode of writing data written to the cache memory to the NAND type flash memory each time with one write request. The data written from the host is guaranteed as much as possible by writing to the NAND type flash memory each time. The SSD transitions to the WT mode when the number of remaining entries of the bad cluster table or the bad block table becomes smaller than or equal to a predetermined number.

RO mode (Read Only Mode): mode of prohibiting all processes involving write to the NAND type flash memory. The data already written from the host is guaranteed as much as possible when the SSD comes close to the end of its lifespan by returning an error respect to all the write requests from the host so as not to perform write. The SSD transitions to the RO mode when the number of remaining entries of the bad cluster table or the bad block table becomes smaller than or equal to a predetermined number or when the free block is insufficient.

In the WB mode and the WT mode, the SSD accepts both the read request and the write request from the host, and processes the same. In the RO mode, the SSD accepts the read request from the host and processes the same, but does not process the write request from the host and returns an error.

The host transmits the write request to the SSD when the SSD is connected to the host mounted with the operating system (OS) such as Windows (registered trademark), and the host recognizes the SSD as an available external storage device when the write request is normally processed.

If the host transmits the write request to the SSD when the SSD that transitioned to the RO mode is connected to the host mounted with the Windows (registered trademark), the SSD returns an error to the host and hence the host may not recognize the SSD as an available external storage device. Therefore, the data recorded in the past may not be read from the SSD even if the SSD in the RO mode in which read is enabled is connected to the host.

In the present embodiment, the SSD that shifted to the RO mode can be normally recognized by the host as a device in which only the read operation can be carried out.

Exemplary embodiments of an information processing device, an external storage device, a host device, a relay device, and a control method of the information processing device will be explained below in detail with reference to the accompanying drawings. The present invention is not limited to the following embodiments.

First Embodiment

FIG. 1 illustrates a configuration of a first embodiment of a computer system. The computer system 1 is configured by an SSD 10 serving as an external storage device, a host 100, and an ATA interface 90 serving as a memory interface connecting the SSD 10 and the host 100. The external storage device may be other readable and writable nonvolatile storage device other than the SSD 10 such as a hard disc drive, a hybrid hard disc drive, USB memory, or an SD card. The host 100 may be a personal computer, may be an imaging device such as a still camera or a video camera, or may be a tablet computer, a smart phone, a game machine, a car navigation system, or the like.

As illustrated in FIG. 1, the SSD 10 includes NAND type flash memory (hereinafter abbreviated as NAND memory) 20 serving as nonvolatile semiconductor memory, an interface controller 30 for transmitting and receiving signals with the host 100 through the ATA interface 90, RAM (Random Access Memory) 40 serving as volatile semiconductor memory including cache memory (CM) 40a functioning as an intermediate buffer of the interface controller 30 and the NAND memory 20, a memory controller 50 responsible for the management and control of the NAND memory 20 and the RAM 40, and the control of the interface controller 30, an IPL (Initial Program Loader) 55 serving as a boot loader for performing various types of startup process including initialization at the time of startup of the SSD 10, an ECC correction circuit 58 for executing an error correction process of the data read out from the NAND memory 20, and a bus 57 for connecting all the constituent elements. The IPL 55 may be arranged in the memory controller 50. In this embodiment, the ATA interface is configured as a Serial ATA (SATA) interface. Other interfaces such as the Parallel ATA (PATA) interface may be used in place of the SATA interface 90. Other interfaces such as the USB (Universal Serial Bus) interface, the PCI Express interface, the Thunderbolt (registered trademark) interface, or the Serial Attached SCSI (SAS) interface may be used in place of the ATA interface 90.

DRAM (Dynamic Random Access Memory), SRAM (Static Random Access Memory), FeRAM (Ferroelectric Random Access Memory), MRAM (Magnetoresistive Random Access Memory), PRAM (Phase Change Random Access Memory), or the like may be adopted for the RAM 40. The RAM 40 may be arranged in the memory controller 50.

The NAND memory 20 stores therein user data specified by the host 100, stores the management table in which the user data is managed, and stores the management information managed in the RAM 40 for backup. The NAND memory 20 includes a memory cell array in which a plurality of memory cells is arrayed in a matrix form, where each memory cell can store multiple values using an upper page and a lower page. The NAND memory 20 is configured by a plurality of memory chips, and each memory chip is configured by arraying a block or a unit of data erasing in plurals. In the NAND memory 20, writing and reading of data is performed in page units. The block consists of a plurality of pages.

Figure 2:
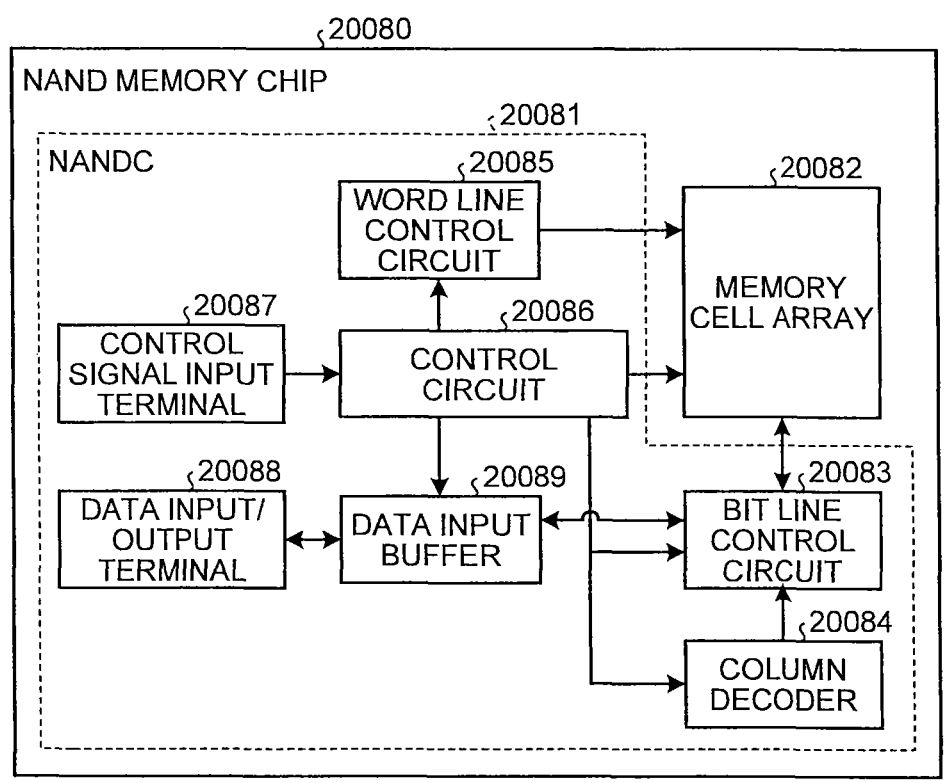
FIG. 2 is a block diagram illustrating an internal configuration example of a NAND memory chip.

FIG. 2 illustrates an internal configuration example of the NAND memory chip configuring the NAND memory 20. The NAND memory 20 includes one or more NAND memory chips 20080. The NAND memory chip 20080 includes a memory cell array in which a plurality of memory cells is arrayed in a matrix form. The memory cell transistor configuring the memory cell array is configured by a MOSFET (Metal Oxide Semiconductor Field Effect Transistor) having a stacked gate structure formed on a semiconductor substrate. The stacked gate structure includes a charge accumulating layer (floating gate electrode) formed on the semiconductor substrate with a gate insulating film interposed, and a control gate electrode formed on the floating gate electrode with an inter-gate insulating film interposed. The memory cell transistor has the threshold value voltage changed according to the number of electrons accumulated in the floating gate electrode, and stores the data according to the difference in the threshold value voltage. In the present embodiment, a case in which the individual memory cell is the write method of the four-value storage method of 2 bit/cell using the upper page and the lower page has been described, but the essence of the present invention is not changed even in a case in which the individual memory cell is the write method of the two-value storage method of 1 bit/cell using a single page or the write method of the eight-value storage method of 3 bit/cell using the upper page, the middle page, and the lower page. The memory cell transistor is not limited to the structure including the floating gate electrode, and may be a structure in which the threshold value voltage can be adjusted by trapping the electrons at the nitride interface serving as the charge accumulating layer such as MONOS (Metal-Oxide-Nitride-Oxide-Silicon). The MONOS type memory cell transistor may be similarly configured to store one bit or may be configured to store multiple values. Furthermore, a semiconductor storage medium in which the memory cell is arranged three-dimensionally as described in U.S. Patent Application Publication No. 2010 0172189 and U.S. Patent Application Publication No. 2010 0254191 may be adopted for the nonvolatile storage medium.

As illustrated in FIG. 2, the NAND memory chip 20080 includes a memory cell array 20082 in which a memory cell for storing data is arranged in a matrix form. The memory cell array 20082 includes a plurality of bit lines, a plurality of word lines, and a common source line, where the memory cell in which data is electrically rewritable is arranged in a matrix form at the intersection of the bit line and the word line. A bit control circuit 20083 for controlling the bit line and a word line control circuit 20085 for controlling the word line voltage are connected to the memory cell array 20082. In other words, the bit line control circuit 20083 reads out the data of the memory cell in the memory cell array 20082 through the bit line, and applies a write control voltage to the memory cell in the memory cell array 20082 through the bit line to carry out write to the memory cell.

A column decoder 20084, a data input/output buffer 20089 and a data input/output terminal 20088 are connected to the bit line control circuit 20083. The data of the memory cell read out from the memory cell array 20082 is output to the outside from the data input/output terminal 20088 through the bit line control circuit 20083 and the data input/output buffer 20089. The write data externally input to the data input/output terminal 20088 is input to the bit line control circuit 20083 by the column decoder 20084 through the data input/output buffer 20089, and the write to the specified memory cell is carried out.

The memory cell array 20082, the bit line control circuit 20083, the column decoder 20084, the data input/output buffer 20089, and the word line control circuit 20085 are connected to a control circuit 20086. The control circuit 20086 generates a control signal and a control voltage for controlling the memory cell array 20082, the bit line control circuit 20083, the column decoder 20084, the data input/output buffer 20089, and the word line control circuit 20085 according to the control signal input to the control signal input terminal 20087. The circuit portion other than the memory cell array 20082 of the NAND memory chip 20080 is called the NAND controller (NANDC) 20081.

Figure 3:
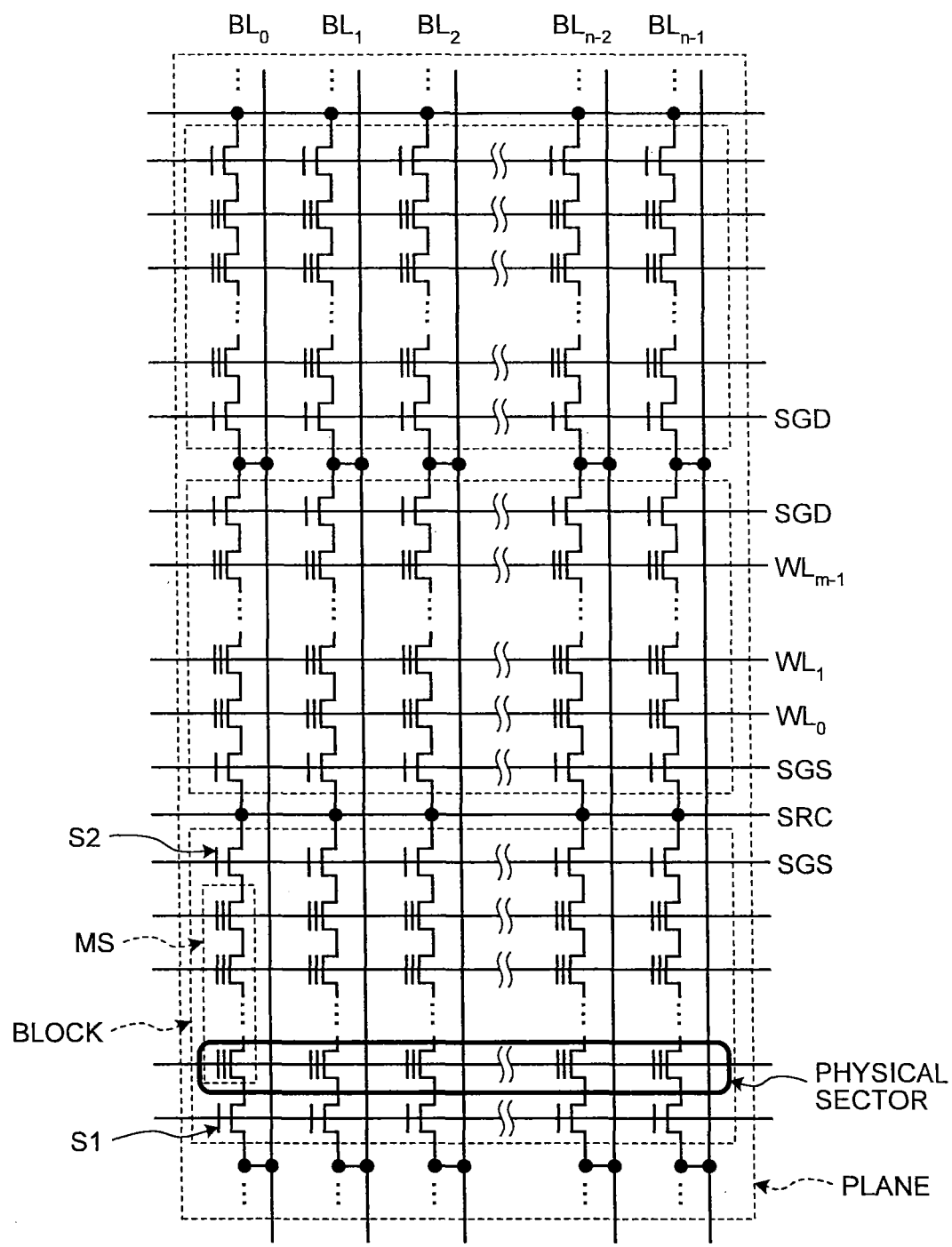
FIG. 3 is a circuit diagram illustrating a configuration example of one plane contained in the NAND memory chip.

FIG. 3 illustrates a configuration of the memory cell array 20082 illustrated in FIG. 2. The memory cell array 20082 is an NAND cell type memory cell array, and is configured to include a plurality of NAND cells. One NAND cell is configured by a memory string MS including memory cells connected in series, and selection gates S1, S2 connected to both ends thereof. The selection gate S1 is connected to the bit line BL, and the selection gate S2 is connected to the source line SRC. The control gate of the memory cell MC arranged in the same row is commonly connected to the word lines WL0 to $WL_{m-1}$. The first selection gate S1 is commonly connected to the select line SGD, and the second selection gate S2 is commonly connected to the select line SGS.

The memory cell array 20082 includes one or a plurality of planes, and the plane includes a plurality of blocks. Each block is configured by a plurality of NAND cells, and the data is erased in units of blocks.

The plurality of memory cells connected to one word line configure one physical sector. The data is written and read out for every physical sector (physical sector is irrelevant to the logical sector of the LBA to be described later). The data worth two pages is stored in one physical sector in the case of the 2 bit/cell write method (four value). The data worth one page is stored in one physical sector in the case of the 1 bit/cell write method (two value), and the data worth three pages is stored in one physical sector in the case of the 3 bit/cell write method (eight value).

At the time of read operation, the program verify operation, and the program operation, one word line is selected and one physical sector is selected according to the physical address received from the memory controller 50. The switching of the page in the physical sector is carried out by the physical address. In the present embodiment, the NAND memory 20 is a 2 bit/cell write method, and the memory controller 50 handles assuming that two pages, the upper page and the lower page, are assigned as physical pages to the physical sector, where the physical address is assigned to all pages.

Figure 4:
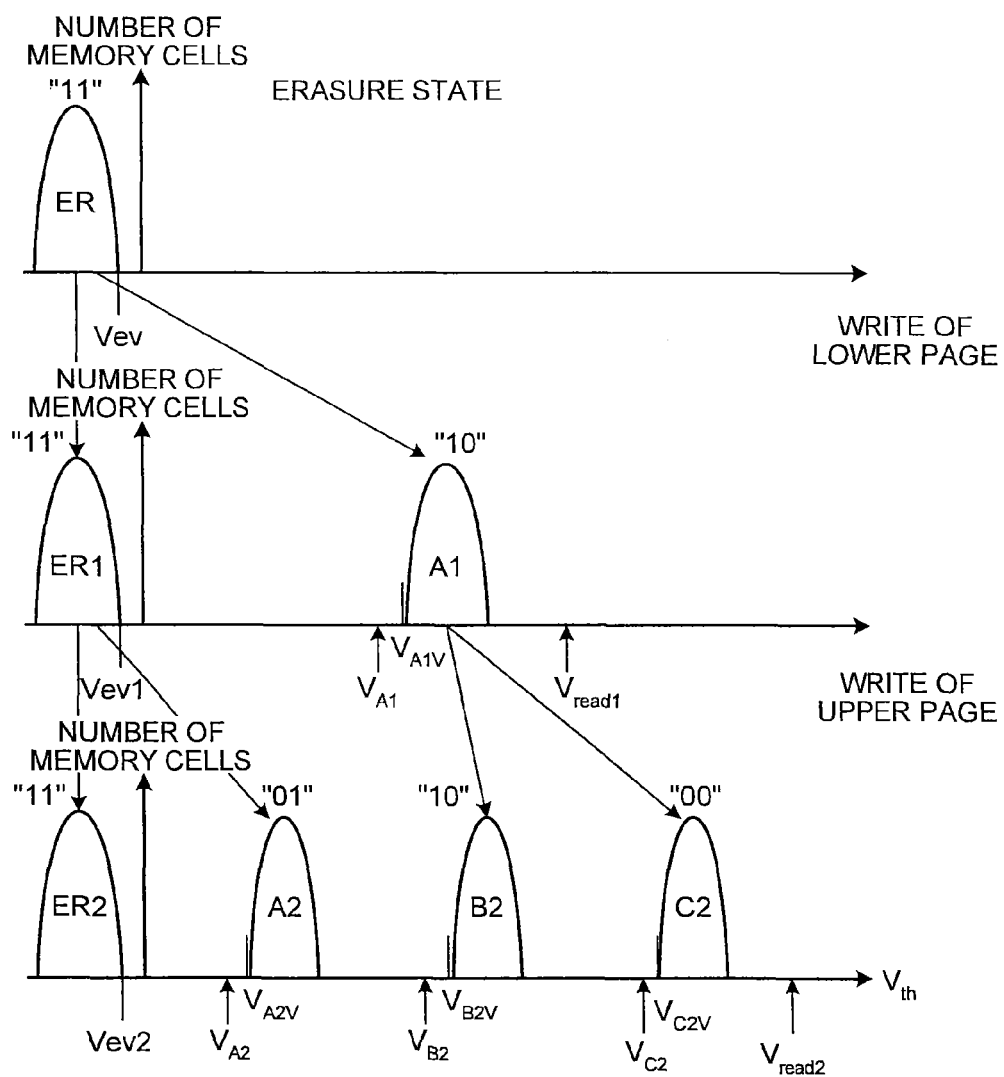
FIG. 4 is a view illustrating a threshold value distribution in a four value data storage method.

The four value NAND memory of 2 bit/cell is configured such that the threshold value voltage in one memory cell has four ways of distribution. FIG. 4 illustrates the relationship between the four value data (data "11", "01", "10", "00") of two bits stored in the memory cell of the four value NAND cell flash memory and the threshold value voltage distribution of the memory cell. In FIG. 4, $V_{A1}$ is the voltage applied to the selected word line when reading out two data with respect to the physical sector in which only the lower page is written and the upper page is not yet written, and $V_{A1V}$ indicates the verify voltage applied to verify whether or not the write is completed when carrying out write to the A1.

$V_{A2}$, $V_{B2}$, $V_{C2}$ are voltages applied on the selected word line when reading out four data with respect to the physical sector in which the lower page and the upper page are written, and $V_{A2V}$, $V_{B2V}$, $V_{C2V}$ indicate the verify voltage applied to verify whether or not the write is completed when carrying out write to each threshold value voltage distribution. Vread1, Vread2 indicate read voltages applied to the non-selected memory cell in the NAND cell to conduct the relevant non-selected memory cell regardless of the held data when carrying out readout of the data. Furthermore, Vev1, Vev2 indicate erase verify voltages applied to the memory cell to verify whether or not the erasure is completed when erasing the data of the memory cell, and have a negative value. The magnitude is determined in view of the influence of the interference of the adjacent memory cell. The magnitude relationship of each voltage is, $$Vev1 < V_{A1} < V_{A1V} < Vread1$$

$$Vev2 < V_{A2} < V_{A2V} < V_{B2} < V_{B2V} < V_{C2} < V_{C2V} < Vread2.$$

The erase verify voltages Vev1, Vev2, Vev3 take negative values, as described above, but the voltage actually applied to the control gate of the memory cell MC in the erase verify operation is not a negative value, and is zero or a positive value. That is, in the actual erase verify operation, a positive voltage is applied on the back gate of the memory cell MC, and a voltage having a value of zero or a positive value smaller than the back gate voltage is applied on the control gate of the memory cell MC. In other words, the erase verify voltages Vev1, Vev2, Vev3 are voltages that equivalently have a negative value.

The threshold value voltage distribution ER of the memory cell after the block erasure has an upper limit value of a negative value, and is assigned with data "11". The memory cell of the data "01", "10", and "00" in a state the lower page and upper page are written each has a positive threshold value voltage distribution A2, B2, C2 (lower limit value of A2, B2, C2 is also a positive value), where the threshold value voltage distribution A2 of data "01" has the lowest voltage value, the threshold value voltage distribution C2 of data "00" has the highest voltage value, and the voltage values of various types of threshold value voltage distributions have a relationship of A2<B2<C2. The memory cell of data "10" in a state the lower page is written and the upper page is not written has a positive threshold value voltage distribution A1 (lower limit value of A1 is also a positive value). The threshold value voltage distribution illustrated in FIG. 4 is merely an example, and the present invention is not to be limited thereby. For instance, the threshold value voltage distributions A2, B2, C2 are all explained to be positive threshold value voltage distributions in FIG. 4, but a case in which the threshold value voltage distribution A2 is a distribution of negative voltage and the threshold value voltage distributions B2, C2 are distributions of positive voltages is also encompassed within the scope of the invention. Even if the threshold value voltage distributions ER1, ER2 are positive values, the present invention is not to be limited thereby. In the present embodiment, the correspondence relationship of the data of ER2, A2, B2, C2 is described as "11", "01", "10", "00", but may be other correspondence relationships such as "11", "01", "00", "10".

The two bit data of one memory cell includes the lower page data and the upper page data, where the lower page data and the upper page data are written to the memory cell through different write operations, that is, two write operations. Notating the data as "*@", * represents the upper page data and @ represents the lower page data.

Figure 14:
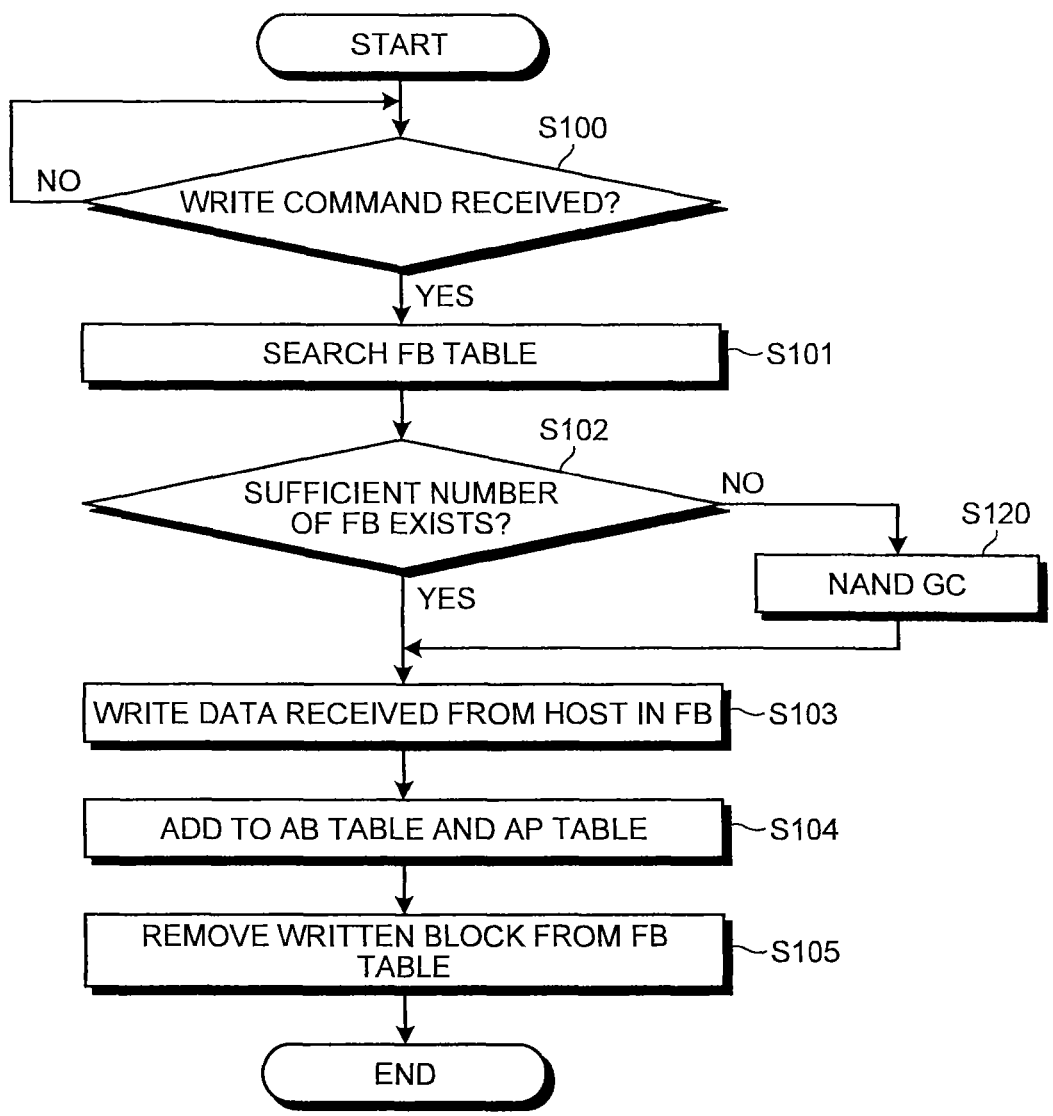
FIG. 14 is a flowchart illustrating the write operation example of the SSD.

First, the write of the lower page data will be described with reference to the first stage to the second stage of FIG. 4. All the memory cells are assumed to have the threshold value voltage distribution ER in the erasure state, and store the data "11". As illustrated in FIG. 14, when the write of the lower page data is carried out, the threshold value voltage distribution ER of the memory cell is divided into two threshold value voltage distributions (ER1, A1) according to the value ("1" or "0") of the lower page data. If the value of the lower page data is "1", the threshold value voltage distribution ER of the erasure state is maintained and hence ER1=ER, but may be ER1>ER.

If the value of the lower page data is "0", high electric field is applied on the tunnel oxide film of the memory cell, electrons are injected to the floating gate electrode, and the threshold value voltage Vth of the memory cell is raised by a predetermined amount. Specifically, the verify potential VA1V is set, and the write operation is repeated until reaching the threshold value voltage of greater than or equal to the verify voltage VA1V. As a result, the memory cell changes to the write state (data "10"). If the threshold value voltage is not reached even if the write operation is repeated for a predetermined number of times (or if number of memory cells that has not reached the threshold value voltage is greater than or equal to a predetermined value), the write status with respect to the physical page becomes "write error".

The write of the upper page data will now be described with reference to the second stage to the third stage of FIG. 4. The write of the upper page data is carried out based on the write data (upper page data) input from the exterior of the chip, and the lower page data already written to the memory cell.

In other words, as illustrated in the second stage to the third stage of FIG. 4, if the value of the upper page data is "1", the high electric field is prevented from being applied to the tunnel oxide film of the memory cell thus preventing the rise of the threshold value voltage Vth of the memory cell. As a result, the memory cell of data "11" (threshold value voltage distribution ER1 of erasure state) maintains the data "11" as is (ER2), and the memory cell of the data "10" (threshold value voltage distribution A1) maintains the data "10" as is (B2). However, it is desirable to adjust the lower limit value of the threshold value voltage distribution using the positive verify voltage $V_{B2V}$ greater than the verify voltage $V_{A1V}$ thus forming the threshold value voltage distribution B2 in which the width of the threshold value voltage distribution is narrowed from the standpoint of ensuring the voltage margin between each distribution. If the threshold value voltage is not reached even if the lower limit value adjustment is repeated for a predetermined number of times (or if number of memory cells that has not reached the threshold value voltage is greater than or equal to a predetermined value), the write status with respect to the physical page becomes "write error".

If the value of the upper page data is "0", the high electric field is applied to the tunnel oxide film of the memory cell, the electrons are injected to the floating gate electrode, and the threshold value voltage Vth of the memory cell is raised by a predetermined amount. Specifically, the verify potentials $V_{A2V}$, $V_{C2V}$ are set, and the write operation is repeated until reaching the threshold value voltage of greater than or equal to the verify voltage $V_{A1V}$. As a result, the memory cell of the data "11" (threshold value voltage distribution ER1 of erasure state) changes to the data "01" of the threshold value voltage distribution A2, and the memory cell of data "10" (A1) changes to data "00" of the threshold value voltage distribution C2. In this case, the lower limit value of the threshold value voltage distributions A2, C2 is adjusted using the verify voltages $V_{A2V}$, $V_{C2V}$. If the threshold value voltage is not reached even if the write operation is repeated for a predetermined number of times (or if number of memory cells that has not reached the threshold value voltage is greater than or equal to a predetermined value), the write with respect to the physical page becomes "write error".

In the erasure operation, the erase verify potential Vev is set, and the erasure operation is repeated until the threshold value voltage of smaller than or equal to the verify voltage Vev. As a result, the memory cell changes to the erasure state (data "11"). If the threshold value voltage is not reached even if the erasure operation is repeated for a predetermined number of times (or if number of memory cells that has not reached the threshold value voltage is greater than or equal to a predetermined value), the erase status with respect to the physical page becomes "erase error".

One example of the data write method in the typical four value storage method is as described above. The basic operation is similar in the multi-bit storage method of three or more bits as the operation of dividing the threshold value voltage distribution in eight or more ways according to the upper page data is simply added with respect to the operation described above.

The RAM 40 includes cache memory (CM) 40a functioning as a data transfer cache between the host 100 and the NAND memory 20. The RAM 40 functions as management information storage memory and work region memory. The management table managed by the RAM 40 is realized by extracting various types of management tables stored in the NAND memory 20 at the time of startup, and is evacuated and saved in the NAND memory 20 periodically or at the time of power disconnection.

The memory controller 50 has the function thereof realized by a processor for executing a system program (firmware) stored in the NAND memory 20, various types of hardware circuits, and the like, and executes the data transfer control between the host 100 and the NAND memory 20 with respect to various types of commands such as the write request, the cache flash request, and the read request from the host 100, the update and management of various types of management tables stored in the RAM 40 and the NAND memory 20.

When issuing the read request or the write request, the host 100 outputs LBA (Logical Block Addressing) serving as a logical address to the SSD 10 through the ATA interface 90. LBA is a logical address in which serial numbers from zero are attached to logical sectors (size: e.g., 512 B). When using the read request or the write request, the host 100 outputs the sector size corresponding to the target of read request or the write request along with the LBA to the SSD 10.

The interface controller 30 includes a read/write mode interface controller (hereinafter abbreviated as RWIF controller) 31 such as the ATA controller used in the normal operation mode in which read/write are enabled, a read only mode interface controller (hereinafter abbreviated as ROIF controller) 32 such as the ATAPI (ATA Packet Interface) controller or a controller of the read only media standard used in the read only mode in which only data reading of data reading and data writing is permitted, and selection switches 33, 34 capable of selecting either one of the RWIF controller 31 or the ROIF controller 32.

The selection switch 33 exclusively selects either one of the RWIF controller 31 or the ROIF controller 32 and connects the same to the ATA interface 90, and the selection switch 34 exclusively selects either one of the RWIF controller 31 or the ROIF controller 32 and connects the same to the bus 57. In the selection state of the RWIF controller 31, the selection switch 33 causes the ATA interface 90 and the RWIF controller 31 to be in an electrically connected state, and the switch 34 causes the bus 57 and the RWIF controller 31 to be in an electrically connected state. In the selection state of the ROIF controller 32, the selection switch 33 causes the ATA interface 90 and the ROIF controller 32 to be in an electrically connected state, and the switch 34 causes the bus 57 and the ROIF controller 32 to be in an electrically connected state.

The RWIF controller 31 is desirably configured to explicitly indicate to the host 100 that the SSD 10 is the ATA device. For instance, in the Device Signature described in ATA/ATAPI Command Set-2 (ACS-2), LBA(7:0) is output to 01h, LBA(15:8) to 00h, and LBA(23:16) to the host 100 as 00h, so that notification can be made to the host 100 that the SSD 10 is the ATA device. The ROIF controller 32 is desirably configured to explicitly indicate to the host 100 that the SSD 10 is the ATAPI device. For instance, in the Device Signature described in ACS-2, LBA(7:0) is output to 01h, LBA(15:8) to 14h, and LBA(23:16) to the host 100 as EBh, so that notification can be made to the host 100 that the SSD 10 is the ATAPI device.

The ROIF controller 32 is configured to notify the host 100 that the SSD 10 does not support the write command and is read only. For instance, when receiving the command GET CONFIGURATION (46h) adopted in the INCITS Multi-Media Commands-6 (MMC-6) from the host 100 through the ATA interface 90, the ROIF controller 32 returns to the host 100 that all the write functions are non-supportive in the features such as Random Writable (Feature Number=0020h), Incremental Streaming Writable (Feature Number=0021h), Write Once (Feature Number=0025h), and the like. Therefore, the SSD 10 can be recognized as a readable device even if the host 100 side is using the Windows (registered trademark) and the like for the OS. On the other hand, the ROIF controller 32 may be configured to explicitly indicate to the host 100 that the SSD 10 is the ATA device, similar to the RWIF controller 31, and may be configured to return to the host 100 that all the write functions are non-supportive when receiving the device identification information such as the command ECh IDENTIFY DEVICE described in ACS-2 from the host 100 through the ATA interface 90. The method of notifying whether or not the SSD 10 is a read only device may take various other forms.

The functions of the interface controller 30 and the various controllers included therein may all be mounted as hardware such as LSI, or may have one part or all mounted as software such as firmware. The firmware is saved in the NAND memory 20 when the power supply of the SSD is turned OFF, but is read out by the IPL 55 to the RAM 40 or the memory controller 50 at the startup of the power supply of the SSD when being mounted as the firmware.

The RWIF controller 31 has a function of receiving the read request, the write request, and other requests and data from the host 100, transmitting the received requests and data to the memory controller 50, and transmitting the data to the RAM 40 by the control of the memory controller 50. The RWIF controller 31 also transmits identification information that it is a readable and writable device to the host 100 when receiving a transmission request for device identification information from the host 100.

The ROIF controller 32 has a function of receiving the read request, other requests excluding the write request, and data from the host 100, transmitting the received requests and data to the memory controller 50, and transmitting the data to the RAM 40 by the control of the memory controller 50. The ROIF controller 21 also transmits device identification information that it does not support write to the host 100 when receiving a transmission request for device identification information from the host 100. Thus, the host 100 recognizes that the SSD 10 does not support write, and hence the write request will not be transmitted from the host 100 to the SSD 10. When the write request is transmitted from the host 100 to the SSD 10 after transmitting the device identification information that it does not support write to the host 100, the ROIF controller 32 may return an error to the host 100. The ROIF controller 32 carries out processes similar to the RWIF controller 31 with respect to the command that does not involve the write operation of the NAND memory 20.

The IPL 55 is started when the power of the SSD 10 is turned ON and performs the initialization process of the NAND memory 20, the RAM 40, the memory controller 50, and the interface controller 30. In this case, the IPL 55 reads out the management information of the NAND memory 20 from the NAND memory 20 or the RAM 40. The IPL 55 determines whether or not the read only mode shift condition is met based on the read management information, that is, whether or not the SSD 10 is in a state to be used in the normal operation mode or in a state to be used in the read only mode. If determined as the normal mode, as a result of the determination, the IPL 55 sets the selection switches 33, 34 to select the RWIF controller 31, and causes the ROIF controller 32 to be in a non-selected state. If determined that the SSD 10 is in a state to be used in the read only mode based on the read management information, the IPL 55 sets the selection switches 33, 34 to select the ROIF controller 32, and causes the RWIF controller 31 to be in a non-selected state. The read only mode shift condition will be described in detail later.

The memory controller 50 desirably determines whether or not the read only mode shift condition for shifting to the read only mode state is met even while the SSD 10 is operating in the normal readable/writable state, and executes the read only mode shift process, to be described later, when the read only mode shift condition is met while the SSD 10 is operating in the normal state. The interface controller 30 consequently switches to the ROIF controller 32 according to the read only mode shift process.

The configuration of the host 100 will now be described. The host 100 includes an operating system (OS) 150, an SSD control tool 110, and an interface driver 120 for the SSD 10. The interface driver 120 includes a read/write mode interface driver (hereinafter abbreviated as RWIF driver) 121 such as the ATA driver used when the SSD 10 is in the normal operation mode in which read/write are enabled, a read only mode interface driver (hereinafter abbreviated as ROIF driver) 122 such as the read only driver of the ATAPI driver used when the SSD 10 is in the read only mode, and selection switches 123, 124 for selecting the driver to be applied on the SSD 10 by the RWIF driver 121 and the ROIF driver 122. The SSD control tool 110 can select the driver to be applied on the SSD 10 from either one of the RWIF driver 121 or the ROIF driver 122 or may have both drivers in the non-selected state through the selection switches 123, 124. The software 140 is software other than the SSD control tool 110, and is software that uses the SSD 10.

Figure 5:
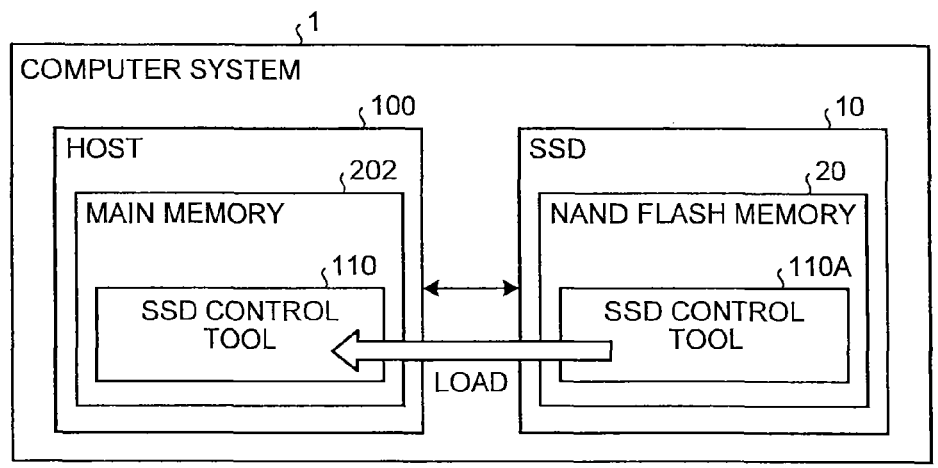
FIG. 5 is a block diagram illustrating a function configuration example of a computer system of when saving a SSD control tool in an SSD.
Figure 6:
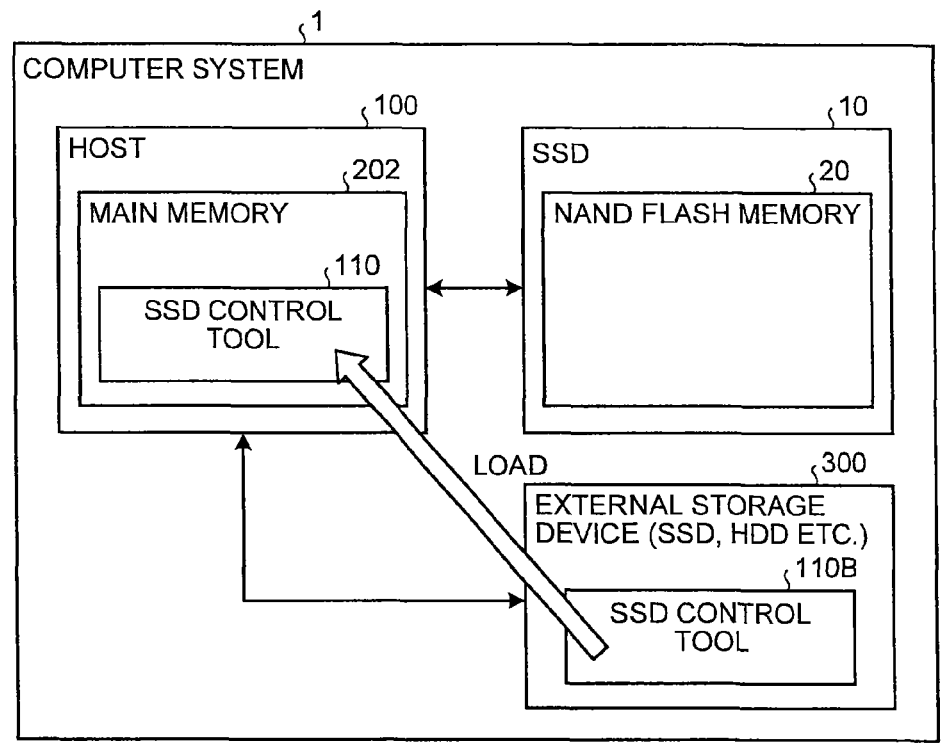
FIG. 6 is a block diagram illustrating a function configuration example of a computer system of when saving the SSD control tool in another external storage device.

As illustrated in FIG. 5, the SSD control tool 110 is stored as the SSD control tool 110A in the region of the NAND memory 20 of the SSD 10 when the power supply of the host 100 is turned OFF, but is loaded from the NAND memory 20 to main memory 202 at the startup of the host 100 or the startup of the program. As illustrated in FIG. 6, if a plurality of external storage devices is connected to the host 100, the SSD control tool 110 may be stored in a region of the external storage device 300 different from the SSD 10 as a SSD control tool 100B, and may be loaded from the external storage device 300 to the main memory 202 at the startup of the host 100 or the startup of the program. In particular, if the external storage device 300 is used as a system drive for storing the OS 150, and the SSD 10 is used as a data drive for storing user data such as documents, still image data, and moving image data, it is desirable to store the SSD control tool 110 in the external storage device 300 serving as the system drive from the standpoint of clearly separating the roles of the drive 10 and the drive 300 such as using the external storage device 300 serving as the system drive as a drive for mainly storing the OS and the application program and using the SSD 10 serving as the data drive as a drive for storing the user data.

As illustrated in FIG. 5 and FIG. 6, it is desirable for the computer system 1 to be shipped with the SSD control tool 110 stored in the SSD 10 or the external storage device 300, put on the shelves, and provided to the user from the standpoint of saving the effort of the user in carrying out the setup of the SSD control tool 110. From the standpoint of enabling the user to select whether or not to install the SSD control tool and from the standpoint of providing the most recent SSD control tool to the user, the SSD control tool is desirably stored in the SSD 10 or the external storage device 300 by being downloaded from the WEB or installed from an external storage medium such as a DVD-ROM, USB memory, or the like.

Figure 7:
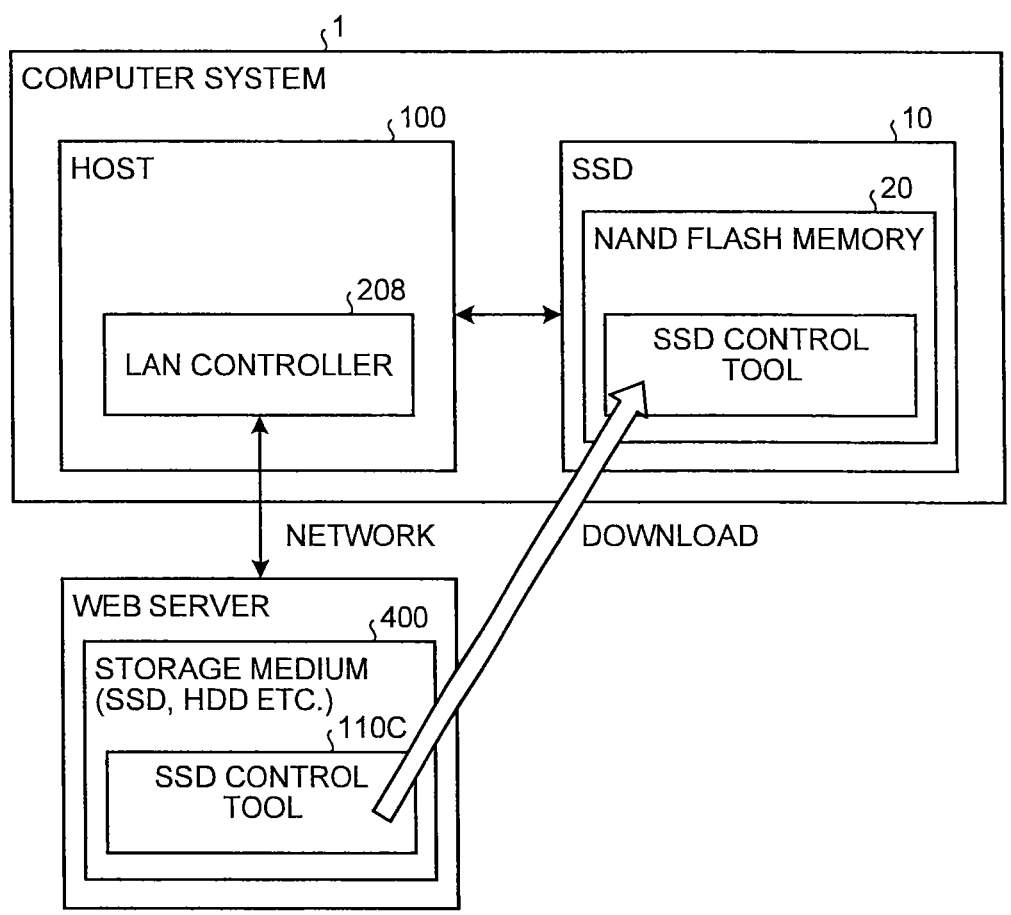
FIG. 7 is a block diagram illustrating a function configuration example of a computer system of when installing the SSD control tool from the WEB.

FIG. 7 illustrates one example of a case of downloading the SSD control tool from the WEB. In FIG. 7, a SSD control tool 110C is stored in a storage medium 400 in a WEB server, and the SSD control tool 110C is downloaded to the SSD 10 or the external storage device 300 through the LAN controller 208 or the like via a network such as the Internet, local network, and wireless LAN.

Figure 8:
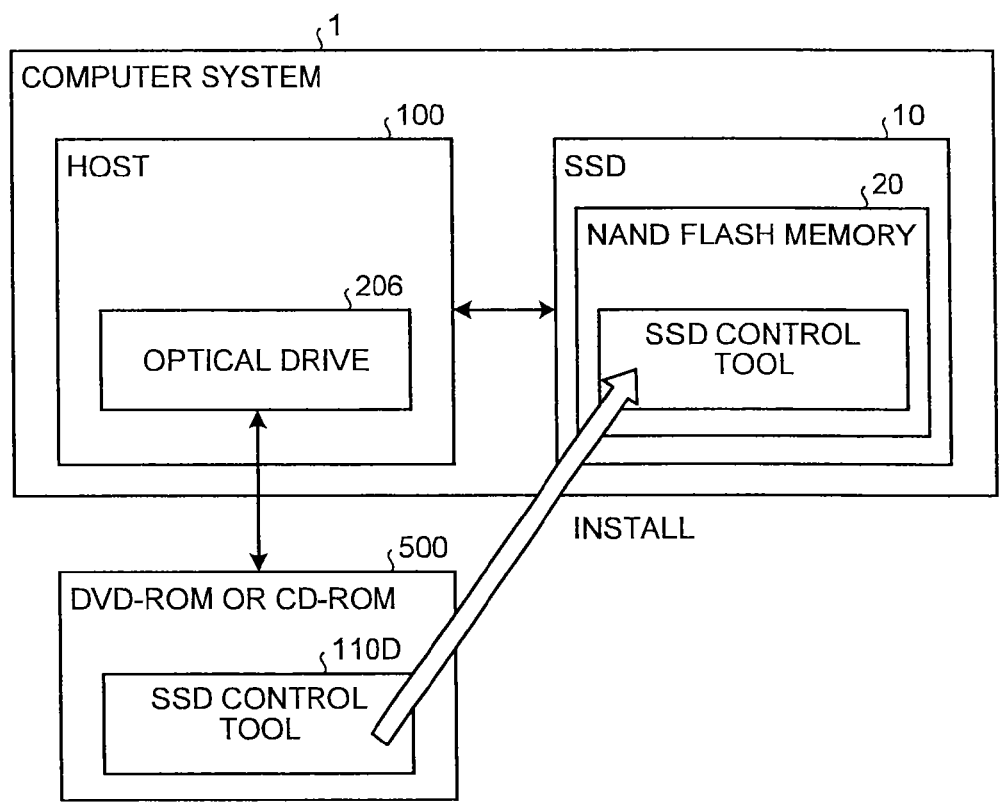
FIG. 8 is a block diagram illustrating a function configuration example of a computer system of when installing the SSD control tool from an optical driver.

FIG. 8 illustrates one example of a case of installing the SSD control tool from an optical medium such as a DVD-ROM or a CD-ROM. An SSD control tool 110D is stored in the optical medium 500 such as the DVD-ROM or the CD-ROM, and the optical medium 500 is set in the optical drive 206, so that the SSD control tool 110D is installed in the SSD 10 or the external storage device 300 through the optical drive 206.

Figure 9:
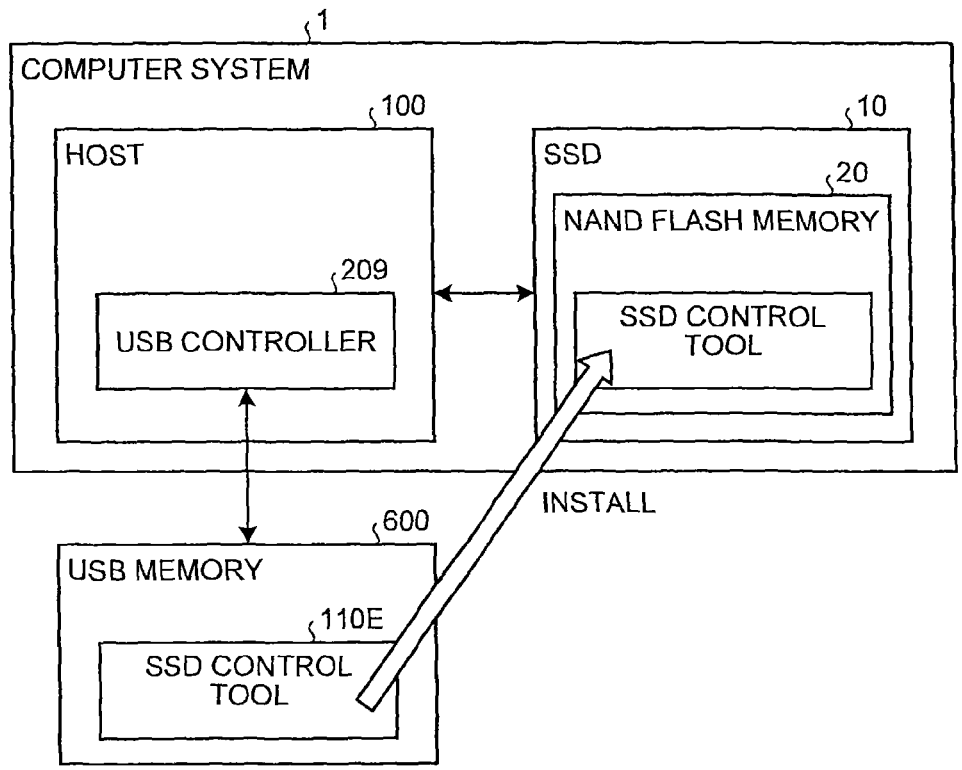
FIG. 9 is a block diagram illustrating a function configuration example of a computer system of when installing the SSD control tool from USB memory.

FIG. 9 illustrates one example of a case of installing the SSD control tool from the USB memory. An SSD control tool 110E is stored in USB memory 600, where the SSD control tool 110E is installed in the SSD 10 or the external storage device 300 through the USB controller 209 by connecting the USB memory 600 to the USB controller 209. Other external memories such as an SD card may, of course, be used instead of the USB memory 600. The optical medium 500 and the USB memory 600 are desirably packaged with the SSD 10 as accessories at the time of shipment of the SSD 10 from the standpoint of facilitated availability by the user. The optical medium 500 or the USB memory 600 may be sold alone as software product or may be attached as a supplement to magazines and books.

The selection switch 124 exclusively selects either one of the RWIF driver 121 or the ROIF driver 122 and connects the same to the ATA interface 90, and the selection switch 123 exclusively selects either one of the RWIF driver 121 or the ROIF driver 122 and connects the same to the software 140. In the selection state of the RWIF driver 121, the selection switch 124 causes the ATA interface 90 and the RWIF driver 121 to be in a connected state, and the switch 123 causes the software 140 and the RWIF driver 121 to be in a connected state. In the selection state of the ROIF driver 122, the selection switch 124 causes the ATA interface 90 and the ROIF driver 122 to be in a connected state, and the switch 123 causes the software and the ROIF driver 122 to be in a connected state.

Figure 10:
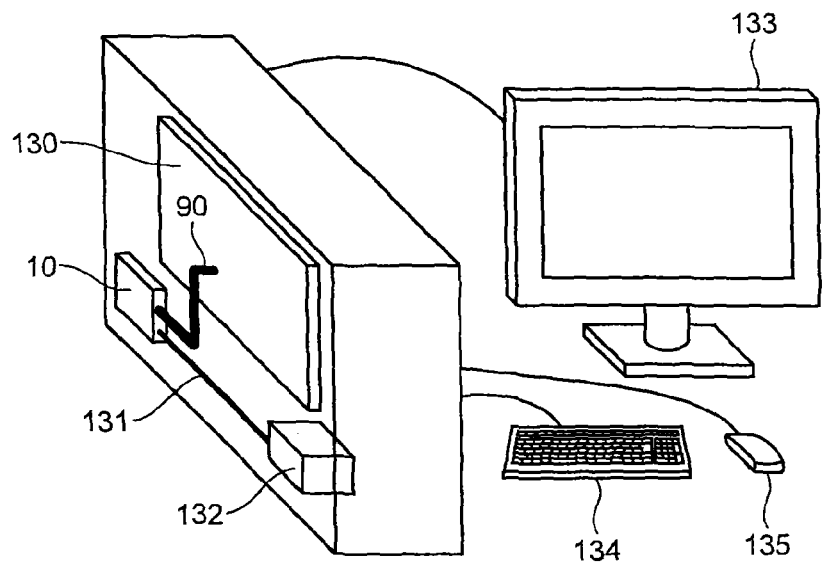
FIG. 10 is a view illustrating an outer appearance configuration of the computer system.

FIG. 10 illustrates an outer appearance configuration of the computer system 1. FIG. 10 illustrates a configuration of a general desk top type personal computer. The SSD 10 is physically connected to the motherboard 130 through an SATA cable serving as the ATA interface 90, and electrically connected to the CPU (not illustrated) attached on the motherboard 130 through the south bridge mounted on the motherboard 130. The SSD 10 is connected to a power supply circuit 132 through a power supply cable 131. A display 133, a keyboard 134, a mouse 135, and the like are connected to the motherboard 130. The computer system is not limited to a desk top type, and is applicable to a laptop type of a notebook type personal computer.

Figure 11:
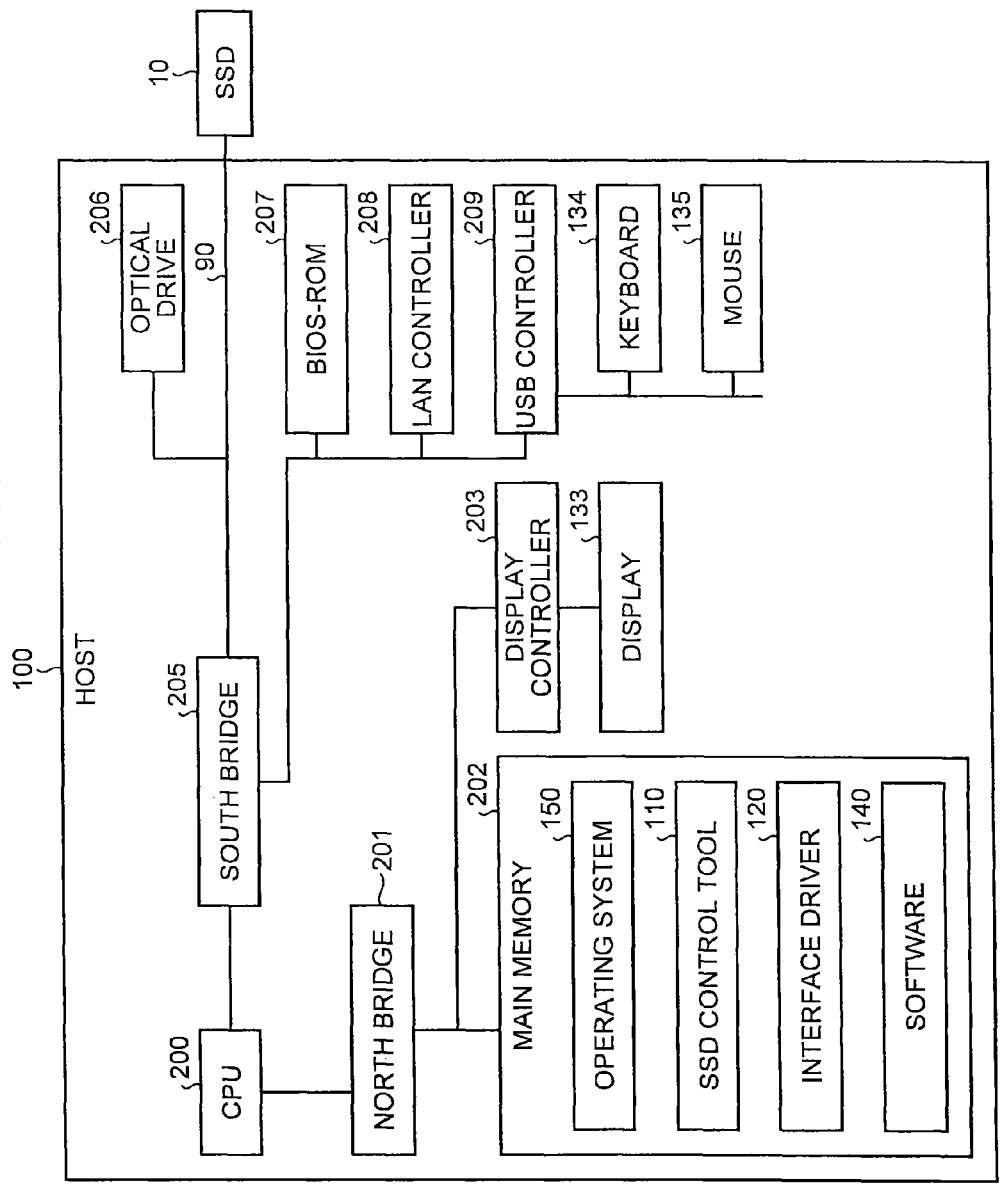
FIG. 11 is a block diagram illustrating a function configuration example of the host.

FIG. 11 illustrates a system configuration example of the host 100 mounted with the SSD 10. The host 100 includes a CPU 200, a north bridge 201, main memory 202 such as DRAM, a display controller 203, a south bridge 205, an optical drive 205, BIOS-ROM 207, a LAN controller 208, a USB controller 209, a keyboard 134, a mouse 135, and the like.

The CPU 200 is a processor arranged to control the operation of the computer system, and executes the operating system (OS) loaded from the SSD 10 to the main memory 202. Furthermore, when the optical drive 206 enables the execution of at least one process of the read process and the write process with respect to the loaded optical disc, the CPU 200 executes such processes.

The CPU 200 also executes system BIOS (Basic Input Output System) stored in the BIOS-ROM 207. The system BIOS is a program for hardware control in the computer system.

The north bridge 201 is a bridge device connected to the local bus of the CPU 200. The north bridge 201 incorporates a memory controller for access controlling the main memory 202. The north bridge 201 also has a function of executing communication and the like with the display controller 203.

The main memory 202 temporarily stores programs and data, and functions as a work area of the CPU 200. The main memory 202 is configured by DRAM and the like, The video controller 203 is a video reproduction controller for controlling the display 133 of the computer system.

The south bridge 205 is a bridge device connected to the local bus of the CPU 200. The south bridge 205 controls the SSD 10 or the storage device for storing various types of software and data through the ATA interface 90.

In the computer system, the access to the SSD 10 is made in units of logical sectors. The write command (write request), the read command (read request), the flash command, and the like are input to the SSD 10 through the ATA interface 90.

The south bridge 205 also has a function for access controlling the BIOS-ROM 207, the optical drive 206, the LAN controller 208, and the USB controller 209. The keyboard 134 and the mouse 135 are connected to the USE controller 209.

In FIG. 11, the OS 150, the SSD control tool 110, the interface driver 120 including the RWIF driver 121, the ROIF driver 122 and the like, and the software 140 are saved in the SSD 10 when the power supply of the computer system is turned OFF, and loaded from the SSD 10 to the main memory 202 when the power supply of the host is turned ON or when such functions are called out. The interface driver 120 loaded on the main memory 202 is read to the CPU 200 through the north bridge 201, and the CPU 200 performs the control of the SSD 10 through the south bridge 205 based on the information of the read interface driver.

Figure 12:
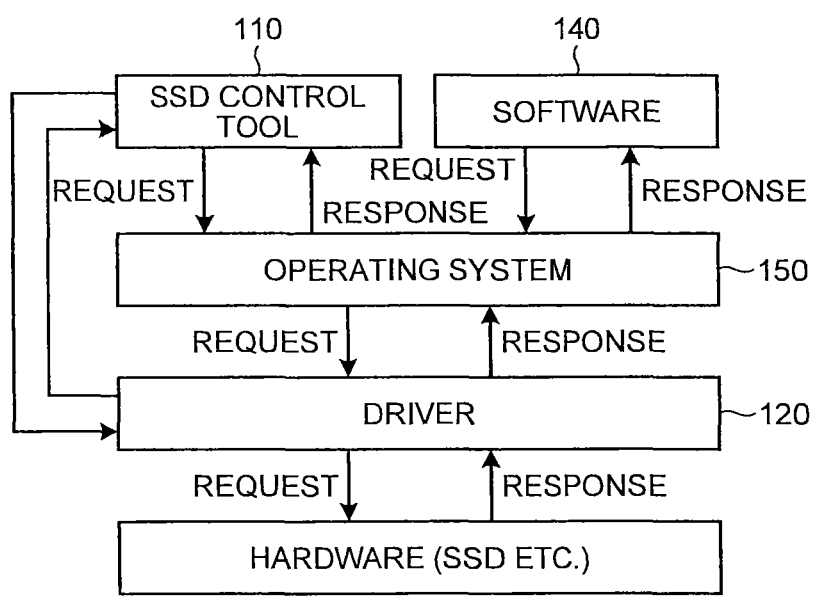
FIG. 12 is a block diagram illustrating a hierarchical function configuration example of the host.

FIG. 12 illustrates a hierarchical structure of various types of elements of the computer system. The SSD control tool 110 and the software 140 normally do not directly communicate with the SSD 10, and communicate with the SSD 10 through the OS 150 and the interface driver 120. If a need for the SSD control tool 110 and the software 140 to transmit a command such as the read request and the write request to the SSD 10 arises, the SSD control tool 110 and the software 140 transmit the access request in units of files to the OS 150. The OS 150 references the file management table or metadata included in the OS 150, specifies the logical address (LBA) of the SSD 10 corresponding to the file to which the access request is made, and transmits the command including the corresponding LBA to the interface driver 120. The interface driver 120 converts the command from the OS 150 to a command unique to the relevant interface, and transmits the same to the SSD.

If a response is returned from the SSD 10, the interface driver 120 converts the response unique to the relevant interface to the command of the OS 150, and transmits the same to the OS 150. The OS 150 specifies to which response on which software the response after the conversion corresponds, and returns the response to the specified software.

The SSD control tool 110 can directly access the interface driver 120 without interposing the OS 150. The SSD control tool 110 can exclusively select which of the RWIF driver 121 or the ROIF driver 122 of the interface driver is valid by directly accessing the interface driver. If the RWIF driver 121 is valid, the RWIF driver 121 relays the OS 150 and the SSD 10, and the ROIF driver 122 does not perform anything. If the ROIF driver 122 is valid, the ROIF driver 122 relays the OS 150 and the SSD 10, and the RWIF driver 121 does not perform anything. The SSD control tool 110 may alternatively select the RWIF driver 121 and the ROIF driver 122 through the OS 150.

The SSD control tool 110 acquires the device identification information of the SSD from the SSD 110 at the time of startup of the host or at the time of the SSD connection. Whether the SSD 10 is a readable and writable device or a write non-supporting device is determined based on the device identification information, and the switching setting of the interface driver 120 is carried out based on the determination result. The RWIF driver 121 is made valid if determined that the SSD 10 is the readable and writable device, and the ROIF driver 122 is made valid if determined that the SSD 10 is the write non-supporting device. The SSD control tool 110 determines that the SSD 10 switched to the read only mode if the response from the SSD 10 with respect to the write request is an error, and restarts the SSD 10 and switches the interface driver 120 from the RWIF driver 121 to the ROIF driver 122.

The ROIF driver 122 is desirably configured to not transmit the write command with respect to the SSD 10 at all from the standpoint of preventing the loss of user data caused by data breakage or damage of the SSD 10. However, if there is a need to write the data of one part such as the system information of the operating system in the SSD 10, the ROIF driver 122 may permit the write of the relevant data to the SSD 10 as an exception but the data amount of the relevant data is desirably sufficiently small compared with the capacity of the NAND memory 20. More desirably, in order to prevent the user from transmitting the write command by mistake and writing the data to the SSD 10, the ROIF driver 122 does not transmit the normal write command with respect to the SSD 10 at all such as 35h WRITE DMA EXT and 61h WRITE FPDMA QUEUED described in ACS-2, and the write with respect to the SSD 10 is desirably permitted by only the command using a special command such as the SCT Command Transport described in INCITS ACS-2 and other commands unique to the vendor if there is an exceptional need to write the data to the SSD 10. If the write using a special command can be exceptionally carried out even at the time of the application of the ROIF driver 122 (time of RO mode), the memory controller 50 and the ROIF controller 32 need to be configured to receive the special command from the host 100 and perform the data write process normally even if the SSD 10 is the RO mode.

FIG. 13 illustrates a configuration of management information used in the SSD 10. The management information is stored in a non-volatile manner in the NAND memory 20, as described above. The management information stored in the NAND memory 20 is extracted in the RAM 40 at the startup of the SSD 10 for use. The management information on the RAM 40 is evacuated and saved in the NAND memory 20 periodically or at the time of power disconnection. If the RAM 40 is nonvolatile RAM such as MRAM or FeRAM, the management information may be stored only in the RAM 40, in which case the management information is not stored in the NAND memory 20.

As illustrated in FIG. 13, the management information includes a free block table 21, a bad block table 22, an active block table 23, an active page table 24, a read only (RO) mode flag 25, and statistical information 26.

The free block table (FB table) 21 manages the ID of the physical block (free block: FE) of the NAND memory that can be newly assigned for write when carrying out write to the NAND memory 20. The FB table also manages the number of times of erasing for every physical block ID.

The bad block table (BB table) 22 manages the ID of the bad block (BB) serving as a physical block that cannot be used as a storage region due to too much error etc.

The active block table (AB table) 23 manages the active block (AB) or the physical block assigned with application. In the AB table 23, the correspondence relationship of the LBA and the ID of the active block (AB) is managed. The number of times of erasing is also managed for every physical block ID.

The active page table (AP table) 24 manages the correspondence relationship of the LBA and the physical block ID and the physical page ID assigned with application.

The RO mode flag 25 is written with 0 at the time of shipment and at normal times, and is written with 1 when the SSD operates as the RO mode.

The statistical information 26 stores various parameters (X01 to X24) related to the reliability of the SSD 10.

The statistical information includes total number of bad blocks (statistical information X01), total number of times of erasing (statistical information X02), average value of number of times of erasing (statistical information X03), cumulative value of number of times of write error occurrences of the NAND memory (statistical information X04), cumulative value of number of times of erase error occurrences of the NAND memory (statistical information X05), total number of readout logical sectors (statistical information X06), total number of write logical sectors (statistical information X07), total number of uncorrectable ECC error count (statistical information X08), total number of n bits to m bits ECC correction units (statistical information X09), number of times of R error occurrences of SATA communication (statistical information X10), number of times of error occurrences of SATA communication (statistical information X11), number of times of error occurrences of RAM 40 (statistical information X12), total number of used time of SSD 10 (statistical information X13), time total in which temperature is higher than highest value of recommended operation temperature (statistical information X14), time total in which temperature is lower than lowest value of recommended operation temperature (statistical information X15), maximum value of response time of command (statistical information X16), average value of response time of command (statistical information X17), maximum value of response time of NAND memory (statistical information X18), average value of response time of NAND memory (statistical information X19), current temperature (statistical information X20), highest temperature (statistical information X21), lowest temperature (statistical information X22), increase rate of statistical information (statistical information X23), NAND GC failure flag (statistical information X24), and the like.

The total number of bad blocks (statistical information X01) will be described. The statistical information X01 is incremented by one every time one physical block of the NAND memory 20 in the SSD 10 is added as the bad block. The statistical information X01 is desirably reset to zero at the time of manufacturing (before test process) of the SSD 10, where the block in which error occurred in the test process or in which the inter-distribution voltage margin of the threshold value distribution is small is more desirably added to the bad block in advance. The statistical information X01 may be directly calculated from the BE table 22 without being stored in the statistical information 26. The more the statistical information X01 increases, it shows that the more the reliability degrades.

The total number of times of erasing (statistical information X02) will be described. The statistical information X02 indicates the cumulative value of the number of times of erasing of all the blocks of the NAND memory 20 in the SSD 10. The statistical information X02 is incremented by one every time one physical block of the NAND memory 20 of the SSD 10 is erased. The statistical information X02 is desirably reset to zero at the time of manufacturing (before test process) of the SSD 10. The statistical information X02 may be directly calculated from the FB table 21, the BB table 22, and the AB table 23 without being stored in the SSD statistical information 26. The more the statistical information X02 increases, it shows that the more the reliability degrades.

The average value of number of times of erasing (statistical information X03) will be described. The statistical information X03 indicates an average value per one block of the number of times of erasing of all the blocks of the NAND memory 20 in the SSD 10. The block of one part such as the block storing the management information may be excluded from the target of counting of the statistical information X03. The statistical information X03 is desirably reset to zero at the time of manufacturing (before test process) of the SSD 10. The statistical information X03 may be directly calculated from the FB table 21, the BB table 22, and the AB table 23 without being stored in the statistical information 26. The more the statistical information X03 increases, it shows that the more the reliability degrades.

The cumulative value of number of times of write error occurrences of the NAND memory (statistical information X04) will be described below. The statistical information X04 is added by one every time the write error occurs in units of one write in the NAND memory 20 of the SSD 10 (may be added in units of blocks). The statistical information X04 is desirably reset to zero at the time of manufacturing (before test process) of the SSD 10. The more the statistical information X04 increases, it shows that the more the reliability degrades.

The cumulative value of number of times of erase error occurrences of the NAND memory (statistical information X05) will be described. The statistical information X05 is desirably reset to zero at the time of manufacturing (before test process) of the SSD 10. The statistical information X05 is added by one every time the erase error occurs in one block in the NAND memory 20 of the SSD 10. With a plurality of blocks collectively assumed as an erase unit, the statistical information X05 may be added by one every time the erase error occurs in one such erase unit. The more the statistical information X05 increases, it shows that the more the reliability degrades.

The total number of read logical sectors (statistical information X06) will now be described. The statistical information X06 is the total number of logical sectors of the data transmitted to the host device 100 as read data by the interface controller 30. The statistical information X06 is desirably reset to zero at the time of manufacturing (before test process) of the SSD 10. The more the statistical information X06 increases, it shows that the more the reliability degrades.

The total number of write logical sectors (statistical information X07) will now be described. The statistical information X07 is the total number of logical sectors of the data received from the host device 100 as write data by the RWIF controller 31. The statistical information X07 is desirably reset to zero at the time of manufacturing (before test process) of the SSD 10. The more the statistical information X07 increases, it shows that the more the reliability degrades.

The total number of uncorrectable ECC error count (statistical information X08) will now be described. The statistical information X08 is incremented by one for every one readout unit when the error bit cannot be restored by the ECC correction carried out by the ECC correction circuit 58. When the memory controller 50 reads out the data from the NAND memory 20, the memory controller 50 transmits the read data to the ECC correction circuit 58, and performs the ECC correction if there is data error and transmits the corrected data to the host through the interface controller 30. If the data error is not corrected by the ECC correction circuit 58, the memory controller counts up the statistical information X08 or increments the statistical information X08 with the amount of data error that cannot be corrected. The estimated value of the number of error bits that cannot be error corrected may be added, or the number of blocks that cannot be error corrected may be added. The statistical information X08 is desirably reset to zero at the time of manufacturing (before test process) of the SSD 10. The more the statistical information X08 increases, it shows that the more the reliability degrades.

The total number of n bits to m bits ECC correction units (statistical information X09) will be described. Here, n, m are natural numbers, where $0 \leq n \leq m \leq$ maximum correctable number of bits. When the ECC correction circuit 58 performs the ECC correction on the ECC correction unit (e.g., physical page), if all error bits are normally restored and the restored number of error bits is greater than or equal to n and smaller than or equal to m, "total number of n bits to m bits ECC correction units" is added by one for one ECC correction unit. In the case of a maximum of 64 bits can be corrected for one correction unit by the ECC correction, eight parameters such as "total number of 1 bits to 8 bits ECC correction units", "total number of 9 bits to 16 bits ECC correction units", "total number of 17 bits to 24 bits ECC correction units", "total number of 25 bits to 32 bits ECC correction units", "total number of 33 bits to 40 bits ECC correction units", "total number of 41 bits to 48 bits ECC correction units", "total number of 49 bits to 56 bits ECC correction units", "total number of 57 bits to 64 bits ECC correction units" may be prepared, where one of the eight parameters is incremented by one (or may be incremented with corrected amount of data error) for the ECC correction of one ECC correction unit when the ECC correction is normally carried out. The statistical information X09 is desirably reset to zero at the time of manufacturing (before test process) of the SSD 10. The more the statistical information X09 increases, it shows that the more the reliability degrades.

The number of times of R error occurrences of SATA communication (statistical information X10) will be described. The statistical information X10 is incremented by one every time the R error (Reception Error, R_ERR) in the SATA standard occurs once. If some kind of error such as CRC error exists in a frame transmitted and received between the host and the SSD, it is counted as an R error. One of the counters of the Phy Event Counters of the SATA standard may be adopted for the statistical information X10. The statistical information X10 is desirably reset to zero at the time of manufacturing (before test process) of the SSD 10. The more the statistical information X10 increases, it shows that the more the reliability degrades.

The number of times of error occurrences of SATA communication (statistical information X11) will be described. The statistical information X11 is incremented by one every time other abnormalities (other than R error) in the SATA communication occur once. For instance, if the communication standard actually negotiated between the SSD 10 and the host device 100 is a communication standard of lower speed than Generation 3 such as Generation 2 although the ATA interface 90, the interface controller 30, and the memory controller 50 are designed as SATA Generation 3, it is assumed as an error in the SATA communication, and the statistical information X11 is incremented by one. The statistical information X11 is desirably reset to zero at the time of manufacturing (before test process) of the SSD 10. The more the statistical information X11 increases, it shows that the more the reliability degrades.

The number of times of error occurrences of RAM 40 (statistical information X12) will be described. For instance, if the ECC circuit or the error detection circuit is mounted on the RAM 40, the statistical information X12 is incremented by one when the memory controller 50 receives from the RAM 40 a signal notifying that ECC correction cannot be made or a signal notifying the error detection. The statistical information X12 is desirably reset to zero at the time of manufacturing (before test process) of the SSD 10. The more the statistical information X12 increases, it shows that the more the reliability degrades.

The total number of used time of SSD 10 (statistical information X13) will be described. The memory controller 50 counts the clock or receives the time information from an internal clock circuit to increment the elapsed time while the power supply of the SSD 10 is turned ON. Alternatively, the memory controller 50 periodically may receive the time information of the host device 100 from the host device 100, and the difference in the time information may be incremented. The statistical information X13 is desirably reset to zero at the time of manufacturing (before test process) of the SSD 10. The more the statistical information X13 increases, it shows that the more the reliability degrades.

The time total in which temperature is higher than highest value of recommended operation temperature (statistical information X14) will be described. If a thermometer is mounted in the SSD 10 such as on the substrate of the SSD 10, in the memory controller 50, and the NAND memory 20, the memory controller 50 periodically receives the temperature information from the thermometer. If the received temperature is higher than the recommended operation temperature (e.g., 100° C.), the memory controller 50 increments the time total operating at higher than or equal to the recommended operation temperature based on the time information acquired from the clock, the internal clock, or the host device 100. The statistical information X14 is desirably reset to zero at the time of manufacturing (before test process) of the SSD 10. The more the statistical information X14 increases, it shows that the more the reliability degrades.

The time total in which temperature is lower than lowest value of recommended operation temperature (statistical information X15) will be described. If a thermometer is mounted in the SSD 10, the memory controller 50 periodically receives the temperature information from the thermometer. If the received temperature is lower than the recommended operation temperature (e.g., −40° C.), the memory controller 50 increments the time total operating at higher than or equal to the recommended operation temperature based on the time information acquired from the clock, the internal clock, or the host device 100. The statistical information X15 is desirably reset to zero at the time of manufacturing (before test process) of the SSD 10. The more the statistical information X15 increases, it shows that the more the reliability degrades.

The maximum value of response time of command (statistical information X16) will be described. The statistical information X16 is a maximum value of a time (or number of clocks) required from when receiving the command from the host device 100 until responding to the host device 100 (or until the command execution is completed). If the response time greater than X16 occurs, X16 is overwritten by such response time. The statistical information X16 may be held with respect to each command. The statistical information X16 is desirably reset to zero at the time of manufacturing (before test process) of the SSD 10 or at the time of the SSD 10 shipment. The more the statistical information X16 increases, it shows that the more the reliability degrades. For instance, the response time of the command may be, readout response time of SSD 10: time from when the SSD 10 receives the readout request from the host 100 until completing the transmission of the read data to the host 100.

write response time of SSD 10: time from when the SSD 10 receives the write request from the host 100 until returning a write complete notification to the host 100. Alternatively, a time from when the SSD 10 receives the write request from the host 100 until completing the reception of the write data by the host 100.

The response time may be timed by counting the internal clock of the memory controller 50.

The average value of response time of command (statistical information X17) will be described. The statistical information X17 is an average value of a time (or number of clocks) required from when receiving the command from the host device 100 until responding to the host device 100 (or until the command execution is completed). A constant number of response time lists may be held in the RAM 40, and it may be obtained by calculating the average value of the response time list. The statistical information X17 may be held with respect to each command. The statistical information X17 is desirably reset to zero at the time of manufacturing (before test process) of the SSD 10 or at the time of the SSD 10 shipment. The more the statistical information X17 increases, it shows that the more the reliability degrades.

The maximum value of response time of NAND memory (statistical information X18) will be described. The statistical information X18 is a maximum value of the time (or number of clocks) required until the memory controller 50 obtains the response (or receives command execution complete notification) after issuing a command to the NAND memory 20. If the response time greater than the X18 occurs, X18 is overwritten by such response time. The statistical information X18 may be held with respect to each command. The statistical information X18 is desirably reset to zero at the time of manufacturing (before test process) of the SSD 10 or at the time of the SSD 10 shipment. The more the statistical information X18 increases, it shows that the more the reliability degrades. For instance, the response time of the NAND memory may be, readout response time of NAND memory 20: time from when the memory controller 50 issues the read request to the NAND memory 20 until the data readout from the NAND memory 20 is completed.

write response time of NAND memory 20: time from when the memory controller 50 issues the write request to the NAND memory 20 until the data write to the NAND memory 20 is completed.

erase response time of NAND memory 20: time from when the memory controller 50 issues the erase command to the NAND memory 20 until the erase of the NAND memory 20 is completed.

The response time may be timed by counting the internal clock of the memory controller 50.

The average value of response time of NAND memory (statistical information X19) will be described. The statistical information X19 is an average value of a time (or number of clocks) required until the memory controller 50 obtains the response (or receives command execution complete notification) after issuing a command to the NAND memory 20. A constant number of response time lists may be held in the RAM 40, and it may be obtained by calculating the average value of the response time list. The statistical information X19 may be held with respect to each command. The statistical information X19 is desirably reset to zero at the time of manufacturing (before test process) of the SSD 10 or at the time of the SSD 10 shipment. The more the statistical information X19 increases, it shows that the more the reliability degrades.

The current temperature (statistical information X20) will be described. If a thermometer is mounted in the SSD 10, the memory controller 50 periodically receives the temperature information from the thermometer. The memory controller 50 holds the temperature received last from the thermometer in the statistical information X20 as a current temperature. Determination is made that the reliability of the SSD 10 is adversely affected if such value is extremely high (e.g., higher than or equal to 85° C.), and the reliability of the SSD 10 is adversely affected if the temperature is extremely low (e.g., lower than or equal to −10° C.)

The highest temperature (statistical information X21) will be described. The memory controller 50 holds a maximum value of the current temperature X20 in the statistical information X21 as a highest temperature. Determination is made that the reliability of the SSD 10 is adversely affected if such value is extremely high (e.g., higher than or equal to 85° C.). When receiving the current temperature higher than X21 from the thermometer, the memory controller 50 rewrites the X21 to the current temperature. The X21 is desirably reset to a temperature (e.g., −40° C.) sufficiently small compared to the operation temperature of the SSD 10 at the time of manufacturing (before test process) of the SSD 10 or at the time of the SSD 10 shipment. The more the statistical information X21 increases, it shows that the more the reliability degrades.

The lowest temperature (statistical information X22) will be described. The memory controller 50 holds a minimum value of the current temperature X20 in the statistical information X22 as a lowest temperature. Determination is made that the reliability of the SSD 10 is adversely affected if such value is extremely small (e.g., higher than or equal to −40° C.). When receiving the current temperature lower than X22 from the thermometer, the memory controller 50 rewrites the X22 to the current temperature. The X22 is desirably reset to a temperature (e.g., 120° C.) sufficiently large compared to the operation temperature of the SSD 10 at the time of manufacturing (before test process) of the SSD 10 or at the time of the SSD 10 shipment. The more the statistical information X22 decreases, it shows that the more the reliability degrades.

The increase rate of statistical information (statistical information X23) will be described. The non-recent information of the statistical information X01 to X19 (e.g., values constant time before or when the power of the SSD 10 is turned ON, values of when the power of the SSD 10 is down the previous time, etc.) are separately held. The statistical information X23 is defined as one of the followings.

Increase rate of statistical information=(most recent statistical information)−(old information)

Increase rate of statistical information=((most recent statistical information)−(old information))/ (elapsed time from when acquiring the old information)

Increase rate of statistical information=((most recent statistical information)−(old information))/(number of NAND accesses from when acquiring the old information)

It is desirably reset to zero at the time of manufacturing (before test process) of the SSD 10. The more the statistical information X23 increases, it shows that the more the reliability degrades.

The NAND GC failure flag (statistical information X24) will be described. If the statistical information X24 is 1, the sufficient number of free blocks for the operation cannot be ensured by the NAND garbage collection (NAND GC). It is desirably reset to zero at the time of manufacturing (before test process) of the SSD 10. The more the statistical information X24 increases, it shows that the more the reliability degrades.

For the statistical information 26, all the parameters described above may be stored, or some or only one of the parameters may be stored. The statistical information 26 desirably holds the most recent information on the RAM 40, and periodically takes a backup in the NAND memory 20. It may be saved only in either one of the RAM 40 or the NAND memory 20, or the relevant statistical information may be transmitted to the host device 100, and saved in the host device 100 or the storage device connected to the host device 100.

The write operation in the SSD 10 will now be described using FIG. 14. When the SSD 10 receives the write request from the host 100 (step S100), the memory controller 50 searches the free block table 21 of the RAM 40 (step S101), and acquires the current number of free blocks. The memory controller 50 performs the "NAND garbage collection" ("NAND GC"), to be described later, (step S120) if the number of free blocks is less than a predetermined threshold value (step S102), and newly obtains the free block from the free block table 21 and acquires the physical ID of the obtained free block if the number of free blocks is greater than the predetermine threshold value (step S102).

The memory controller 50 then performs the write operation to the acquired free block (step S103), adds the LBA, the physical block ID, and the number of times of erasing of the relevant physical block received from the host 100 in the active block table 23, and also adds the LBA, the physical block ID, and the physical page ID to the active page table 24 (step S104), and removes the physical block subjected to the write from the free block table 21 (step S105). The memory controller 50 reflects the content of the above write process in the statistical information 26.

Figure 15:
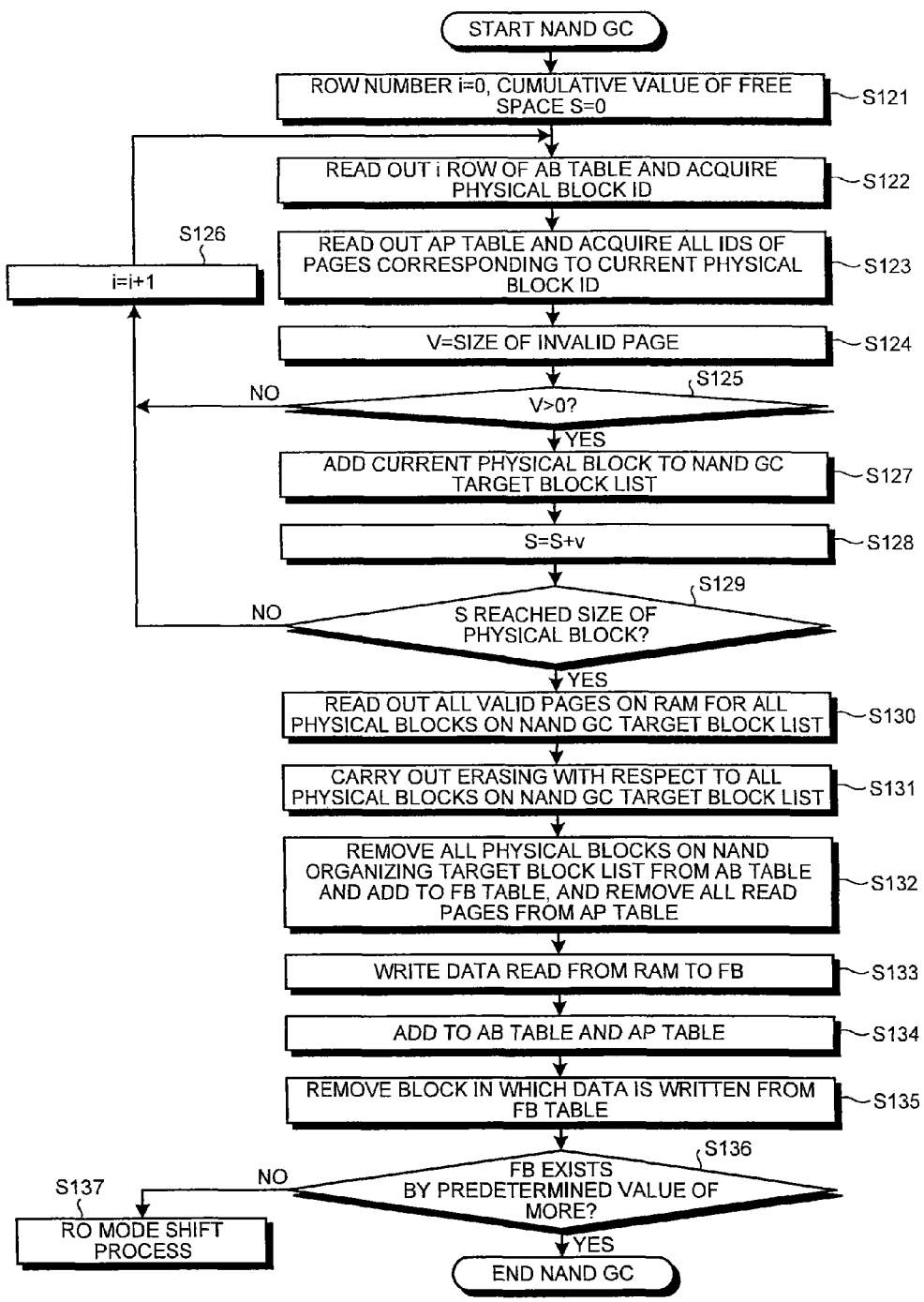
FIG. 15 is a flowchart illustrating the operation example of garbage collection of the NAND memory of the SSD.

The operation example of the NAND GC (FIG. 14: step S120) in the SSD 10 will now be described using FIG. 15. The page (valid page) registered in the active page table 24 of all the pages contained in the physical block is corresponded to the LBA. Not all the pages contained in the physical block may be valid pages, and the page not corresponding to the valid page (invalid page) is not corresponded to the LBA. The valid page is the page storing the most recent data, and the invalid page is the page where the data of the same LBA is written in another place and thus is no longer referenced. The physical block has availability in data by the amount of invalid pages, and hence the free block can be ensured by executing the NAND GC of collecting the data of the valid pages and rewriting to different blocks.

First, assume the row number i=0, and the cumulative number of free spaces S=0 (step S121). The memory controller 50 reads out the head row (i=0) of the active block table 23, and acquires the physical block ID (current physical block ID) of the head row (step S122). The active page table 24 is then read out, and all the IDs of the valid pages corresponding to the current physical block ID in the active page table 24 are acquired (step S123). The memory controller 50 subtracts the size for the number of acquired valid page IDs from the size of the physical block to obtain the size v of the invalid page of the current physical blocks (step S124), where the current physical block is added to the NAND GC target block list (step S127) if v>0 (step S125). Furthermore, the memory controller 50 adds the size v of the invalid page of the current physical block to the cumulative number of free spaces S and updates the cumulative number of free spaces S (step S128).

If v=0 in step S125, or if the cumulative number of free spaces S has not reached the physical block size in step S125, the memory controller 50 increments the column number i to 1 (step S126), reads out the next row (i=1) of the active block table 23, and acquires the physical block ID (current physical block ID) of the next row (step S122). Thereafter, the procedures of steps S123 to S128 are similarly executed. The procedures of steps S122 to S129 are similarly repeated until the cumulative number of free spaces S reaches the physical block size in step S129.

If the total amount of size S of the invalid pages acquired up to now becomes greater than the size of the physical block in step S129, the memory controller 50 reads out the data of all the valid pages on the NAND GC target block list from the NAND memory 20 and writes the same in the RAM 40 (step S130), and also performs the erase process on all the physical blocks on the NAND GC target block list (step S131), removes all the physical blocks subjected to the erase process from the active block table 23 and adds the same to the free block table 21 (in this case, number of times of erasing is incremented), and removes all the pages that are read out from the active page table 24 (step S132). The memory controller 50 then acquires the new free block from the free block table 21, writes the data written to the RAM 40 into the acquired free block (step S133), adds the physical block ID of the free block in which the data is written, the corresponding LBA and the number of times of erasing of the relevant block to the active block table 23, adds the page ID in which the data is written and the corresponding LBA to the active page table 24 (step S134), and removes the block ID of the block in which the data is written from the free block table 21 (step S135). The memory controller 50 reflects the processing content of the NAND GC on the statistical information 26. The erase process of step S131 does always not have to be carried out in the NAND GC of the step S120, and may be carried out immediately before the write operation of step S103 and increment the number of times of erasing.

A sufficient number of free blocks can be usually ensured with respect to the write by such NAND GC. If a sufficient number of free blocks cannot be ensured with respect to the write even by the NAND GC (step S136), the "RO mode shift process", to be described later, is carried out (step S137).

The NAND GC is not limited to being executed when receiving the write request from the host 100, and may be executed when a predetermined time has elapsed from when receiving the command the last from the host or when receiving a command for shifting to the standby or idle state from the host 100.

Figure 16:
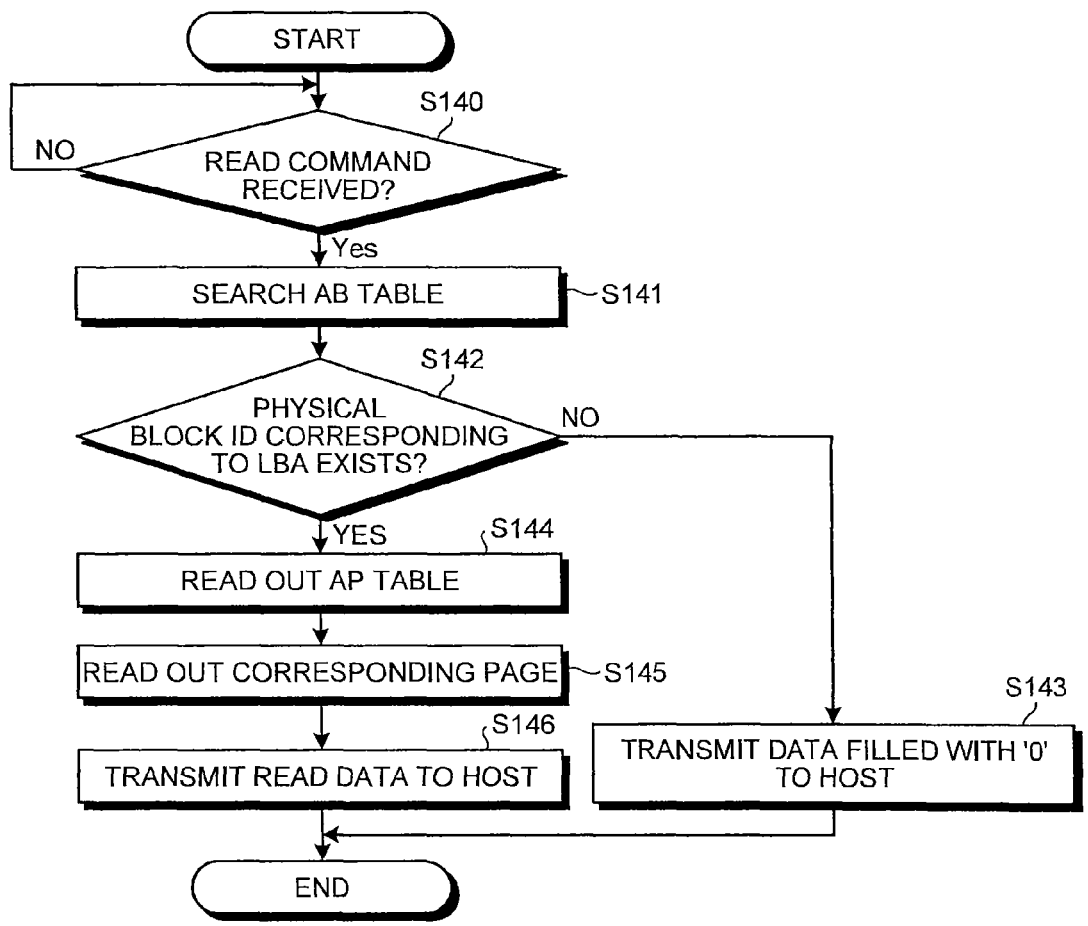
FIG. 16 is a flowchart illustrating the read operation example of the SSD.

The readout process in the SSD 10 will now be described using FIG. 16. When the SSD 10 receives the read request from the host 100 (step S140), the memory controller 50 searches the active block table 23 (step S141), and investigates whether or not the physical block ID corresponding to the LBA received from the host 100 exists in the active block table 23 (step S142). If the physical block ID exists in the active block table 23, the memory controller 50 acquires the physical page ID contained in the physical block ID of the active page table 24 (step S144), reads out the data from the physical page corresponding to the acquired physical page ID (step S145), and transmits the read data to the host 100 through the RAM 40 (step S146). The memory controller 50 reflects the content of the above readout process on the statistical information 26.

If the physical block ID corresponding to the LEA received from the host 100 does not exist on the active block table 23 in step S142, the memory controller 50 may transmit the data in which all the bits are '0' to the host 100 by the data length corresponding to the request from the host 100 without performing the readout operation from the NAND memory 20 (step S143).

Figure 17:
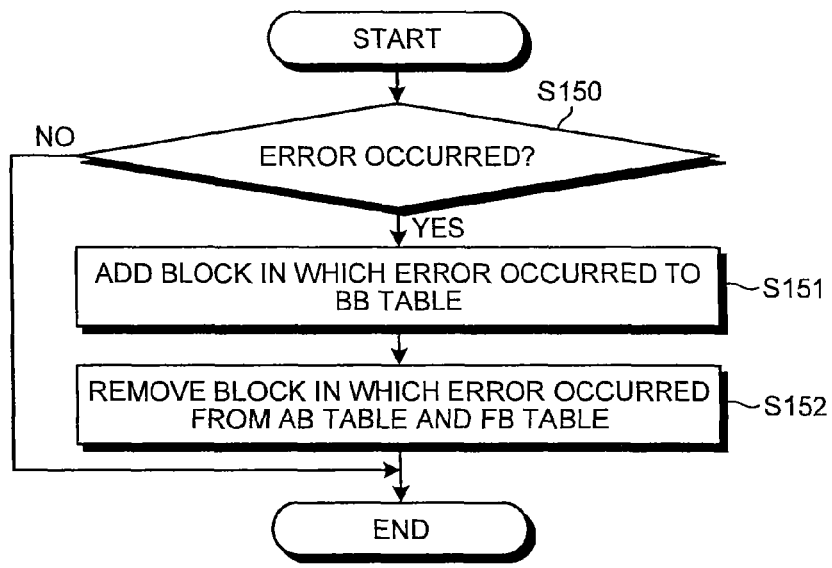
FIG. 17 is a flowchart illustrating the operation example at the time of error occurrence of the SSD.

The error process in the SSD 10 will now be described using FIG. 17. The processes with respect to the write request and the read request from the host 100 are usually carried out in the above manner, but a write error may occur in the write operation (program operation) to the NAND memory 20, an erase error may occur in the erase operation with respect to the NAND memory 20, an uncorrectable ECC (Error Correcting Code) error (failure in error correcting process) may occur in the readout operation with respect to the NAND memory 20, and the like, in which case an exceptional process therefor becomes necessary.

The memory controller 50 adds the physical block in which the error occurred to the bad block table 22 (Step S151) when one of the above error occurred (step S150), and removes the physical block in which the error occurred from the active block table 23 and the free block table 21 (step S152), so that the physical block in which the error occurred is not accessed thereafter. In this case, the data of the physical block in which the error occurred may be copied to a different physical block. The memory controller 50 reflects the content of the error process on the statistical information 26. One example of such error process has been introduced in the description of the readout process, the write process, and the NAND GC process, but the error process is not limited to such examples, and it should be recognized that it can be applied with respect to all the readout process, the write process, the erase process, and other kind of operations on the NAND memory 20.

The reliability of each block of the NAND memory 20 degrades, the number of bad blocks increases, and the sum of the number of free blocks and the number of active blocks decreases through the use of the SSD 10. Furthermore, if the SSD 10 is used, the number of free blocks sufficient to perform the write process cannot be ensured even if the NAND GC is performed, which is the lifespan of the SSD 10. In such a case, determination is made that the RO mode shift condition is met and the RO mode shift process is carried out.

The RO mode shift process in the SSD 10 will now be described using FIG. 18. While the SSD 10 is operating, the memory controller 50 determines whether or not the RO mode shift condition is met by monitoring the statistical information 26 (step S160). RMAX serving as criteria of the RO mode shift may be RMAX=upper limit value of a value of statistical information that guarantees reliability.

Figure 19:
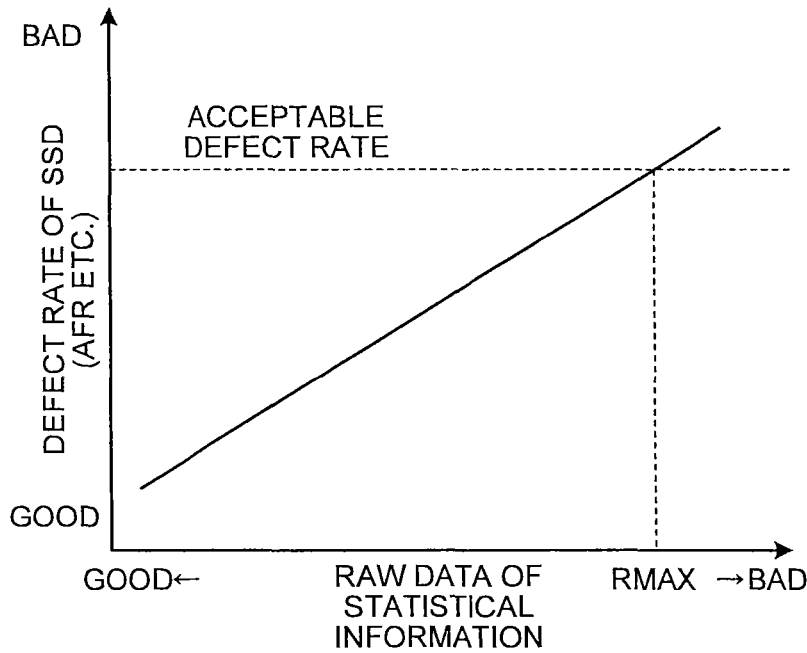
FIG. 19 is a graph illustrating the relationship of the raw data of the statistical information and the defect rate of the SSD.

The RMAX may adopt different values for each statistical information X01 to X19, X23, X24. As illustrated in FIG. 19, the RMAX derives the relationship of the raw value (raw data) of the statistical information and the defect rate of the SSD 10 at the development stage, and desirably adopts the raw data of the statistical information of when the defect rate exceeds an acceptable value (e.g., 100 ppm) for the RMAX. For the defect rate, other defect rates such as the defect rate of the data written to the SSD 10, the defect rate of the NAND memory 20, or the defect rate of the memory cell of the NAND memory 20 may be adopted instead of the defect rate of the SSD 10. For instance, at the development stage of the SSD 10, a wear test of verifying whether the written data is correctly stored continuously for a constant time or longer is carried out while repeating the write operation at high temperature with respect to a great number (e.g., 100) of test SSD 10 groups, and at the same time, the statistical information is continued to be monitored and the raw data of the statistical information at the time point the defect rate reaches a constant percentage may be adopted for the RMAX. For instance, if the data (e.g., random data) is written with the high temperature state (e.g., 75° C.) as an initial condition with respect to the entire region of the LBA of the worn SSD 10, left untouched for a certain time or longer in the high temperature state (e.g., 85° C.), and thereafter, the temperature of the SSD 10 is lowered (e.g., 25° C.) and the readout operation is carried out on the entire region of the LBA of the SSD 10 and the read data is not ECC correctable (or if there is a constant number of more data that is not ECC correctable, or if the read data and the data written in the initial condition do not match or cannot be read out), this is defined as the defect of the SSD 10, and a value obtained by dividing the number of defected SSD 10 by the number of SSD 10 performed with the test is adopted for the defect rate. The raw data of the statistical information in which such defect rate is statistically and significantly lower than the acceptable defect rate may be adopted for the RMAX. A margin of a certain extent may be given to the RMAX, and RMAX' obtained by $$RMAX'=RMAX-\text{margin}$$

may be adopted for the RMAX.

The RMAX may be obtained by the design simulation at the time of the development. For instance, the value of the statistical information in which the defect rate such as the defect rate of the SSD 10 becomes greater than or equal to a constant value may be obtained by the design simulation, and such value may be adopted for the RMAX.

Figure 20:
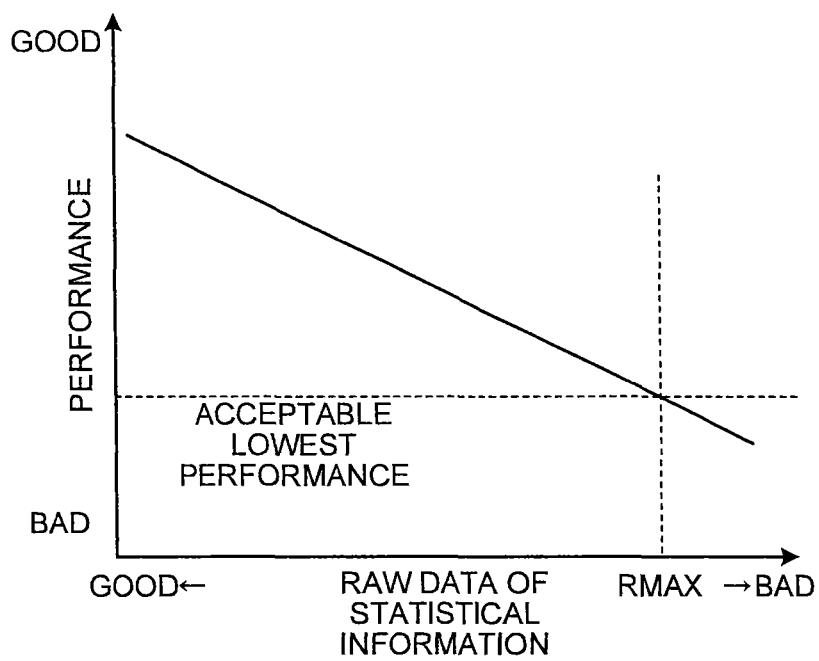
FIG. 20 is a graph illustrating the relationship of the raw data of the statistical information and the performance of the SSD.

As illustrated in FIG. 20, for the RMAX, the value of the statistical information in which the performance (readout performance, write performance, etc.) of the SSD 10 becomes smaller than or equal to a predetermined value may be specified by measurement or simulation of the SSD 10, and this may be adopted for the RMAX. For instance, since the probability the data read from the memory cell of the NAND memory is wrong increases as the reliability of the NAND memory degrades, the time required for the ECC correction at the time of the data readout increases, and there is a possibility of a strong correlation between the reliability of the SSD 10 and the readout performance of the SSD 10. For instance, the following performance measurement is carried out for the measurement of a sequential readout performance.

1. F4h SECURITY ERASE UNIT (Normal Erase) of ACS-2 is carried out with respect to the SSD 10.

2. Data (e.g., random data) is sequentially written onto the entire region of the LBA of the SSD 10.

3. The readout is sequentially carried out on all the LBA, and the average value of the read amount of data (unit MiB/s) is obtained per unit time (readout speed). The measurement may be carried out according to the standard described in non-patent document (SNIA, Solid State Storage Performance Test Specification Version 0.9 http://www.snia.org/) for the measurement of the performance information (e.g., performance speed).

As illustrated in FIG. 20, the statistical information dependency of the performance information is obtained, for instance, when the sequential readout speed expected value at the time of shipment of the SSD 10 is 400 MiB/s and the lowest performance that can be allowed by the standard of the publicized specification is 300 MiB, the value of the statistical information in which the readout speed expected value becomes 300 MiB is obtained and is adopted for the RMAX.

Thus, the RMAX can be arbitrarily defined by the developer, and can also be defined by methods and references other than the above.

The memory controller 50 compares the RMAX and the value of the statistical information (one of X01 to X19, X23, X24), and determines that the SSD 10 reached the end of the lifespan and the mode is to be shifted to the RO mode (step S160: Yes) when value of statistical information>RMAX or value of statistical information≥RMAX. For instance, in the case of the NAND GC failure flag (statistical information X24), determination is made that the SSD 10 reached the end of the lifespan and the mode is to be shifted to the ROM mode when it is 1. In the case of the total number of bad blocks (statistical information X01), determination is made that the SSD 10 reached the end of the lifespan and the mode is to be shifted to the ROM mode when it becomes greater than a predetermined value.

The memory controller 50 compares each a plurality of the values of the statistical information (one of X01 to X19, X23, X24) with the RMAX and determines to shift to the ROM mode when one of them is greater than or equal to RMAX.

The memory controller 50 determines whether or not the SSD 10 reached the end of the lifespan (whether or not SSD 10 is in abnormal state) in the above manner, and performs the RO mode shift process, to be described later, (step S160: Yes) when determined that the SSD 10 reached the end of the lifespan (when determined that SSD 10 is in abnormal state).

When adopting the current temperature X20 and the highest temperature X21 for the statistical information such as adopting RMAX=85° C. for the RMAX, determination is made that the SSD 10 is in an abnormal state and to be shift to the RO mode at the temperature outside the guarantee of the operation such as value of statistical information>RMAX or value of statistical information≥RMAX (step S160: Yes), and thereafter, determination is desirably made to shift from the RO mode to the normal mode since the SSD 10 returned to the normal state when returned to the normal temperature with value of statistical information≤RMAX−MAX margin or value of statistical information<RMAX−MAX margin (step S160: No). The MAX margin is a value greater than or equal to zero, but MAX margin is desirably a value greater than zero to prevent the switching of the RO mode and the normal mode from frequently occurring (e.g., MAX margin=5° C.).

The statistical information may take various modes other than the statistical information X01 to X19, X23, X24 introduced in the present embodiment, but the present invention is also applicable thereto. A positive correlation exists in a relationship of the X01 to X19, X23, and X24 and the defect rate, but the present invention is also applicable to the statistical information in which a negative correlation exists with the defect rate (e.g., lowest temperature experienced by the SSD 10 after shipment, etc.). In this case, the lower limit value RMIN that can guarantee reliability is adopted in place of the RMAX, where determination is made that the SSD 10 reached the end of the lifespan when the statistical information becomes smaller than RMIN and shift is made to the RO mode.

In particular, when adopting the current temperature X20 and the lowest temperature X22 for the statistical information such as adopting RMIN=−10° C. for the RMIN, determination is made that the SSD 10 is in an abnormal state and to be shifted to the RO mode at the temperature outside the guarantee of the operation such as value of statistical information<RMIN or value of statistical information≤RMIN (step S160: Yes), and thereafter, determination is desirably made to shift from the RO mode to the normal mode since the SSD 10 returned to the normal state when returned to the normal temperature with value of statistical information≥RMIN+MIN margin or value of statistical information>RMIN+MAX margin (step S160: No). The MIN margin is a value greater than or equal to zero, but MIN margin is desirably a value greater than zero to prevent the switching of the RO mode and the normal mode from frequently occurring (e.g., MIN margin=5° C.).

The RO mode shift process is desirably carried out even if the SSD 10 has not reached the end of the lifespan when the statistical information becomes greater than the predefined RMAX or shows an abnormal value that is not possible in the normal operation.

When the RO mode shift condition is met (step S160: Yes), the following RO mode shift process is started. First, the memory controller 50 desirably cancels all the write processes on the NAND memory 20 currently being performed (step S161), returns an error with respect to all the write requests received from the host 100, and deletes all the queues of the write request received from the host 100 (step S162). The memory controller 50 then writes 1 to the RO mode flag 25 in the management information of the NAND memory 20 (step S163). In this case, all the tables other than the RO mode flag 25 of the management information of the RAM 40 may be reflected on the management information of the NAND memory. The SSD 10 thereafter returns an error to all the write requests received from the host 100 until the power is cut off or reset (steps S164, S165).

The startup process of the SSD 10 will now be described using FIG. 21. When the SSD 10 is started, the IPL 55 reads out the RO mode flag 25 in the management information of the NAND memory 20 (step S170), and discriminates the RO mode flag 25 (step S171). If the RO mode flag 25 is 0 (step S171), the IPL 55 validates the RWIF controller 31 of the interface controller 30 (step S172) to be in the normal mode, and then reads out the management information of the NAND memory 20 to the RAM 40 (step S173).

If the RO mode flag 25 is 1, the IPL 55 validates the ROIF controller 32 to be in the RO mode (step S174), and then reads out the management information of the NAND memory 20 on the RAM 40 (step S175). In the RO mode, the SSD 10 acts as a read only device that does not support the write. After the shift to the RO mode, the SSD 10 merely needs to carry out only the read operation of the read operation and the write operation, and hence the information of the management table may be rearranged such that the speed of the readout operation becomes faster.

The operation on the host 100 side will now be described. First, the operation at the time of startup of the host 100 will be described using FIG. 22. When the host 100 is started, the host 100 starts the SSD control tool 110 (step S201). If the OS 150 is Windows (registered trademark), the SSD control tool 110 is desirably startup registered or service program registered so that the SSD control tool 110 is set as a resident program at the time of the startup, and the SSD control tool 110 can be automatically started. The system disc used in the startup of the host 100 may be the SSD 10, the SSD or a hard disc drive (HDD) prepared separate from the SSD 10 in which the system is installed in advance, or the DVD-ROM, the CD-ROM, or the USB memory in which the boot program is installed.

When the SSD control tool 110 is started, the SSD control tool transmits a transmission request of the device information to the SSD 100 to acquire the device information of the SSD 10. As described above, if the RWIF controller 31 is valid in the SSD 10, the SSD control tool 110 recognizes the that SSD 10 is the ATA device through the LBA(7:0) and LBA(15:8) in the Device Signature described in ACS-2, and the RWIF controller 31 transmits identification information that it is a readable and writable device to the host 100 when receiving a transmission request of the device identification information such as the ECh IDENTIFY DEVICE or the like described in ACS-2 from the host 100. If the ROIF controller 32 is valid in the SSD 10, the SSD control tool 110 recognizes that the SSD 10 is the ATAPI device through the LBA(7:0) and LBA(15:8) in the Device Signature described in ACS-2, and the ROIF controller 32 transmits device identification information that it does not support write when receiving a transmission request of the device identification information such as the 46h GET CONFIGURATION or the like described in MMC-6 from the host 100. Therefore, the SSD control tool 110 acquires the device identification information from the SSD 10 in such manner (step S202). The method of notifying whether or not the SSD 10 is a read only device may take various forms other than the above.

If the information returned from the SSD 10 is the write non-supporting device (step S203), the SSD control tool 110 switches and sets the selection switches 123, 124 to invalidate the RWIF driver 121 (step S206) and validate the ROIF driver 122 (step S207) to operate the SSD 10 in the RO mode. If the information returned from the SSD 10 is not the write non-supporting device (step S203), the SSD control tool 110 switches and sets the selection switches 123, 124 to invalidate the ROIF driver 122 (step S204) and validate the RWIF driver 121 (step S205) to operate the SSD 10 in the normal mode.

The operation of the SSD control tool 110 while the host 100 is operating will now be illustrated using FIG. 23. In order to rapidly detect that the SSD 10 shifted to the RO mode, the SSD control tool 110 desirably continues to monitor the response from the SSD 10 with respect to the write request from the host 100 if the SSD 10 is in the normal mode (step S210). If the SSD 10 is in the RO mode, the write request is not transmitted to the SSD 10, and hence the SSD control tool 110 may not monitor the response of the SSD 10.

Figure 18:
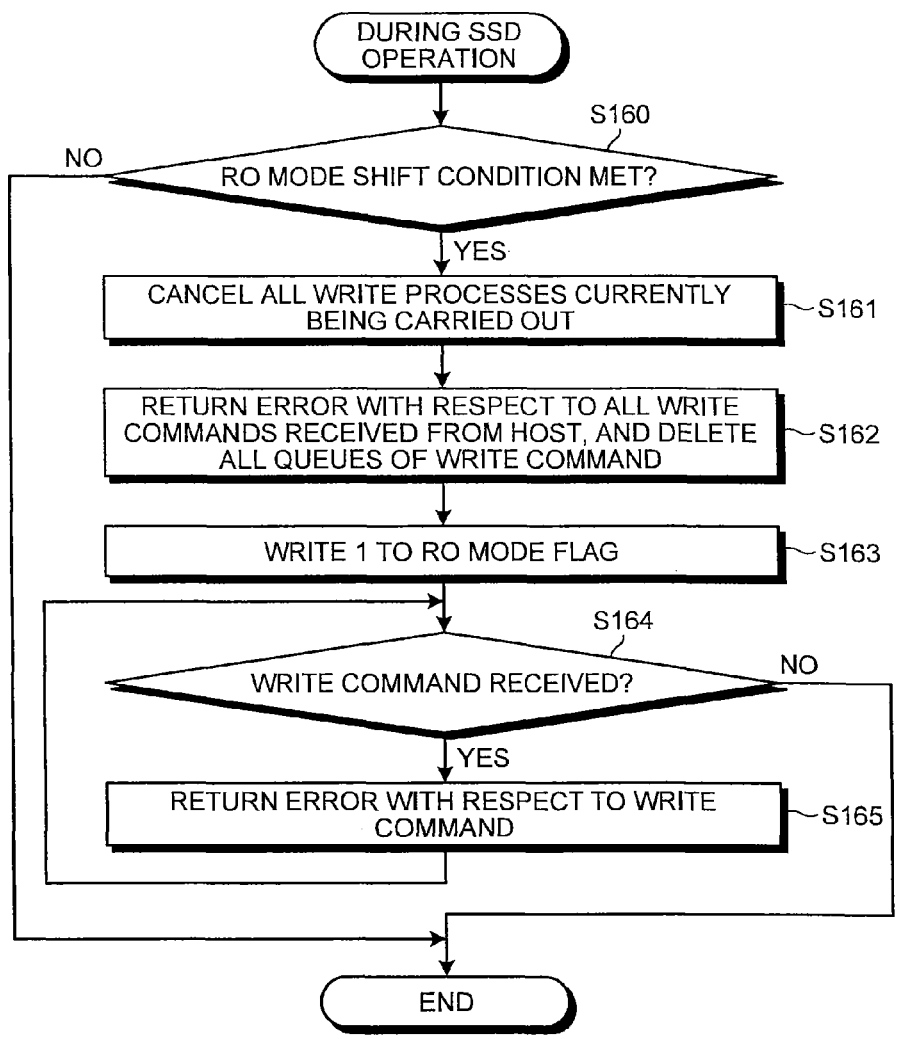
FIG. 18 is a flowchart illustrating the operation example of when the read only mode shift condition is met in the SSD.

If an error is returned with respect to the write request transmitted to the SSD 10 in the normal mode (may be error of one time or may be an error of plural times), the SSD control tool 110 determines as a state in which the SSD 10 started the RO mode shift process illustrated in FIG. 18 and returned an error with respect to all the write requests, and invalidates the RWIF driver 121 (step S211). The SSD control tool 110 desirably re-start the SSD 10 by sending a reset command to the SSD 10 and the like (step S212) using the COMPRESET of the SATA standard, the command unique to the vendor of SCT Command Transport described in ACS-2, and the other command unique to the vendor, from the standpoint of rapidly recognizing the SSD 10 as the write only device. Such re-start process of the re-start of the computer system 1 by the user is carried out by OFF/ON of power supply of the SSD 10, and the SSD 10 shifts to the RO mode by performing the process illustrated in FIG. 21. The SSD control tool 110 validates the ROIF driver 122 (step S213).

Therefore, the host 100 can reliably perform the readout process with respect to the SSD 10 without mistakenly recognizing the SSD 10 as the non-available external storage device while the SSD 10 is immediately after the start of the RO mode shift process and the during the RO mode.

FIG. 24 illustrates the example of the drive display of when the Windows (registered trademark) is used for the OS in the host 100, and assumes that the SSD is connected for the drive D. If the SSD is in a normal readable and writable state, the type of drive D is displayed as "local disc", as illustrated in FIG. 24(*a*). However, after the SSD control tool 110 recognizes that the drive D is the write non-supporting device by the processes of FIG. 22 and FIG. 23, the type of the drive D is displayed as "CD-ROM", "DVD-ROM", or "ROM drive", as illustrated in FIG. 24(*b*).

In the above description, the statistical information X01 to X19, X23, X24 are adopted for the statistical information used in the RO mode shift condition in FIG. 18 in the SSD 10, but other statistical information may be used to determine whether the RO mode shift condition is met.

For instance, if a management unit called a cluster described in U.S. Patent Application Publication No. 2009 0222617 is introduced in the SSD 10, the number of bad clusters may be adopted for the RO mode shift condition. The cluster size is a natural number multiples of two or greater of the sector size, and the cluster address is configured by a higher bit sequence from a predetermined bit of the LBA. In the SSD 10, a bad cluster table for managing the cluster address (cluster ID) of the bad cluster is held as the management information. When the ECC correction error occurs in the ECC process by the ECC correction circuit 58 when readout is carried out from the NAND memory 20, the memory controller 50 may register the cluster in which the ECC correction error occurred in the bad cluster table. The number of bad clusters can be acquired based on the registered content of the bad cluster table. Therefore, if the SSD 10 is operating in the normal mode, the memory controller 50 acquires the current number of bad clusters based on the number of entries of the bad cluster table in the management information stored in the RAM 40, compares the acquired number of bad clusters with a threshold value, and determines that the RO mode shift condition is met when the number of bad clusters is greater than or equal to the threshold value.

In the flowcharts of FIG. 18 and FIG. 21, whether the read only mode shift condition is met is determined at the startup of the SSD by interposing the RO mode flag 25 in the SSD 10, but whether or not to shift to the read only mode may be determined by directly determining whether or not at least one of various types of management information used in the RO mode shift condition meets the RO mode shift condition at the time of startup instead of using the RO mode flag 25.

A variant of the process of the SSD control tool 110 mounted on the host 100 will now be described. For instance, the operation procedure illustrated in FIG. 25 may be adopted in place of the operation procedure illustrated in FIG. 23. In FIG. 25, when the SSD 10 is operating in the normal mode, the SSD control tool 110 issues a command for periodically acquiring the statistical information of the SSD 10 to the SSD 10 (step S220). This command may be SMART READ DATA(B0h(D0h)) or a command of S.M.A.R.T (Self-Monitoring Analysis and Reporting Technology), which is a self-diagnostic function of the memory, SCT Command Transport described in ACS-2, or a command unique to the vendor. In the SSD 10 that received the information of the S.M.A.R.T, the memory controller 50 acquires one of, one part of, or all of the statistical information X01 to X19, X23, X24 and returns the acquired statistical information to the host 100. The SSD control tool 110 acquires the statistical information by receiving the statistical information returned from the SSD 10 (step S221).

FIG. 26 illustrates a management table regarding the statistical information X01 to X19, X23, X24. For instance, as illustrated in FIG. 26, when using B0h/D0h SMART READ DATA, an attribute ID is assigned with respect to each of the constituent elements (X01 to X19, X23, X24, etc.) of the statistical information but the attribute ID may, of course, be assigned only to some of the constituent elements. With regards to the constituent element of the statistical information 26, SMAB is adopted as a best value after standardization, and SMAL defined such as: SMAL=SMAB*AMALR (0≤AMALR<1) (SMAL is an integer, and is converted to an integer from a decimal by either rounding, rounding up after the decimal point or rounding up after the decimal point) is adopted for the reliability guaranteeing lower limit value after standardization. Attribute value is defined as:

attribute value=$SMAL+SMAB\times(1-AMALR)\times(RMAX-\text{raw data})/RMAX$ attribute Threshold=30 (fixed value)
(raw data)=raw data of statistical information
so that the memory controller 50 calculates the attribute value ("Value" in FIG. 26) of the S.M.A.R.T information and transmits the same to the SSD control tool 110. The attribute Threshold is "Threshold" in FIG. 26, and the raw data is "Raw Data" in FIG. 26.

The best value SMAB after the standardization merely needs to be an arbitrary natural number, and SMAB=100 may be adopted. The AMALR merely needs to be an arbitrary number that meets 0≤AMALR<1, and AMALR=0.3 may be adopted. Furthermore, the AMALR and the SMAB can adopt different values with respect to each X01 to X19, X23, X24. If SMAB=100 and AMALR=0.3, the best value of the attribute value is 100 (e.g., 100 immediately after shipment) with respect to the statistical information to be adopted and gradually decreases as the reliability degrades, where the attribute value 30 reaches a value smaller than or equal to 30 when the SSD can no longer guarantee reliability (when raw data of statistical information becomes greater than or equal to RMAX). B0h/DAh SMART RETURN STATUS, which is a command described in ACS-2, is used as a means for detecting whether or not the attribute value exceeds the Threshold, and whether or not the Attribute Value exceeds the Threshold value may be determined from the Output of the relevant command.

"Worst" of FIG. 26 may be adopted as the specification for the SSD control tool 110 to diagnose the lifespan of the SSD 10. "Worst" is calculated by the memory controller 50 as a worst value of the attribute value. In the case of X01 to X19, X23, X24, Worst is a minimum value of the attribute value after the shipment (or after manufacturing) of the SSD 10. Alternatively, with respect to the Worst, a minimum value of the attribute value within a constant time range in the past may be adopted as the Worst Value, or a minimum value from the past until the present may be adopted as the worst value going back to the past in which the communication or process is carried out for a certain number of times (certain amount of data).

"Raw Data" (Raw Value) in FIG. 26 may be adopted as a specification for the SSD control tool 110 to diagnose the lifespan of the SSD 10. The raw data of the statistical information (e.g., X01 to X19, X23, X24) is transmitted from the SSD 10 to the SSD control tool 110 as Raw Data. In this case, the SSD control tool 110 may already hold the RMAX or the SSD control tool 110 may acquire the RMAX by separately reading out from the SSD 10 or reading from another storage device, compare the RMAX and the Raw Data, and determine that the SSD 10 reached the end of the lifespan when Raw Data>RMAX or Raw Data≥RMAX. For instance, in the case of the NAND GC failure flag, determination is made that the SSD 10 reached the end of the lifespan when it is 1. In the case of the total number of bad blocks, determination is made that the SSD 10 reached the lifespan when it becomes greater than a predetermined value. With respect to the Raw Data, the raw data of the statistical information does not necessarily need to be output, and the memory controller 50 may transmit to the SSD control tool 110 a value obtained by performing four arithmetic operations on the raw data of the statistical information as the Raw Data, and compare the RMAX with the value obtained through the four arithmetic operations to make the determination. The memory controller 50 may transmit to the SSD control tool 110 data obtained by encrypting the raw data of the statistical information as the Raw Data, and the memory controller 50 may decode the same and compare the decoded data with the RMAX to make the determination.

The SSD control tool 110 compares the acquired statistical information with a predetermined threshold value such as RMAX and RMIN (step S222), and invalidates the RWIF driver 121 (step S223), similar to FIG. 23, when determined that the SSD 10 reaches the end of the lifespan (or right before the end of lifespan, or in abnormal state) (step S222: Yes) such as when the statistical information of the SSD 10 becomes greater than RMAX (or X24=1, or when the statistical information becomes smaller than RMIN). The SSD control tool 110 may re-start the SSD 10 (step S224). After the re-start of the SSD 10, the SSD control tool 110 validates the ROIF driver 122 (step S225).

Figure 27:
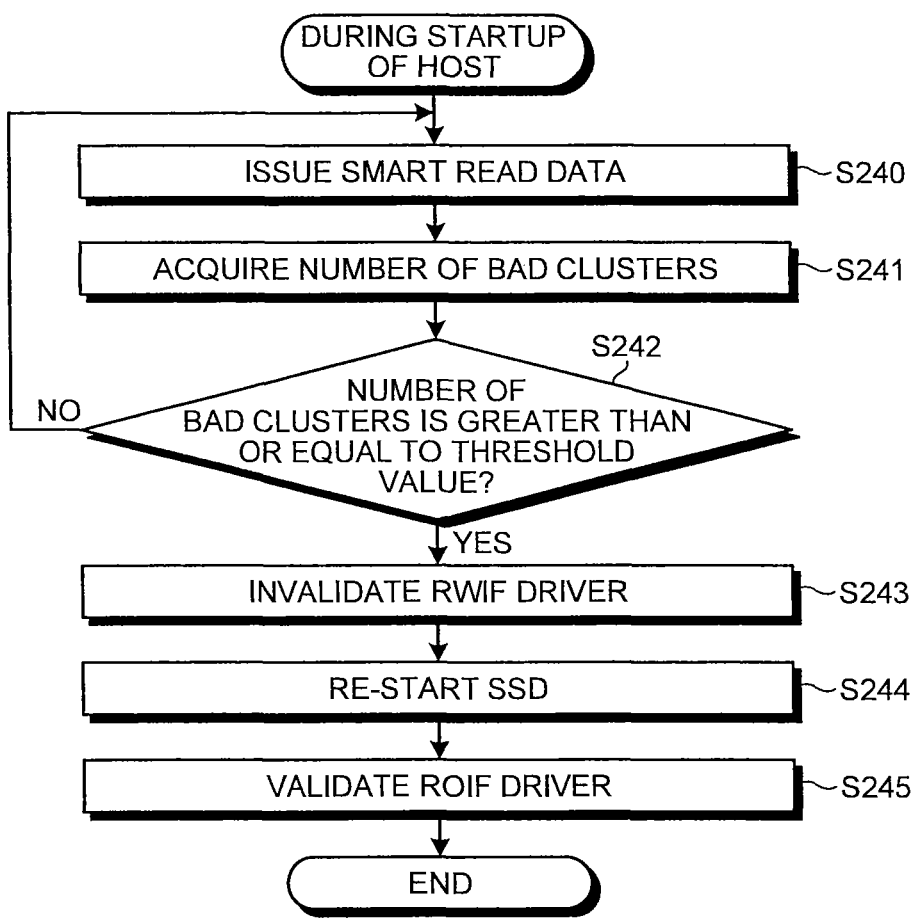
FIG. 27 is a flowchart illustrating another operation example at the time of startup of the host.

The operation in the host 100 when the SSD 10 is in the normal mode may be the operation procedure illustrated in FIG. 27. In such operation procedure, the SSD control tool 110 periodically issues a SMART READ DATA or a command of the S.M.A.R.T or a vendor unique command to the SSD 10 (step S240). In the SSD 10 receiving the information of the S.M.A.R.T, the memory controller 50 acquires the current number of bad clusters based on the number of entries of the bad cluster table in the management information stored in the RAM 40, and returns the acquired number of bad clusters to the host 100. The SSD control tool 110 acquires the number of bad clusters by receiving the number of bad clusters returned from the SSD 10 (step S241).

The SSD control tool 110 compares the acquired number of bad clusters with a predetermined threshold value (step S242), and invalidates the RWIF driver 121 (step S243), re-starts the SSD 10 (step S244), and validates the ROIF driver 122 (step S245), similar to FIG. 13, when the number of bad clusters of the SSD 10 is greater than or equal to a threshold value.

Figure 28:
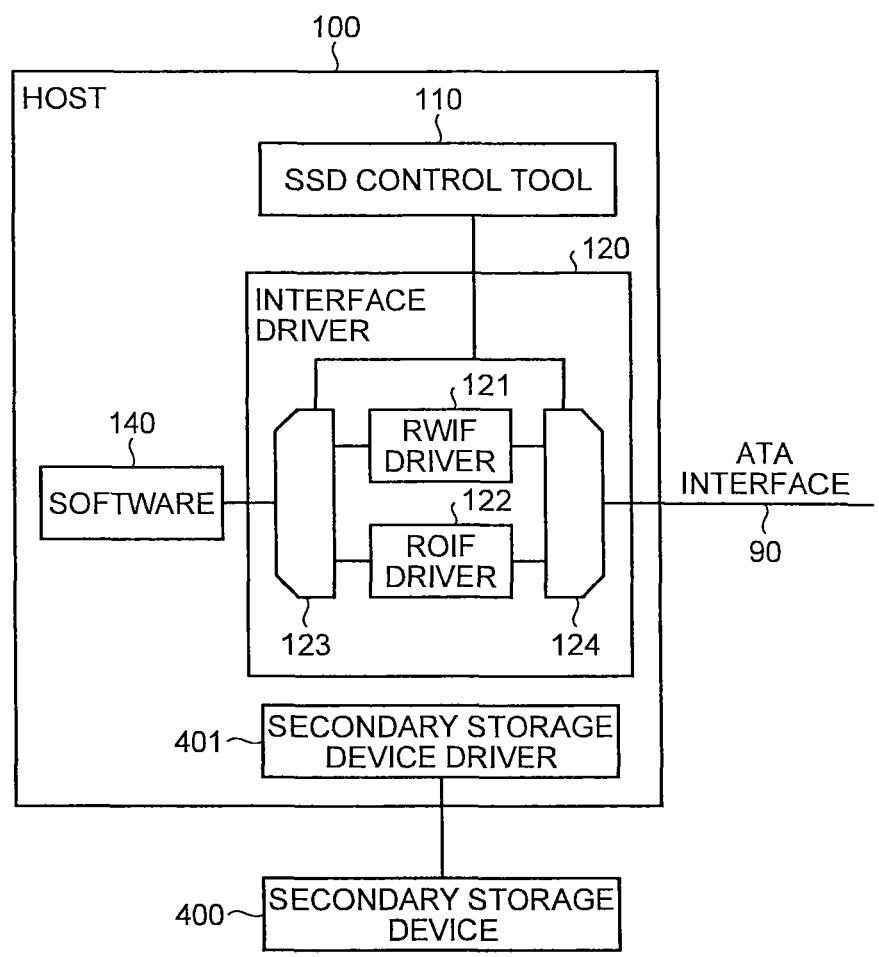
FIG. 28 is a block diagram illustrating another configuration example of the host.

The backup function may be loaded in the SSD control tool 110. In a state the SSD 10 is shifting to the read only mode, the data retention properties of the SSD 10 are assumed to be degrading, and thus the user data of the SSD needs to be evacuated to another secondary storage device as fast as possible. FIG. 28 is a view illustrating a configuration of the host 100 of when the SSD control tool 110 is loaded with the backup function. The secondary storage device (other SSD, hard disc drive, portable disc storage medium, etc.) 400 is connected to the host 100, and the OS of the host 100 and the secondary storage device 400 communicate through a secondary storage device driver 401.

Figure 29:
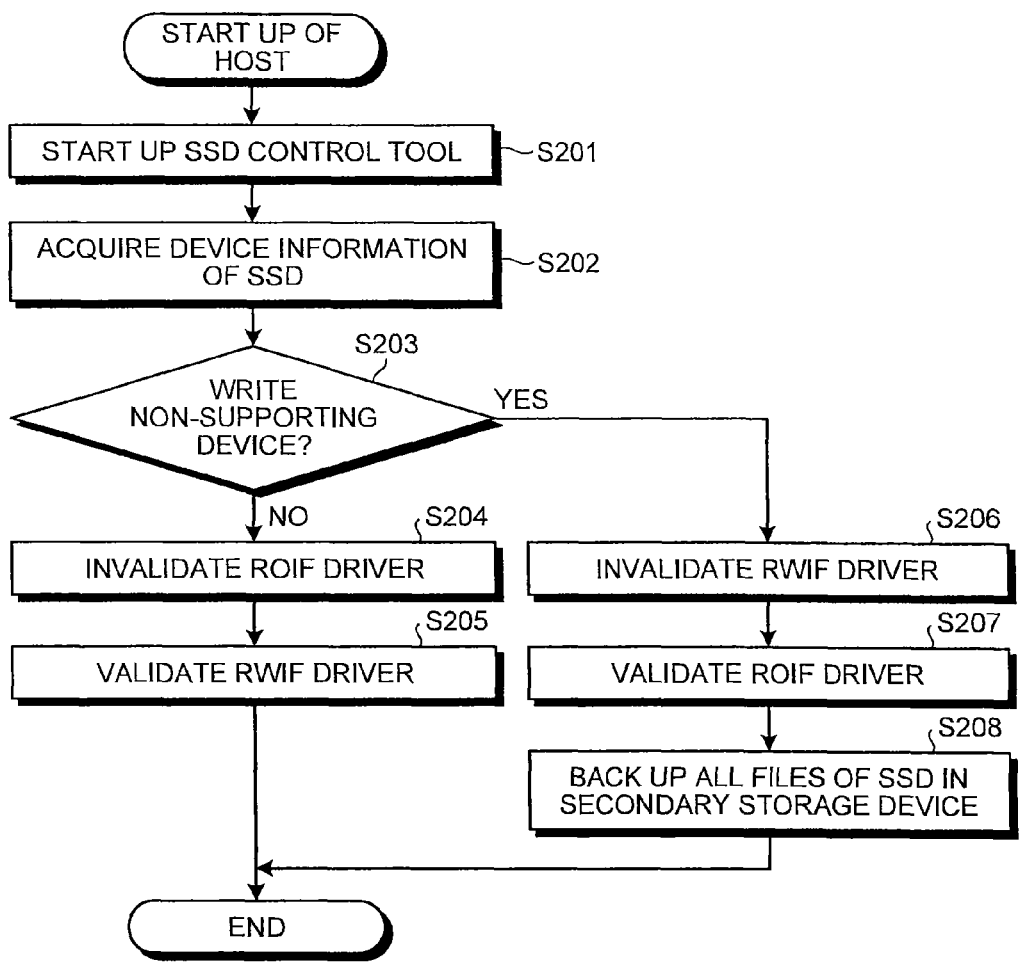
FIG. 29 is a flowchart illustrating an operation example at the time of startup of the host when the host illustrated in FIG. 28 is adopted.

FIG. 29 illustrates an operation example of the SSD control tool 110 when taking a backup. In FIG. 29, step S208 is added to the operation procedure of the SSD control tool 110 illustrated in FIG. 22. In the backup in step S208, the SSD control tool 110 displays a message such as "SSD is shifting to read only mode. Need backup of data of SSD?", and an "OK" button and a "Cancel" button for selecting the necessity of backup. The backup starts when the "OK" button is clicked with the mouse 135, and the display of the message disappears without carrying out the backup when the "Cancel" button is clicked with the mouse 135. A command to read out the data of all LBA of the SSD 10 is sent to the ROIF driver 122. The SSD control tool 110 sends a command to the secondary storage device driver 401 to write the data read out from the SSD 10 to the LBA (LBA of secondary storage device 400) same as the LBA (LBA of SSD) of the data read out from the SSD 10. For instance, the data of LBA=0h of the SSD 10 is copied to the LBA=0h of the secondary storage device 400. The data of LBA=234c5h of the SSD 10 is copied to the LBA=234c5h of the secondary storage device 400.

In the backup process, the SSD control tool 110 may send a command to the OS of the host 100 to copy all the files of the SSD 10 to the secondary storage device 400. In this case, the OS references the file management table or metadata contained in the OS, acquires all the LBAs of all the files of the SSD 10, reads out all the data of the acquired LBAs, writes the read data in the secondary storage device 400, and updates the file management table or metadata such that the written LBA and the index of the file are corresponded. The information of the partition including the Master Boot Record (MBR) information of the SSD 10 and the file system management region may be accessed to acquire the information of the region being used and the file, the ROM image on the data of the SSD 10 is created based on the acquired information, and the created ROM image may be saved in another storage device.

In the present embodiment, the physical address of the NAND memory 20 is directly associated to the LBA in the management information for simplicity, but the LBA may be managed using the management unit of a natural number multiples of two or greater of the sector size as in U.S. Patent Application Publication No. 2009 0222617, and the correspondence relationship of the management unit and the physical address of the NAND memory 20 may be described in the management information instead of the LBA. The management information describing the correspondence relationship of the physical address of the NAND memory 20 and the LBA may take various forms, and the form taken by the table (logical—physical conversion table) describing the correspondence relationship of the physical address and the LBA does not influence the essence of the present invention. With respect to the nonvolatile memory other than the NAND type flash memory as well, the management information describing the correspondence relationship of the physical address and the nonvolatile memory and the LBA may take various forms but the form taken by the table (logical—physical conversion table) describing the correspondence relationship of the physical address and the LBA does not influence the essence of the present invention.

The information not related to the reliability information used in the management information section does not influence the essence of the present invention. The requirements for the reliability information can also be applied in embodiments after the second embodiment.

Therefore, according to the first embodiment, whether or not the read only mode shift condition is met is determined in the SSD 10, where if the read only mode shift condition is met, the interface controller is switched to that dedicated for reading, and whether or not to recognize the SSD 10 as the read only memory in which only the read operation of the read operation and the write operation is enabled is determined based on the information acquired from the SSD 10 in the host 100, and the interface driver for the SSD control is switched to that dedicated for reading if determined to be recognized as the read only memory, and hence the host can normally recognize the SSD that shifted to the read only mode as a device in which only the read operation is enabled.

Second Embodiment

In the first embodiment, the function mounting to the SSD 10 and the function mounting to the host 100 are both used. In the second embodiment, a case in which only the function mounting to the SSD 10 is applied is illustrated. It is most effective if the function is mounted on both the SSD 10 and the host 100, but sufficient effect can be exhibited even by mounting the function only on the SSD 10.

Figure 30:
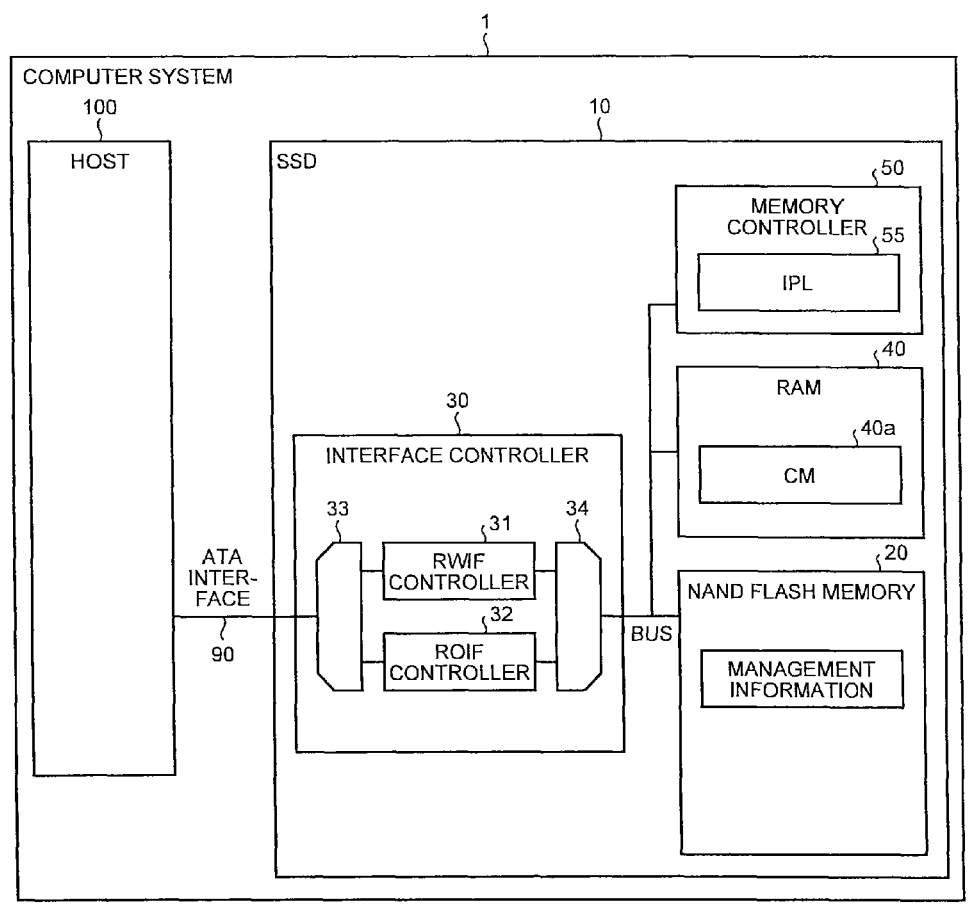
FIG. 30 is a block diagram illustrating a function configuration example of a computer system of a second embodiment.

FIG. 30 illustrates a configuration of the second embodiment of the computer system. In the second embodiment, the SSD 10 is mounted with the interface controller 30 described in the first embodiment, and the SSD control tool 110 for switching the interface driver 120 for the SSD 10 is not mounted on the host 100 side. In FIG. 30, the same reference numerals are denoted on the constituent elements having the same function as the constituent elements illustrated in FIG. 1, and redundant description will be omitted. In the second embodiment, for example, the function of the IPL 55 is mounted on the controller 50. In the SSD 10 of the second embodiment as well, the functions of the SSD 10 described in the first embodiment above all can be mounted.

In the second embodiment, the memory controller 50 determines whether or not the read only mode shift condition described above for shifting the SSD 10 from the normal readable/writable state to the read only mode state is met using the management information described above at the startup of the SSD or during the operation of the SSD, where the interface controller 30 is switched from the RWIF controller 31 to the ROIF controller 32 if the read only mode shift condition is met. The RWIF controller 31 transmits the device identification information indicating that the relevant drive is a readable/writeable drive to the host when a request is made from the host 100. The ROIF controller 32 transmits the device identification information indicating that the relevant drive is a reading dedicated drive to the host when a request is made from the host 100.

The RWIF controller 31 is desirably configured to explicitly indicate to the host 100 that the SSD 10 is the ATA device. For instance, in the Device Signature described in ATA/ATAPI Command Set-2 (ACS-2), LBA(7:0) is output to 01h, LBA(15:8) to 00h, and LBA(23:16) to the host 100 as 00h, so that notification can be made to the host 100 that the SSD 10 is the ATA device. The ROIF controller 32 is desirably configured to explicitly indicate to the host 100 that the SSD 10 is the ATAPI device. For instance, in the Device Signature described in ACS-2, LBA(7:0) is output to 01h, LBA(15:8) to 14h, and LBA(23:16) to the host 100 as EBh, so that notification can be made to the host 100 that the SSD 10 is the ATAPI device.

The ROIF controller 32 is configured to notify the host 100 that the SSD 10 does not support the write command and is read only. For instance, when receiving the command GET CONFIGURATION (46h) adopted in the INCITS Multi-Media Commands-6 (MMC-6) from the host 100 through the ATA interface 90, the ROIF controller 32 returns to the host 100 that all the write functions are non-supportive in the features such as Random Writable (Feature Number=0020h), Incremental Streaming Writable (Feature Number=0021h), Write Once(Feature Number=0025h), and the like. On the other hand, the ROIF controller 32 may be configured to explicitly indicate to the host 100 that the SSD 10 is the ATA device, similar to the RWIF controller 31, and may be configured to return to the host 100 that all the write functions are non-supportive when receiving the device identification information from the host 100 through the ATA interface 90 such as the command ECh IDENTIFY DEVICE described in ACS-2. The method of notifying whether or not the SSD 10 is a read only device may take various other forms.

For instance, with reference to FIG. 18 used in the first embodiment, the memory controller 50 determines whether or not the RO mode shift condition is met is determined while the SSD 10 is operating (FIG. 18: step S160). A specific example of when the RO mode shift condition is met including a condition such as when determined that the SSD 10 reached the end of the lifespan (or right before reaching the end of the lifespan, or in abnormal state) such as when at least one of the statistical information X01 to X19, X23, X24 is greater than RMAX, when X24=1, or when the statistical information is smaller than RMIN.

When the RO mode shift condition is met, the memory controller 50 desirably cancels all the write processes on the NAND memory 20 currently being performed (step S161), returns an error with respect to all the write requests received from the host 100, and deletes all the queues of the write request received from the host 100 (step S162). The memory controller 50 then writes 1 to the RO mode flag 25 in the management information of the NAND memory 20 (step S163). The SSD 10 thereafter returns an error to all the write requests received from the host 100 until the power is cut off or reset (steps S164, S165).

At the startup of the SSD 10, the operation similar to FIG. 21 used in the first embodiment is executed. In other words, when the SSD 10 is started, the IPL 55 in the memory controller 50 reads out the RO mode flag 25 in the management information of the NAND memory 20 (step S170), and read the RO mode flag 25 (step S171). If the RO mode flag 25 is 0 (step S171), the IPL 55 validates the RWIF controller 31 of the interface controller 30 (step S172) to be in the normal mode, and then reads out the management information of the NAND memory 20 to the RAM 40 (step S173).

If the RO mode flag 25 is 1, the IPL 55 validates the ROIF controller 32 to be in the RO mode (step S174), and then reads out the management information of the NAND memory 20 on the RAM 40 (step S175). In the RO mode, the SSD 10 acts as a read only device that does not support the write.

The host 100 requests for the identification information to the connected device at the startup of the host 100 or at the connection of the device. In the normal mode, the SSD 10 has the RWIF controller 31 return device identification information indicating that the SSD 10 is readable and writable with respect to the host 100 to the host, and hence the host 100 recognizes the SSD 10 as a readable and writable device. In the RO mode, the SSD 10 has the ROIF controller 32 return device identification information indicating that the SSD 10 is a write non-supporting read only drive to the host 100, and hence the host 100 recognizes the SSD 10 as the write non-supporting device. Therefore, at the time of the RO mode, the write request is not sent from the host 100 to the SSD 10. Thus, in the RO mode, the SSD 10 acts as a read only device that does not support the write, so that accesses other than the write can be made from the host 100. The SSD 10 can be recognized as a readable device even if Windows (registered trademark) is mounted on the host 100 for the OS.

When the identification information that the SSD 10 is a write non-supporting external storage device is notified from the SSD 10 to the host 100 when the reliability of the SSD 10 is degraded, it appears to the host 100 as if the SSD 10 switched from the readable and writable external storage device to the write non-supporting external storage device. Therefore, the SSD 10 with degraded reliability acts as a read only device to the host 100, so that the host 100 can handle the SSD 10 as a general read only external storage device such as the CD-ROM or the DVD-ROM.

Third Embodiment

In the third embodiment, a case in which only the function mounting to the host 100 is applied is shown. It is most effective if the function is mounted on both the SSD 10 and the host 100, but sufficient effect can be exhibited even by mounting the function only on the host 100.

Figure 31:
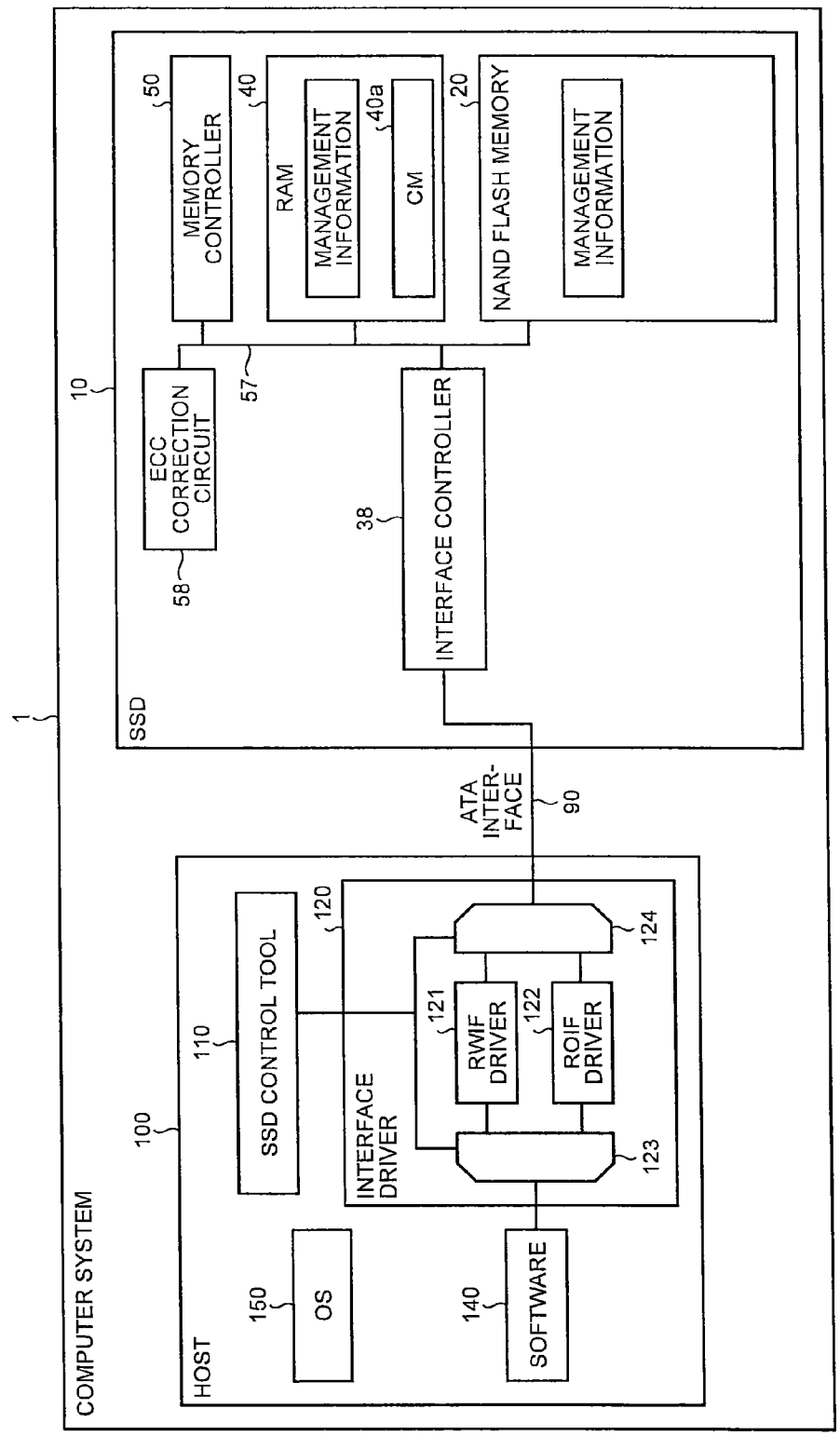
FIG. 31 is a block diagram illustrating a function configuration example of a computer system of a third embodiment.

FIG. 31 illustrates a configuration of the third embodiment of the computer system. In the third embodiment, the interface driver 120 and the SSD control tool 110 described in the first embodiment are mounted on the host 100, and the interface controller 30 in which the RWIF control 31 and the ROIF controller 32 can be switched is not mounted on the SSD 10 side. In FIG. 31, the same reference numerals are denoted on the constituent elements having the same function as the constituent elements illustrated in FIG. 1, and redundant description will be omitted. An interface controller 38 mounted with only the RWIF controller 31 is mounted in place of the interface controller 30. In the host 100 of the third embodiment as well, the functions of the host 100 described in the first embodiment above all can be mounted. In the third embodiment, SSD 10 itself does not necessarily need to be able to be shifted to RO mode.

In the third embodiment, the SSD control tool 110 executes operations similar to the operations described in FIG. 25 and FIG. 27 of the first embodiment. When the host 100 is started, the host 100 starts the SSD control tool 110. The SSD control tool is desirably automatically started with the startup of the host 100 by registering the startup menu, the service, or the registry in the Windows (trademark). The SSD control tool may be arbitrarily started by the user with the keyboard 134, the mouse 135, and the like. When the SSD control tool 110 is started, the SSD control tool 110 transmits a transmission request of the statistical information to the SSD 100 to acquire at least one of the statistical information X01 to X19, X23, X24 of the SSD 10 in the case of FIG. 25 (FIG. 25: step S220). The transmission request may be SMART READ DATA or a command of S.M.A.R.T, which is a self-diagnostic function of the memory, a SCT Command Transport described in ACS-2, or a command unique to the vendor, as described above.

The SSD control tool 110 acquires the statistical information (step S221) in such manner. The SSD control tool 110 compares the statistical information returned from the SSD with a threshold value (e.g., RMAX or RMIN described in first embodiment) (step S222). When using the B0h/D0h SMART READ DATA described in the ACS-2 to acquire the statistical information, the SSD control tool 110 acquires at least one statistical information of the constituent elements (X01 to X19, X23, X24) of the statistical information 26 in the form of Attribute Value, Threshold, Worst Value, and Raw Data (Raw Value) illustrated in FIG. 26. The calculation method of the Attribute Value, the Threshold, the Worst Value, and the Raw Data (Raw Value) by the memory controller 50 is the same as the first embodiment, and the information calculated in such manner is transmitted from the SSD 10 to the control tool 110 as the read data with respect to the B0h/D0h SMART READ DATA.

For instance, when using the Attribute Value and the Threshold of the SMART as comparison data for diagnosing the lifespan (or abnormal state) of the SSD 10, the SSD control tool 110 carries out the comparison of the Attribute Value and the Threshold, and the SSD control tool determines that the SSD 10 reached the end of the lifespan (or abnormal event) when Attribute Value<Threshold (or Attribute Value≤Threshold). If SMAB=100 and AMALR=0.3 as in the first embodiment, the best value of the attribute value with respect to the statistical information to be adopted is 100 (e.g., 100 immediately after shipment), and gradually decreases as the reliability degrades, where the attribute value 30 reaches a value smaller than or equal to 30 when the SSD 10 can no longer guarantee reliability (when raw data of statistical information becomes greater than or equal to RMAX), and the SSD control tool 110 determines that the SSD 10 is to be recognized as the read only memory (step S222: Yes). B0h/DAh SMART RETURN STATUS, which is a command described in ACS-2, is used as a means for detecting whether or not the Attribute Value exceeds the Threshold, and whether or not the Attribute Value exceeds the Threshold value may be determined from the Output of the relevant command.

For instance, when using the Worst Value and the Threshold of the SMART as comparison data for diagnosing the lifespan (or abnormal state) of the SSD 10, the SSD control tool 110 carries out the comparison of the Worst Value and the Threshold, and the SSD control tool determines that the SSD 10 reached the end of the lifespan (or abnormal event) when Worst Value<Threshold (or Worst Value≤Threshold). If SMAB=100 and AMALR=0.3 as in the first embodiment, the best value of the worst value with respect to the statistical information to be adopted is 100 (e.g., 100 immediately after shipment), and gradually decreases as the reliability degrades, where the worst value 30 reaches a value smaller than or equal to 30 when the SSD 10 can no longer guarantee reliability (when raw data of statistical information becomes greater than or equal to RMAX), and the SSD control tool 110 determines that the SSD 10 is to be recognized as the read only memory (step S222: Yes).

For instance, when using the Raw Data (Raw Value) of the SMART that increases with degradation in the reliability of the SSD 10 for the comparison data for diagnosing the lifespan (or abnormal state) of the SSD 10, the SSD control tool 110 carries out the comparison of the Raw Value and the RMAX, and the SSD control tool determines that the SSD 10 reached the end of the lifespan (or abnormal state) when Raw Value≥RMAX (or Raw Value>RMAX). The RMAX is a parameter held on the main memory 202 such as the SSD control tool 110. The RMAX is desirably stored in the SSD 10 as nonvolatile information when the power supply of the computer system 1 is turned OFF, and loaded to the main memory 202 when the SSD control tool is loaded to the main memory 202 as illustrated in FIG. 5 and FIG. 6 when the power supply is turned ON. The RMAX is desirably determined at the development of the SSD 10 as in the first embodiment, and is stored in a region to become the install source of the SSD control tool such as the region of the storage medium 400 of the WEB server, the storage region of the optical storage medium 500, or the region of the USB memory 600.

The Raw Value gradually increases as the reliability of the SSD 10 degrades, where the Raw Value reaches a value greater than or equal to the RMAX when the SSD 10 can no longer guarantee reliability, and the SSD control tool 110 determines that the SSD 10 is to be recognized as the read only memory (step S222: Yes). The RMAX may adopt different values with respect to each constituent element such as the statistical information X01 to X19, S23, and the like.

For instance, when using the Raw Data (Raw Value) of the SMART that decreases with degradation in the reliability of the SSD 10 as the comparison data for diagnosing the lifespan (or abnormal state) of the SSD 10, the SSD control tool 110 carries out the comparison of the Raw Value and the RMIN, where the SSD control tool determines that the SSD 10 reached the end of the lifespan (or abnormal state) when Raw Value≤RMIN (or Raw Value<RMIN). The RMIN is a parameter held on the main memory 202 such as the SSD control tool 110. The RMIN is desirably stored in the SSD 10 as nonvolatile information when the power supply of the computer system 1 is turned OFF, and loaded to the main memory 202 when the SSD control tool is loaded to the main memory 202 as illustrated in FIG. 5 and FIG. 6 when the power supply is turned ON. The RMIN is desirably determined at the development of the SSD 10 as in the first embodiment, and is stored in a region to become the install source of the SSD control tool such as the region of the storage medium 400 of the WEB server, the storage region of the optical storage medium 500, or the region of the USB memory 600.

The Raw Value gradually decreases as the reliability of the SSD 10 degrades, where the Raw Value reaches a value smaller than or equal to the RMIN when the SSD 10 can no longer guarantee reliability, and the SSD control tool 110 determines that the SSD 10 is to be recognized as the read only memory (step S222: Yes). The RMIN may adopt different values with respect to each constituent element such as the statistical information X01 to X19, S23, and the like.

For instance, when receiving the statistical information X24 as the RAW Data (Raw Value) of the SMART, and using the same as comparison data for diagnosing the lifespan (or abnormal state) of the SSD 10, the SSD control tool 110 carries out the determination on whether or not the Raw Value is 1, and determines that the SSD 10 reached the end of her lifespan when Raw Value=1. If the reliability of the SSD 10 degrades and sufficient number of free blocks cannot be ensured by the memory controller 50 even by NAND GC, the Raw Value is set to 1 by the memory controller 50, and the SSD control tool 110 determines to recognize the SSD 10 as a read only memory (step S222: Yes).

If determined that the RO mode shift condition is met in the SSD 10 as a result of the comparison of step S222, that is, if determined that the SSD 10 is to be recognized as the read only memory (step S222: Yes), the ROIF driver 122 is validated (step S225). The SSD control tool 110 may cause the operating system 150 to recognize the SSD 10 as the read only memory by operating the system parameter of the operating system 150 in FIG. 12. The SSD control tool 110 desirably transmits a reset command, or the like and re-starts the SSD 10 before the step S225 (S224).

It is desirable that the SSD control tool 110 periodically carries out the procedures of steps S220, step S221, and step S222 (in the case of FIG. 25) illustrated in FIG. 25, FIG. 27 and the like, that is, the transmission request of the statistical information to the SSD 10 and the determination to recognize the SSD 10 as the read only memory even while the host 100 is operating. For instance, the SMART READ DATA may be issued every constant time, and whether or not to recognize the SSD 10 as the read only memory may be determined. The request and the determination may be carried out at the startup of the host 100, or the request and the determination may be carried out only after the startup of the host 100 to reduce the number of interrupt processing of the SSD control tool 110. If determined to recognize the SSD 10 as the read only memory, the ROIF driver 122 of the interface driver 120 is validated. After recognizing the SSD 10 as the read only memory to reduce the number of interrupt processing of the SSD control tool 110, the transmission request of the statistical information and the RO mode shift determination are desirably not carried out.

The SSD control tool 110 may carry out the request and the determination when recognizing the startup or the connection of the SSD 10. For instance, if the interface 90 is the SATA interface, determination is made that the SSD 10 is started or connected when the status register related to the SSD 10 of the host 100 becomes from 7Fh to 50h, and then the request and the determination may be carried out.

The determination to recognize as the read only memory may be carried out by the memory controller 50, and the SSD control tool 110 may receive only the determination result through the SMART READ DATA, the SCT Command Transport, or the command unique to the vendor. For instance, the SSD control tool 110 receives the numerical value 0 as the Attribute Value from the SSD 10 by the SMART READ DATA if determined to be recognized as the read only memory by the memory controller 50 at the criterion similar to the first embodiment, and receives the numerical value 100 in other times (normal time), where the numerical value 70 is received as the Threshold for both cases of recognizing and not recognizing as the read only memory, and determination is made to recognize as the read only memory if Attribute Value<Threshold (step S222: Yes) and to not recognize as the read only memory if Attribute Value>Threshold (step S222: No). It should be apparent that the Worst Value and the Raw Value may be used for the reception of the determination result.

When adopting the current temperature X20, the highest temperature X21, and the lowest temperature X22 for the statistical information, the temperature abnormality has a possibility of being temporary, and hence the ROIF driver is invalidated and the RWIF driver is validated after the SSD control tool 110 validates the ROIF driver in step S225 when Attribute Value Threshold (or Attribute Value>Threshold) and determination is made that the normal state is returned.

The ROIF driver 122 is desirably configured to not transmit the write command with respect to the SSD 10 at all from the standpoint of preventing the loss of user data caused by data breakage or damage of the SSD 10. However, if there is a need to write the data of one part such as the system information of the operating system in the SSD 10, the ROIF driver 122 may permit the write of the relevant data to the SSD 10 as an exception but the data amount of the relevant data is desirably sufficiently small with respect to the capacity of the NAND memory 20. More desirably, in order to prevent the user from transmitting the write command by mistake and writing the data to the SSD 10, the ROIF driver 122 does not transmit the normal write command with respect to the SSD 10 at all such as 35h WRITE DMA EXT and 61h WRITE FPDMA QUEUED described in ACS-2, and the write with respect to the SSD 10 is desirably permitted by only the command using a special command such as the SCT Command Transport described in INCITS ACS-2 and other commands unique to the vendor if there is an exceptional need to write the data to the SSD 10.

In the third embodiment as well, as illustrated in FIG. 5, the SSD control tool 110 is stored in the region 110A of the NAND memory 20 of the SSD 10 when the power supply of the host device 100 is turned OFF, but is loaded from the region 110A to the region 110 at the startup of the host device 100 or the startup of the program. As illustrated in FIG. 6, if a plurality of external storage devices is connected to the host device, the SSD control tool may be stored in a region 110B of the nonvolatile storage device 300 different from the SSD 10 as the SSD 10, and may be loaded from the region 110B to the region 110 at the startup of the host device 100 or the startup of the program. In particular, if the nonvolatile storage device 300 is used as a system drive for storing the OS, and the SSD 10 is used as a data drive for storing user data such as documents, still image data, and moving image data, it is desirable to store the control tool in the nonvolatile storage device 300 serving as the system drive from the standpoint of clearly separating the roles of the drive 10 and the drive 300 such as using the system drive 300 as a drive for mainly storing the OS and the application program and using the data drive 10 as a drive for storing the user data.

In the third embodiment as well, as illustrated in FIG. 5 and FIG. 6, it is desirable for the computer system 1 to be shipped with the SSD control tool stored in the SSD 10 or the nonvolatile storage device 300, put on the shelves, and provided to the user from the standpoint of saving the effort of the user in carrying out the setup of the control tool. From the standpoint of enabling the user to select whether or not to install the SSD control tool and from the standpoint of providing the most recent control tool to the user, the control tool is desirably stored in the SSD 10 or the nonvolatile storage device 300 by being downloaded from the WEB illustrated in FIG. 7, installed from the DVD-ROM illustrated in FIG. 8, and installed from an external storage medium such as USB memory illustrated in FIG. 9. In the third embodiment as well, the optical medium 500 and the USB memory 600 are desirably packaged and sold with the SSD 10 as accessories at the time of shipment of the SSD 10 from the standpoint of facilitated availability by the user. The optical medium 500 or the USB memory 600 may be sold alone as software product or may be attached as a supplement to magazines and books.

Therefore, the SSD control tool 110 mounted on the host 100 determines the reliability state (statistical information) of the SSD 10, and selects the interface driver for the SSD based on the determination result, and hence it appears to the OS and other software as if the SSD 10 switched from the readable and writable external storage device to the write non-supporting external storage device when the reliability of the SSD 10 is degraded (when the end of lifespan is reached, in abnormal state). Therefore, the SSD 10 with degraded reliability acts as a read only device to the OS and the software, so that the host 100 can handle the SSD 10 as a general read only external storage device such as the CD-ROM or the DVD-ROM.

Fourth Embodiment

In the first and second embodiments, the SSD 10 transmits the information that the SSD 10 is a read only device to the host 100. Using an interface relay device 700 prepared separate from the SSD 10, the interface relay device 700 may transmit to the host 100 information that the SSD 10 is a read only device. The interface relay device 700 is called a read only bridge. In the fourth embodiment, SSD 10 itself does not necessarily need to be able to be shifted to RO mode.

Figure 32:
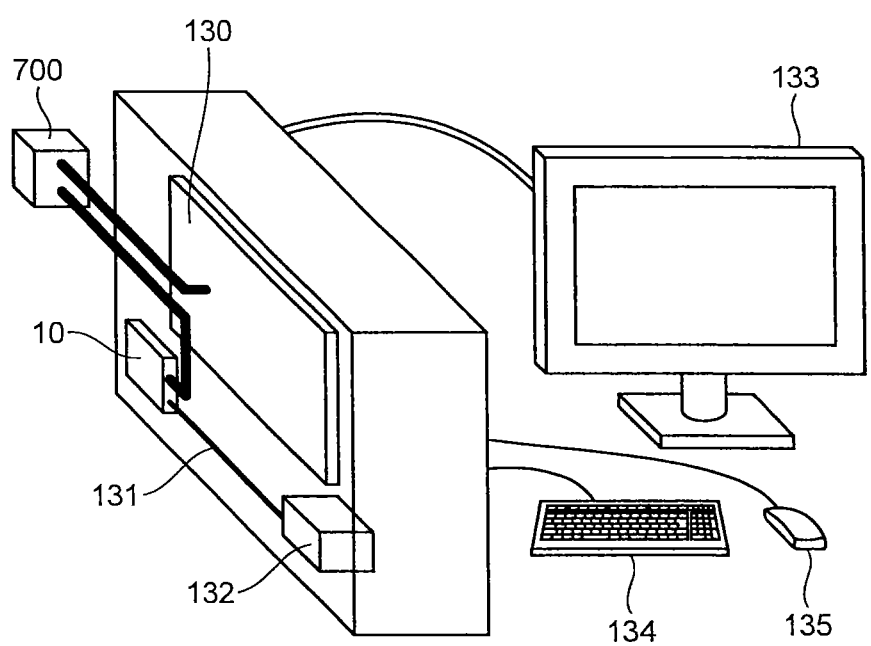
FIG. 32 is a view illustrating an outer appearance configuration example of a computer system of a fourth embodiment.
Figure 33:
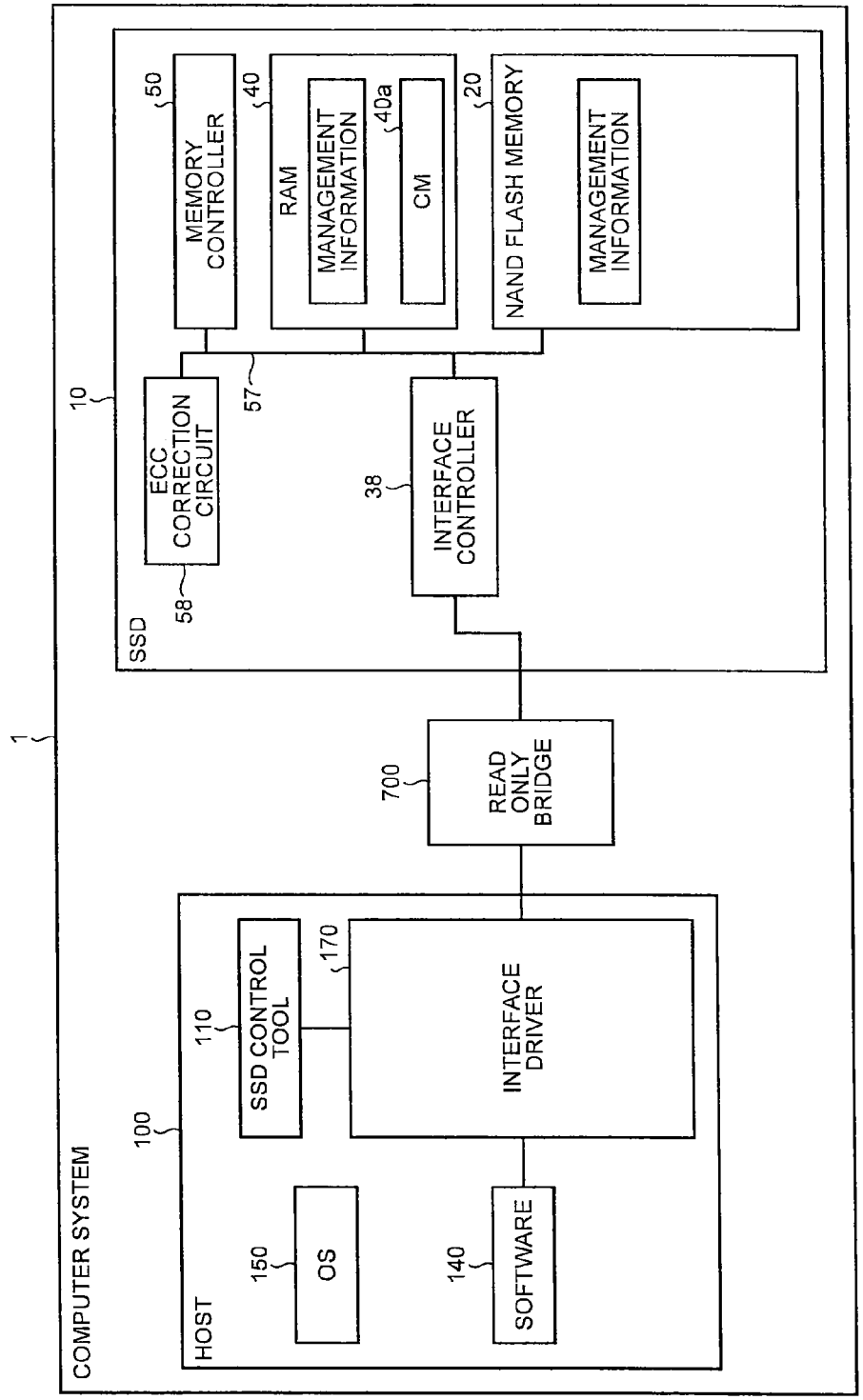
FIG. 33 is a block diagram illustrating a function configuration example of a computer system of the fourth embodiment.

FIG. 32 illustrates a state in which the read only bridge 700 is connected to the computer system illustrated in FIG. 10. FIG. 33 is a block diagram illustrating a computer system of a fourth embodiment in which the read only bridge is connected. The read only bridge 700 is configured to transmit the information of being the read only device to the host 100. The information of being the read only device may be the command GET CONFIGURATION (46h) described above that is adopted in the MMC-6, or may be other commands. Furthermore, the read only bridge 700 is configured to play the role of a relay of the host side interface and the SSD side interface such as transmit various commands and responses received from the host 100 to the SSD 10 and transmit various commands and responses received from the SSD 10 to the host 100. If the interface standards of the host side interface and the SSD side interface differ, the read only bridge 700 converts the received command and response to comply with the transmission side interface, and then transmits the same. If the host side interface is the SATA interface, the read only bridge 700 may be configured to explicitly indicate to the host 100 that the SSD 10 is the ATAPI device. For instance, in the Device Signature described in ACS-2, LBA(7:0) is output to 01h, LBA(15:8) to 14h, and LBA(23:16) to the host 100 as EBh, so that notification can be made to the host 100 that the SSD 10 is the ATAPI device.

During the normal use of the host 100, the SSD 10 is connected to the motherboard 130 of the host 100 by the SATA cable serving as the ATA interface 90 or the USB cable, as illustrated in FIG. 10. When the SSD control tool 110 mounted on the host 100 acquires the statistical information by the S.M.A.R.T information described in the ACS-2 described above, and determines that the reliability of the SSD 10 is degrading when the condition of statistical information>RMAX, statistical information<RMIN, or X24=1 is met by the comparison of the management information and the threshold value, the SSD control tool 110 displays a warning window (or warning dialogue) including a message such as "lifespan of SSD coming to end. Connect device side terminal of read only bridge to SSD, connect host side terminal of read only bridge to personal computer, and backup data of SSD" on the display 133. The threshold value (RMAX, RMIN, etc.) to be compared with the management information may be held in the host 100 so that the SSD control tool 110 can carry out the determination on the degradation of the reliability or the threshold value may be held in the SSD 10 so that the memory controller 50 of the SSD 10 can carry out the determination on the degradation of the reliability and the memory controller 50 may transmit only the information that the management information exceeded the threshold value to the host 100.

As illustrated in FIG. 32, the user connects the SSD 10 and the read only bridge 700 with the SATA cable, the USB cable, or the like, and connects the read only bridge 700 and the motherboard 130 with the SATA cable, the USB cable, or the like according to the warning message displayed on the display 133.

When the host 100 is thereafter started, the read only bridge 700 transmits information that the SSD 10 is the read only device to the host 100. The host 100 then applies the read only driver of the read only ATAPI driver as the interface driver 170 of the read only bridge 700, and the SSD 10 is recognized as the read only device such as the CD-ROM and the DVD-ROM on the host. On the other hand, the read only bridge 700 may be configured to explicitly indicate to the host 100 that the SSD 10 is the ATA device, and may be configured to return to the host 100 that all write functions are non-supportive when receiving the device identification information such as the command ECh IDENTIFY DEVICE described in the ACS-2 from the host 100 through the ATA interface. The method of notifying whether or not the SSD 10 is a read only device may take various other forms.

In the embodiment, when the write is disabled with respect to the SSD or when the write operation with respect to the SSD is not guaranteed. The host can carry out the readout operation on the SSD 10 by simply connecting the read only bridge 700 between the host 100 and the SSD even under situations where the write operation with respect to the SSD may lead to defect in data of the SSD or failure of the SSD.

The system disc used to start up the host under the situation in which the read only bridge 700 is connected may be the SSD 10, or may be an SSD or a hard disc drive (HDD) prepared separate from the SSD 10 pre-installed with the system, or may be a DVD-ROM, a CD-ROM, or USB memory installed with a boot program.

Even when the read only bridge 700 is connected, the host 100 may hold the SSD control tool 110 having the function of backing up the data of the SSD or other software. When detecting that the read only bridge 700 is connected, the software having the backup function displays a message such as "read only bridge is connected. Back up data of SSD?" as well as the "OK" button and the "Cancel" button for selecting the necessity of backup in the window of the software. The backup starts when the "OK" button is clicked with the mouse 135, and the display of the message disappears without carrying out the backup when the "Cancel" button is clicked with the mouse 135. The backup can be carried out later even if the "Cancel" button is pushed with the mouse 135.

In the first to fourth embodiments, a case in which the NAND memory is adopted for the nonvolatile memory has been described, but the first to fourth embodiments may be applied to nonvolatile memory other than the NAND memory such as the hard disc drive (HDD) for the nonvolatile memory. The nonvolatile memory may be a semiconductor storage medium in which the memory cells are arranged three-dimensionally as shown in U.S. Patent Application Publication No. 2010 0172189 and U.S. Patent Application Publication No. 2010 0254191.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing system comprising:
a host device and a storage device coupled with the host device;
the storage device including:
a nonvolatile memory including a plurality of blocks; and
a first controller configured to
control the nonvolatile memory,
determine whether a data write operation to the nonvolatile memory is prohibited based on a first value and a first threshold value, the first value being a value of a number of free blocks, the first threshold value corresponding to the first value, and
send, when determining the data write operation to the nonvolatile memory is prohibited, information indicating that data write operation to the nonvolatile memory is prohibited;
the host device being connectable to a display, the host device including a second controller, the second controller configured to
acquire a second value and a second threshold value from the storage device, the second value being a value of a number of bad blocks, the second threshold value corresponding to the second value,
cause the display to show a certain message when the acquired second value exceeds the acquired second threshold value, and
recognize the storage device as a read only device that supports only a read operation of read and write operations of the nonvolatile memory when receiving the information.

2. The information processing system according to claim 1, wherein the host device communicates to the storage device based on a SATA (serial advanced technology attachment) standard.

3. The information processing system according to claim 2, wherein the second controller is configured to
measure a link speed between the host device and the storage device, increment an error count when the link speed falls below an expected transfer speed specified in a communication standard, and when the error count exceeds a threshold value, cause the display to show the certain message.

4. The information processing system according to claim 3, wherein the second controller is configured to increments the error count when a transfer speed negotiated between the storage device and the host device while establishing a communication link does not comply with the expected transfer speed specified in the communication standard.

5. The information processing system according to claim 1, wherein the storage device includes a thermometer, and the first controller acquires temperature information from the thermometer and sends the acquired temperature information in response to a request from the host device.

6. The information processing system according to claim 1, wherein the host device is configured to restart the storage device when receiving the information.

7. The information processing system according to claim 6, wherein the host device further comprises an interface driver for operating the storage device, the interface driver being operable in a first mode for supporting the read and write operations of the nonvolatile memory in the storage device and in a second mode for supporting only the read operation of the read and write operations of the nonvolatile memory in the storage device, and wherein the second controller is configured to cause the interface driver to switch from the first mode to the second mode after restarting the storage device.

8. The information processing system according to claim 1, wherein the host device further comprises an interface driver for operating the storage device, the interface driver being operable in a first mode for supporting the read and write operations of the nonvolatile memory in the storage device and in a second mode for supporting only the read operation of the read and write operations of the nonvolatile memory in the storage device, and wherein the second controller is configured to cause the interface driver to switch from the first mode to the second mode when receiving the information.

9. The information processing system according to claim 8, wherein, when the second controller causes the interface driver to switch from the first mode to the second mode, the host device recognizes the storage device as a read only optical medium.

10. The information processing system according to claim 1, wherein the storage device includes a thermometer, wherein the first controller is configured to hold a maximum value of temperature of the storage device based on temperature information from the thermometer, and wherein the second controller is configured to acquire a third value and a third threshold value from the storage device, the third value being the maximum value, the third threshold value corresponding to the third value, and cause the display to show the certain message when the acquired third value exceeds the acquired third threshold value.

11. The information processing system according to claim 1, wherein the second controller is configured to acquire a third value and a third threshold value from the storage device, the third value being a value of a power on hours count of the storage device, the third threshold value corresponding to the third value, and cause the display to show the certain message when the acquired third value exceeds the acquired third threshold value.

12. The information processing system according to claim 1, wherein the second controller is configured to acquire a third value and a third threshold value from the storage device, the third value being a value of a number of times of write error occurrences of the nonvolatile memory, the third threshold value corresponding to the third value, and cause the display to show the certain message when the acquired third value exceeds the acquired third threshold value.

13. The information processing system according to claim 1, wherein the second controller is configured to acquire a third value and a third threshold value from the storage device, the third value being a value of a number of times of erase error occurrences of the nonvolatile memory, the third threshold value corresponding to the third value, and cause the display to show the certain message when the acquired third value exceeds the acquired third threshold value.

14. The information processing system according to claim 1, wherein the second controller is configured to acquire a third value and a third threshold value from the storage device, the third value being an average value of a number of times of erasing, the third threshold value corresponding to the third value, and cause the display to show the certain message when the acquired third value exceeds the acquired third threshold value.

15. The information processing system according to claim 1, wherein the second controller is configured to acquire a third value and a third threshold value from the storage device, the third value being an average value of a number of uncorrectable ECC error count, the third threshold value corresponding to the third value, and cause the display to show the certain message when the acquired third value exceeds the acquired third threshold value.

16. The information processing system according to claim 1, wherein the second controller is configured to acquire a third value and a third threshold value from the storage device, the third value being a value of a total number of sectors of write data received from the host device, each of the sectors having 512 Byte, the third threshold value corresponding to the third value, and cause the display to show the certain message when the acquired third value exceeds the acquired third threshold value.

17. A host device, capable of being coupled with a storage device including a nonvolatile memory and a first controller, the nonvolatile memory including a plurality of blocks, the first controller configured to determine whether a data write operation to the nonvolatile memory is prohibited based on a first value and a first threshold value and send, when determining the data write operation to the nonvolatile memory is prohibited, information indicating that data write operation to the nonvolatile memory is prohibited, the first value being a value of a number of free blocks, the first threshold value being corresponding to the first value, the host device being connectable to a display, the host device including a second controller, the second controller configured to acquire a second value and a second threshold value from the storage device, the second value being a value of a number of bad blocks, the second threshold value corresponding to the second value, cause the display to show a certain message when the acquired second value exceeds the acquired second threshold value, and recognize the storage device as a read only device that supports only a read operation of read and write operations of the nonvolatile memory when receiving the information.

18. The host device according to claim 17, wherein the host device is capable of communicating to the storage device based on a SATA (serial advanced technology attachment) standard, and wherein the second controller is configured to measure a link speed between the host device and the storage device, increment an error count when the link speed falls below an expected transfer speed specified in a communication standard, and when the error count exceeds a threshold value, cause the display to show the certain message.

19. The host device according to claim 17, wherein the storage device includes a thermometer, wherein the first controller is configured to hold a maximum value of temperature of the storage device based on temperature information from the thermometer, and wherein the second controller is configured to acquire a third value and a third threshold value from the storage device, the third value being the maximum value, the third threshold value corresponding to the third value, and cause the display to show the certain message when the acquired third value exceeds the acquired third threshold value.

20. The host device according to claim 17, wherein the second controller is configured to acquire a third value and a third threshold value from the storage device, the third value being a value of a power on hours count of the storage device, the third threshold value corresponding to the third value, and cause the display to show the certain message when the acquired third value exceeds the acquired third threshold value.

\* \* \* \* \*